US012763859B2

(12) United States Patent
Taghizadeh Motlagh et al.

(10) Patent No.: US 12,763,859 B2
(45) Date of Patent: Oct. 13, 2026

(54) REPORTING DIFFERENTIAL MEASUREMENT QUANTITIES FOR AN ANTENNA ARRAY

(71) Applicant: Lenovo (United States) Inc., Morrisville, NC (US)

(72) Inventors: Seyedomid Taghizadeh Motlagh, Oberursel (DE); Ahmed Hindy, Aurora, IL (US); Robin Rajan Thomas, Bad Nauheim (DE); Venkata Srinivas Kothapalli, Aurora, IL (US)

(73) Assignee: Lenovo (United States) Inc., Morrisville, NC (US)

( * ) Notice: Subject to any disclaimer, the term of this patent is extended or adjusted under 35 U.S.C. 154(b) by 0 days.

(21) Appl. No.: 19/050,636

(22) Filed: Feb. 11, 2025

(65) Prior Publication Data

US 2026/0238358 A1 Aug. 13, 2026

(51) Int. Cl.
*H01Q 3/26* (2006.01)
*G01R 29/10* (2006.01)
(Continued)

(52) U.S. Cl.
CPC ............. *H04B 17/25* (2023.05); *G01R 29/10* (2013.01); *H01Q 3/267* (2013.01); *H04W 24/10* (2013.01)

(58) Field of Classification Search
CPC .......... H01Q 3/26; H01Q 3/267; H04B 17/25; H04B 7/06; G01R 29/10; H04W 24/08; H04W 24/10
See application file for complete search history.

(56) References Cited

U.S. PATENT DOCUMENTS 9,344,176 B2 * 5/2016 Barker ................. H04B 7/0408
10,530,053 B2 * 1/2020 Trotta ...................... H01Q 3/38
(Continued)

FOREIGN PATENT DOCUMENTS

CN 109151707 A 1/2019
CN 116997819 A 11/2023
(Continued)

OTHER PUBLICATIONS

U.S. Appl. No. 18/317,789, filed Oct. 15, 2024 , "Non-Final Office Action", U.S. Appl. No. 18/317,789, filed Oct. 15, 2024, 9 pages.
(Continued)

*Primary Examiner* — Tho G Phan
(74) *Attorney, Agent, or Firm* — FIG. 1 Patents

(57) ABSTRACT

Various aspects of the present disclosure relate to reporting differential measurement quantities for an antenna array. An apparatus, such as a first device, which may be a sensing transmitter (Tx) node, a user equipment (UE), a network equipment (NE), or another device, may receive a sensing signal from a second device. The first device may determine a differential measurement quantity based on the sensing signal. The differential measurement quantity may indicate a difference between a first measurement of a first channel segment associated with the first device at a first reference point, and a second measurement of a second channel segment associated with the first device at a second reference point. The first reference point and the second reference point may be associated with one or more antenna arrays of the first device. The first device may transmit a report including the differential measurement quantity.

20 Claims, 12 Drawing Sheets

(51) Int. Cl.

| | |
|---|---|
| ***H04B 17/20*** | (2015.01) |
| ***H04W 24/10*** | (2009.01) |

(56) References Cited

U.S. PATENT DOCUMENTS

| | | | |
|---|---|---|---|
| 11,700,100 B2 | 7/2023 | Motlagh et al. | |
| 12,095,553 B2 | 9/2024 | Taghizadeh et al. | |
| 12,278,778 B2 | 4/2025 | Taghizadeh Motlagh et al. | |
| 2016/0173250 A1 | 6/2016 | Kang et al. | |
| 2017/0251388 A1* | 8/2017 | Persson | H04W 24/08 |
| 2019/0053235 A1 | 2/2019 | Novlan et al. | |
| 2020/0107249 A1 | 4/2020 | Stauffer et al. | |
| 2020/0228272 A1 | 7/2020 | Soriaga et al. | |
| 2022/0007358 A1 | 1/2022 | Karjalainen et al. | |
| 2022/0099796 A1 | 3/2022 | Zorgui et al. | |
| 2022/0113400 A1 | 4/2022 | Manolakos et al. | |
| 2022/0150737 A1* | 5/2022 | Saggar | H04B 7/06 |
| 2022/0236394 A1 | 7/2022 | Nam et al. | |
| 2023/0171053 A1 | 6/2023 | Taghizadeh et al. | |
| 2023/0283435 A1 | 9/2023 | Motlagh et al. | |
| 2024/0022927 A1 | 1/2024 | Tong et al. | |
| 2024/0063930 A1 | 2/2024 | Ren | |
| 2024/0125915 A1 | 4/2024 | Au et al. | |
| 2024/0192308 A1 | 6/2024 | Taghizadeh et al. | |
| 2024/0340949 A1 | 10/2024 | Ding et al. | |
| 2026/0023159 A1 | 1/2026 | Taghizadeh Motlagh et al. | |
| 2026/0155882 A1 | 6/2026 | Thomas et al. | |
| 2026/0156492 A1 | 6/2026 | Thomas et al. | |
| 2026/0239061 A1 | 8/2026 | Taghizadeh Motlagh et al. | |
| 2026/0239062 A1 | 8/2026 | Taghizadeh Motlagh et al. | |

FOREIGN PATENT DOCUMENTS

| | | | |
|---|---|---|---|
| CN | 118216109 | A | 6/2024 |
| EP | 4308969 | A1 | 1/2024 |
| WO | 2020216522 | A1 | 10/2020 |
| WO | 2022150117 | A1 | 7/2022 |
| WO | 2022195557 | A1 | 9/2022 |
| WO | 2023100113 | A1 | 6/2023 |
| WO | 2023154141 | A1 | 8/2023 |
| WO | 2023222222 | A1 | 11/2023 |
| WO | 2024018438 | A1 | 1/2024 |
| WO | 2024052817 | A1 | 3/2024 |
| WO | 2024073048 | A1 | 4/2024 |
| WO | 2024147122 | A1 | 7/2024 |
| WO | 2025175825 | A1 | 8/2025 |
| WO | 2026058240 | A1 | 3/2026 |
| WO | 2026078679 | A1 | 4/2026 |
| WO | 2026133306 | A1 | 6/2026 |
| WO | 2026133307 | A1 | 6/2026 |
| WO | 2026133308 | A1 | 6/2026 |

OTHER PUBLICATIONS

U.S. Appl. No. 18/317,789, filed Feb. 14, 2025 , "Notice of Allowance", U.S. Appl. No. 18/317,789, filed Feb. 14, 2025, 8 pages.

22716279.9 , "Communication Pursuant to Article 94(3) EPC", EP Application No. 22716279.9, Mar. 5, 2025, 8 pages.

3GPP , "Physical layer measurements", ETSI-3GPP—TS38.215—v18.2.0—Release 18 [retrieved from the internet on Dec. 26, 2024], <https://www.etsi.org/deliver/etsi_ts/138200_138299/138215/18.02.00_60/ts_138215v180200p.pdf>, May 2024, 39 pages.

3GPP , "RP-234069—New SID: Study on channel modelling for Integrated Sensing And Communication (ISAC) for NR", [retrieved from the internet on Dec. 26, 2024], <https://www.3gpp.org/ftp/tsg_ran/TSG_RAN/TSGR_102/Info_for_workplan/new_approved_SID_6/RAN1_3>, Dec. 2023, 6 pages.

3rd Generation Partnership Proj. , "NG-RAN: NR Positioning Protocol A (NRPPa)", 3rd Generation Partnership Project, Technical Specification Group Radio Access Network, 3GPP TS 38.455 V16.5.0, 3GPP Organizational Partners, Valbonne, France [retrieved Feb. 2, 2022]. Retrieved from the Internet <http://www.3gpp.org>., Oct. 2021, 152 pages.

3rd Generation Partnership Proj. , "Physical channels and modulation (Release 18)", 3GPP TS 38.211 V18.3.0, [retrieved from the internet on Nov. 2, 2024], <https://portal.3gpp.org/desktopmodules/Specifications/SpecificationDetails.aspx?specificationId=3213>, Jun. 2024, 165 pages.

3rd Generation Partnership Proje , "Architecture enhancements for 5G System (5GS) to support Vehicle-to-Everything (V2X) services", 3GPP TS 23.287 V18.4.0 [retrieved from the internet on Feb. 6, 2025], Sep. 2024, 65 pages.

3rd Generation Partnership Proje , "Base Station (BS) radio transmission and reception", 3GPP TS 38.104 V18.7.0, [retrieved from the internet on Feb. 20, 2025], <https://portal.3gpp.org/desktopmodules/Specifications/SpecificationDetails.aspx?specificationl d=3202>, Sep. 2024, 414 pages.

3rd Generation Partnership Proje , "RAN1 Chair's Notes", 3GPP TSG RAN WG1 #117, Fukuoka City, Fukuoka, Japan, [retrieved from the internet on Oct. 3, 2024], <https://www.3gpp.org/ftp/tsg_ran/WG1_RL1/TSGR1_117/Inbox/Chair_notes>, May 20, 2024, 144 pages.

3rd Generation Partnership Proje , "RAN1 Chair's Notes", 3GPP TSG RAN WG1 #116-bis, Changsha, Hunan Province, China [retrieved Jul. 21, 2024} retrieved from the internet <https://www.3gpp.org/ftp/tsg_ran/WG1_RL1/TSGR1_116b/Inbox/Chair_notes>, Apr. 15, 2024, 37 pages.

3rd Generation Partnership Proje , "Requirements for support of radio resource management", 3GPP TS 38.133 Version 18.6.0, [retrieved from the internet], <https://www.etsi.org/deliver/etsi_ts/138100_138199/138133/18.06.00_60/ts_138133v180600p.pdf> Part 3 of 3, Aug. 2024, 1873 pages.

3rd Generation Partnership Proje , "Requirements for support of radio resource management", 3GPP Ts 38.133 Version 18.6.0, [retrieved from the internet], <https://www.etsi.org/deliver/etsi_ts/138100_138199/138133/18.06.00_60/ts_138133v180600p.pdf> Part 1 of 3, Aug. 2024, 1950 pages.

3rd Generation Partnership Proje , "Requirements for support of radio resource management", 3GPP TS 38.133 Version 18.6.0, [retrieved from the internet], <https://www.etsi.org/deliver/etsi_ts/138100_138199/138133/18.06.00_60/ts_138133v180600p.pdf> Part 2 of 3, Aug. 2024, 1950 pages.

3rd Generation Partnership Proje , "Service requirements for Integrated Sensing and Communication, Stage 1", 3GPP TS 22.137 V19.1.0 [retrieved from the internet on Feb. 6, 2025],, Mar. 2024, 14 pages.

3rd Generation Partnership Proje , "Study on channel model for frequencies from 0.5 to 100 GHz", 3GPP TR 38.901, [retrieved from the internet on Feb. 20, 2025], <https://portal.3gpp.org/desktopmodules/Specifications/SpecificationDetails.aspx?specificationId=3173>, Mar. 2024, 98 pages.

3rd Generation Partnership Proje , "Technical Specification Group Radio Access Network; NG Radio Access Network (NG-RAN); Stage 2 functional specification of User Equipment (UE) positioning in NG-RAN (Release 1 7)", 3GPP Standard; Technical Specification; 3GPP TS 38.305, vol. RAN WG2, No. V17.3.0, Jan. 13, 2023, 133 pages.

3rd Generation Partnership Proje , "Technical Specification Group TSG SA; Feasibility Study on Integrated Sensing and Communication", 3GPP TR 22.837 V19.1.0, Sep. 2023 [retrieved from the internet Jan. 28, 2025], Sep. 2023, 98 pages.

Hauser, Kevin , "Characterization of Biomolecular Helices and Their Complementarity Using Geometric Analysis", stonybrook.edu, [retrieved from the internet on Feb. 6, 2025], <https://www.ams.stonybrook.edu/~coutsias/papers/ci6b00721_si_001.pdf>, Apr. 2018, 10 pages.

Keskin, Musa Furkan, "Stepped-Carrier OFDM V2V Resource Allocation for Sensing and Communication Convergence", 2020 14th European Conference on Antennas and Propagation (EUCAP), EURAAP., Mar. 2020, 5 pages.

Motlagh, Seyedomid Taghizadeh, "Pursuant to MPEP § 2001.06(b) the applicant brings the following application to the Examiner's attention:", U.S. Appl. No. 63/162,900, filed Mar. 18, 2021, 46 pages.

(56) References Cited

OTHER PUBLICATIONS

Motlagh, Seyedomid Taghizadeh, "Pursuant to MPEP § 2001.06(b) the applicant brings the following co-pending application to the Examiner's attention:", U.S. Appl. No. 63/491,933, filed Mar. 23, 2023, 74 pages.
Motlagh, Seyedomid Taghizadeh, "Pursuant to MPEP § 2001.06(b) the applicant brings the following co-pending application to the Examiner's attention:", U.S. Appl. No. 18/997,158, filed Jan. 20, 2025, 79 pages.
PCT/IB2023/057470 , "International Seach Report and Written Opinion", PCT Application No. PCT/IB2023/057470, Sep. 28, 2023, 10 pages.
Radartutorial , "Radar Basics", Book 1, [retrieved from the internet on Feb. 9, 2025], <https://www.radartutorial.eu/druck/Book1.pdf>, Dec. 20, 2009, 18 pages.
Taghizadeh Motlagh, Seyedomid , "Pursuant to MPEP § 2001.06(b) the applicant brings the following co-pending application to the Examiner's attention:", U.S. Appl. No. 63/575,544, filed Apr. 5, 2024, 107 pages.
Taghizadeh Motlagh, Seyedomid , "Pursuant to MPEP § 2001.06(b) the applicant brings the following co-pending application to the Examiner's attention:", U.S. Appl. No. 19/050,446, filed Feb. 11, 2025, 119 pages.
Taghizadeh Motlagh, Seyedomid , "Pursuant to MPEP § 2001.06(b) the applicant brings the following co-pending application to the Examiner's attention:", U.S. Appl. No. 19/050,515, filed Feb. 11, 2025, 121 pages.
Taghizadeh Motlagh, Seyedomid , "Pursuant to MPEP § 2001.06(b) the applicant brings the following co-pending application to the Examiner's attention:", PCT Application No. PCT/CN2024/129058, Oct. 31, 2024, 79 pages.
Taghizadeh Motlagh, Seyedomid , "Pursuant to MPEP § 2001.06(b) the applicant brings the following co-pending application to the Examiner's attention:", U.S. Appl. No. 63/557,386, filed Feb. 23, 2024, 89 pages.
Taghizadeh Motlagh, Seyedomid , "Pursuant to MPEP § 2001.06(b) the applicant brings the following co-pending application to the Examiner's attention:", U.S. Appl. No. 63/555,020, filed Feb. 28, 2024, 98 pages.
Thomas, Robin Rajan, "Pursuant to MPEP § 2001.06(b) the applicant brings the following co-pending application to the Examiner's attention:", U.S. Appl. No. 18/965,904, filed Dec. 2, 2024, 82 pages.
Yang, Heng , "Queue-Aware Dynamic Resource Allocation for the Joint Communication-Radar System", IEEE Transactions on Vehicular Technology, IEEE, USA, vol. 70, No. 1, Dec. 4, 2020 (Dec. 4, 2020), Dec. 2020.
International Search Report and Written Opinion for Application No. PCT/IB2025/062128, mailed Mar. 9, 2026, 10 pages.
International Search Report and Written Opinion for Application No. PCT/IB2025/062125, mailed Feb. 13, 2026, 21 pages.
"International Search Report and Written Opinion", PCT Application No. PCT/CN2024/129058, Jul. 16, 2025, 7 pages.
International Search Report and Written Opinion for Application No. PCT/IB2026/050768, mailed Apr. 30, 2026, 28 pages.
International Search Report and Written Opinion for Application No. PCT/IB2026/050769, mailed May 6, 2026, 33 pages.
International Search Report and Written Opinion for Application No. PCT/IB2026/050771, mailed Apr. 30, 2026, 33 pages.
Moderator (OPPO), "Summary#4 for other aspects on AI/ML for beam management", 3GPP TSG RAN WG1 #113, R1-2306072, May 22, 2023, 119 pages.

* cited by examiner

REPORTING DIFFERENTIAL MEASUREMENT QUANTITIES FOR AN ANTENNA ARRAY

TECHNICAL FIELD

The present disclosure relates to wireless communications, and more specifically to reporting differential measurement quantities for an antenna array.

BACKGROUND

A wireless communications system may include one or multiple network communication devices, which may be otherwise known as network equipment (NE), supporting wireless communications for one or multiple user communication devices, which may be otherwise known as user equipment (UE), or other suitable terminology. The wireless communications system may support wireless communications with one or multiple user communication devices by utilizing resources of the wireless communication system (e.g., time resources (e.g., symbols, slots, subframes, frames, or the like) or frequency resources (e.g., subcarriers, carriers, or the like)). Additionally, the wireless communications system may support wireless communications across various radio access technologies including third generation (3G) radio access technology, fourth generation (4G) radio access technology, fifth generation (5G) radio access technology, among other suitable radio access technologies beyond 5G (e.g., sixth generation (6G)).

SUMMARY

An article "a" before an element is unrestricted and understood to refer to "at least one" of those elements or "one or more" of those elements. The terms "a," "at least one," "one or more," and "at least one of one or more" may be interchangeable. As used herein, including in the claims, "or" as used in a list of items (e.g., a list of items prefaced by a phrase such as "at least one of" or "one or more of" or "one or both of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an example step that is described as "based on condition A" may be based on both a condition A and a condition B without departing from the scope of the present disclosure. In other words, as used herein, the phrase "based on" shall be construed in the same manner as the phrase "based at least in part on." Further, as used herein, including in the claims, a "set" may include one or more elements.

A first device (e.g., a UE, a NE, a base station), for wireless communication is described. The UE may be configured to, capable of, or operable to perform one or more operations as described herein. For example, the first device may be configured to, capable of, or operable to receive, from a second device (e.g., a UE, a NE, a base station), a sensing signal; determine a differential measurement quantity based on the sensing signal, wherein the differential measurement quantity indicates a difference between a first measurement of a first channel segment associated with the first device at a first RP (RP) and a second measurement of a second channel segment associated with the first device at a second RP, and wherein the first RP and the second RP are associated with one or more antenna arrays of the first device; and transmit, to the second device, a report including the differential measurement quantity.

A processor (e.g., a standalone processor chipset, or a component of a device) for wireless communication is described. The processor may be configured to, capable of, or operable to perform one or more operations as described herein. For example, the processor may be configured to, capable of, or operable to receive, from a second device (e.g., a UE, a NE, a base station), a sensing signal; determine a differential measurement quantity based on the sensing signal, wherein the differential measurement quantity indicates a difference between a first measurement of a first channel segment associated with the first device at a first RP and a second measurement of a second channel segment associated with the first device at a second RP, and wherein the first RP and the second RP are associated with one or more antenna arrays of the first device; and transmit, to the second device, a report including the differential measurement quantity.

A method performed or performable by a first device for wireless communication is described. The method may include receiving, from a second device (e.g., a UE, a NE, a base station), a sensing signal; determining a differential measurement quantity based on the sensing signal, wherein the differential measurement quantity indicates a difference between a first measurement of a first channel segment associated with the first device at a first RP and a second measurement of a second channel segment associated with the first device at a second RP, and wherein the first RP and the second RP are associated with one or more antenna arrays of the first device; and transmitting, to the second device, a report including the differential measurement quantity.

In some implementations of the first device, the processor, and the method described herein, the differential measurement quantity comprises one of more dependencies in accordance with a difference between a first differential measurement quantity type and a second differential measurement quantity type based on one or more of: a first sensing transmitter node and a second sensing transmitter node that transmit the sensing signal for which the first differential measurement quantity type and the second differential measurement quantity type are determined; a first sensing receiver node and a second sensing receiver node that receive the sensing signal for which the first differential measurement quantity type and the second differential measurement quantity type are determined; a first transmission RP corresponding to the first sensing transmitter node and a second transmission RP corresponding to the second sensing transmitter node for which the first differential measurement quantity type and the second differential measurement quantity type are determined; a first reception RP corresponding to the first sensing receiver node and a second reception RP corresponding to the second sensing receiver node for which the first differential measurement quantity type and the second differential measurement quantity type are determined; the first channel segment and the second channel segment for which the first differential measurement quantity type and the second differential measurement quantity type are determined; a first signal transmitted by the first sensing transmitter node and received by the first sensing receiver node and a second signal transmitted by the second sensing transmitter node and received by the second sensing receiver node for which the first differential measurement quantity type and the second differential measurement quantity type are determined; a first time period and a second time period based on which the first differential measurement quantity type and the second differential measurement quantity type are determined; or a third time period and a fourth time people for which the first differential measurement quantity type and the second differential measurement quantity type are valid.

In some implementations of the first device, the processor, and the method described herein, the differential measurement quantity comprises one or more of a time difference of arrival, an angle difference of arrival, or a doppler shift difference of arrival between the first channel segment received via the first RP and the second channel segment received via the second RP.

In some implementations of the first device, the processor, and the method described herein, the differential measurement quantity comprises one or more of a time difference or a frequency difference between reception of the first channel segment via the first RP and transmission of the second channel segment via the second RP.

In some implementations of the first device, the processor, and the method described herein, the first device, the processor, and the method may further be configured to, capable of, or operable to determine a second differential measurement quantity over one or more RPs of at least one of the one or more antenna arrays, a full antenna array, or a segment of an antenna array and a variation measurement of the second differential measurement quantity; and transmit a second report indicating the second differential measurement quantity and the variation measurement.

In some implementations of the first device, the processor, and the method described herein, the first device, the processor, and the method may further be configured to, capable of, or operable to determine a quantity of differential measurements, a quantity of RPs for which the differential measurements are to be reported, and a quantity of RP pairs for which the differential measurements are to be reported over a channel segment.

In some implementations of the first device, the processor, and the method described herein, a differential measurement quantity type comprises one or more of time-based measurements, doppler-based measurements, phase-based measurements, angle-based measurements, energy-based measurements, power-based measurements, micro-doppler measurements, vibration-rate measurements, or information associated with sensing results of a sensing target.

In some implementations of the first device, the processor, and the method described herein, a channel segment comprises one or more of: a direct propagation path or a direct ray between the first device and the second device; an indirect propagation path or an indirect ray between the first device and the second device that is associated with a scattering point of a scattering object; or multiple propagation paths or multiple rays between the first device and the second device that are associated with at least one of the scattering object or a property of a propagation path or a ray.

In some implementations of the first device, the processor, and the method described herein, the first device, the processor, and the method may further be configured to, capable of, or operable to receive signaling comprising configuration information, and wherein reception of the sensing signal and determination of the differential measurement quantity are based on the configuration information.

In some implementations of the first device, the processor, and the method described herein, the configuration information comprises one or more of: a set of parameters associated the sensing signal to be used for determining the differential measurement quantity; a type of differential measurement quantity to be reported; information associated with a channel segment for which the differential measurement quantity is to be reported; RPs of the one or more antenna arrays for which the differential measurement quantity is to be determined; a configuration for transmission of the report; or a trigger for the transmission of the report.

In some implementations of the first device, the processor, and the method described herein, the configuration information indicates a boundary of an RP as a segment of the one or more antenna arrays.

In some implementations of the first device, the processor, and the method described herein, the sensing signal comprises one or more of a reference signal, a data channel, or a control channel associated with one or more of a downlink direction, an uplink direction, a sidelink direction, or a gNodeB (gNB)-to-gNB transmission direction.

In some implementations of the first device, the processor, and the method described herein, the first RP is the same as the second RP or is different from the second RP.

DETAILED DESCRIPTION

Figure 1:
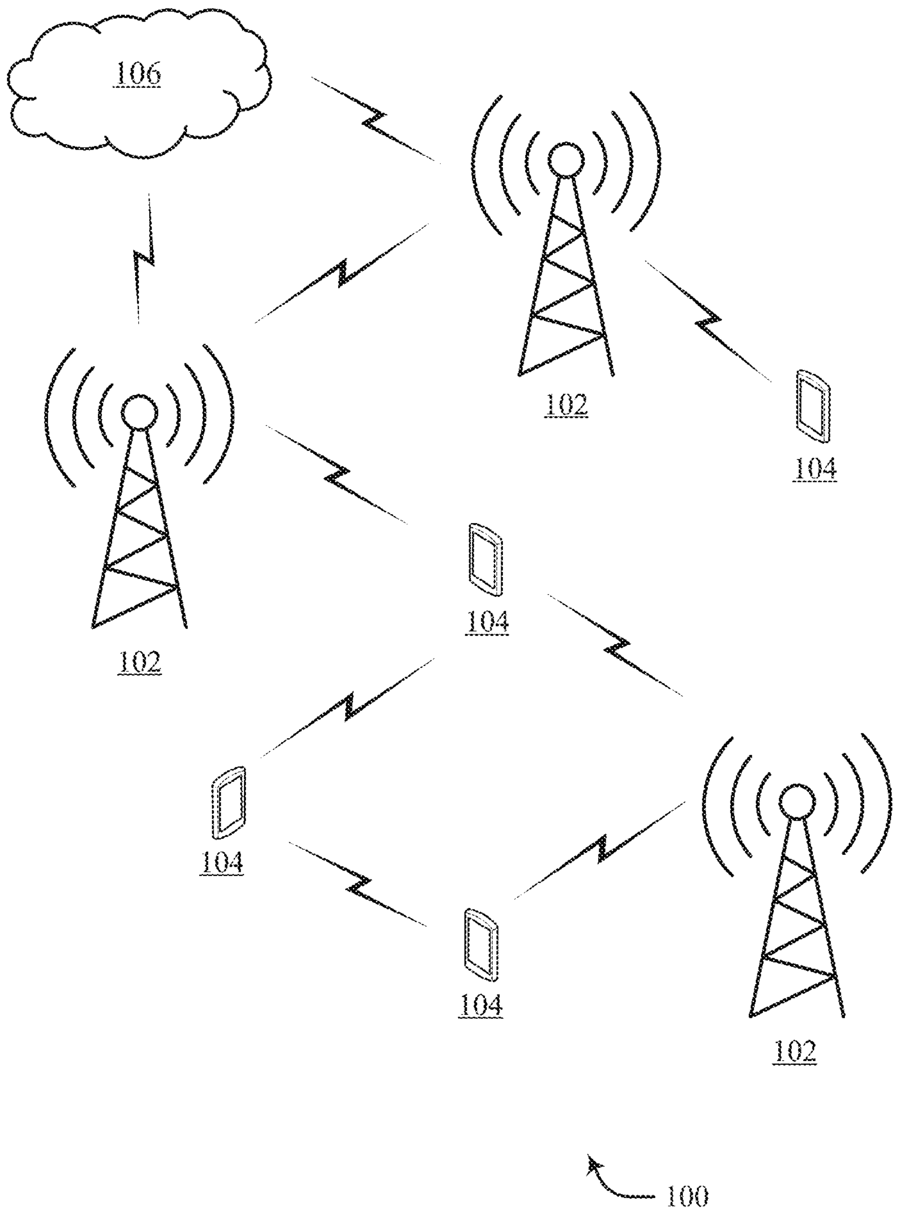
FIG. 1 illustrates an example of a wireless communications system in accordance with aspects of the present disclosure.

In a wireless communications system, a UE and a NE (e.g., a base station, gNB) may support wireless communication (e.g., reception and/or transmission of wireless communication) using time-frequency resources. The devices can leverage sensing signals to gather information for detection of reflected signal paths of a sensing signal, identification of path types of the reflected signal paths, and reporting of the detected reflected signal paths and the identified path types. With reference to channel modeling for ISAC, which is innovated to facilitate an evaluation framework for integrated wireless communication and sensing functionalities, and for achievable sensing key performance indicators (KPIs). As such, sensing and detecting a sensing target includes measurement and identification of impacted, reflected signals by the sensing target (e.g., an object) and thereby inference of the physical conditions associated with the sensing target, such as presence, position, rotation, velocity, etc.

Various scenarios of network-based radio sensing operations and UE-based radio sensing operations may include scenarios of radio sensing where the network configures the participating sensing entities, i.e., network and UE nodes acting as sensing Tx nodes, network and UE nodes acting as sensing Rx nodes, as well as the configuration of sensing signal and measurement and reporting procedures from the nodes. In this regard, the functional split between the network and the UE nodes for a specific sensing task (e.g., task of detecting presence of a pedestrian in a road) may take various forms, depending on the availability of sensing-capable devices and the requirements of the specific sensing task.

In a conventional measurement and reporting framework, a signal path may be detected and reported. Nevertheless, regarding variations of a measurement quantity across an extended array, the current measurement and reporting framework often results in coherent and unequal measurement (e.g., of a phases, angle of arrival (AoA), zenith of arrival (ZoA), Doppler shift, power) and reporting of a path associated with a transmission point (e.g., of a target UE) or of scattering points (e.g., of a sensing target) across the antenna elements of an extended array. Accordingly, aspects of the techniques described herein provide that a sensing Rx node reports measurement quantities (as multiple individual quantities or as quantities describing a group of measurements) of a path to a sensing management function (SensMF), where the path may be initiated from a sensing Tx node and terminated at the sensing Rx node. Additionally, each of the measurement quantities may be separately associated with an RP within an antenna array of the sensing Rx node. As such, the SensMF may derive sensing results of a sensing task (e.g., detecting an intruder in a smart home) based on reception of the measurement report including an association of reported path parameters to the RPs.

In one or more implementations, the SensMF may also be referred to as a sensing management configuration entity (SMCE), or as a sensing management configuration function (SMCF). The SensMF can be implemented as a network entity and/or as a function, and SensMF may include one or more of a core network entity or function, a RAN management entity or function, a function implemented in a UE or other network device, or as a distributed function across multiple entities or devices.

In accordance with the described techniques, a sensing Rx node (e.g., a receiver) may measure and report measurement quantities of a same propagation path (e.g., reflected from a same scattering object) associated with RPs of the antenna array of the sensing Rx node. In some implementations, the sensing Rx node may report measurements of multiple paths that are associated with a QCL relation describing a propagation geometry of the paths. For example, the QCL relation may include at least one of a path initiation point, a path termination pint, a number of reflection/scattering segments, or sharing of a first Tx-scatterer (or scattering point) segment or a last scattered (or scattering point)-Rx segment. In some implementations the sensing Rx node may report a function or pattern by which a measurement quantity is observed over the antenna array of a segment of the array (instead of separate measurement quantities for each of the RPs), including any one or more of a linear or affine function, a quadratic function, or an exponential function describing any of the phase, angle, Doppler shift, or delay over a local coordinate system (LCS) of the antenna array of the sensing Rx node. In some examples, a radio node capability for reporting a measurement quantity may include a number of RPs of the antenna array, a description (e.g., position, shape) of the RPs, a maximum number of RPs for which the measurement quantity of the same path can be reported within a same time or time window or based on reception of a same signal. In some examples, the sensing Rx node may determine a quantity of differential measurements, a quantity of RPs for which the differential measurements are to be reported, and a quantity of RP pairs for which the differential measurements are to be reported over a channel segment.

Additionally, or alternatively, the sensing Rx node may report one or more LOS, NLOS, blocked, or non-blocked states of a path to a SensMF, where the path may be initiated from the sensing Tx node and terminated at the sensing Rx node. To do so, the sensing Rx node may receive a sensing signal (e.g., from the sensing Tx node, via a path). The sensing Rx node may determine a status of a channel segment observed by the sensing Rx node over an area associated with the sensing Rx node. That is, each of the states of the path may be associated with a subarea (also referred to herein as a segment or a subspace) of the antenna array of the sensing Rx node. The sensing Rx node may also determine the subarea, where the status is applicable to the subarea and where the subarea is a portion of the area. The sensing Rx node may transmit a report indicating the status and the subarea. That is, the sensing Rx node may report the subarea of the antenna array for which the determined status holds. In some examples, the SensMF may derive sensing results of a sensing task based at least on reception of the measurement report, including an association of a blockage status to multiple receiver array segments or RPs.

Additionally, or alternatively, the sensing Rx node may report differential measurements of paths, where parameters of a differential measurement may be associated with a different RP of an antenna array of the sensing Rx node and with the same or a different propagation path. That is, based on a received sensing signal, the sensing Rx node may generate or determine a differential measurement quantity that indicates a difference between a first measurement of a first channel segment associated with the sensing Rx node at a first RP and a second measurement of a second channel segment associated with the sensing Rx node at a second RP. The first RP and the second RP may be associated with one or more antenna arrays of the sensing Rx node. The sensing Rx node may transmit a report including the differential measurement quantity. As such, the SensMF may derive sensing results of a sensing task based on the report, including an association of the differential measurements to the pair of RPs based on which differential measurements are determined.

Reference is made herein to communicating data or information, such as signaling communication resources and/or communications that are transmitted or received between devices. It is to be appreciated that other terms may be used interchangeably with communicating, such as signaling, transmitting, receiving, outputting, forwarding, retrieving, obtaining, and so forth. Aspects of the present disclosure are described in the context of a wireless communications system.

FIG. 1 illustrates an example of a wireless communications system 100 in accordance with aspects of the present disclosure. The wireless communications system 100 may include one or more NEs 102, one or more UEs 104, and a core network (CN) 106. The wireless communications system 100 may support various radio access technologies. In some implementations, the wireless communications system 100 may be a 4G network, such as an LTE network or an LTE-Advanced (LTE-A) network. In some other implementations, the wireless communications system 100 may be a New Radio (NR) network, such as a 5G network, a 5G-Advanced (5G-A) network, or a 5G ultrawideband (5G-UWB) network. In other implementations, the wireless communications system 100 may be a combination of a 4G network and a 5G network, or other suitable radio access technology including Institute of Electrical and Electronics Engineers (IEEE) 802.11 (Wi-Fi), IEEE 802.16 (WiMAX), IEEE 802.20. The wireless communications system 100 may support radio access technologies beyond 5G, for example, 6G. Additionally, the wireless communications system 100 may support technologies, such as time division multiple access (TDMA), frequency division multiple access (FDMA), or code division multiple access (CDMA), etc.

The one or more NEs 102 may be dispersed throughout a geographic region to form the wireless communications system 100. One or more of the NEs 102 described herein may be or include or may be referred to as a network node, a base station, an access point (AP), a network element, a network function, a network entity, network infrastructure (or infrastructure), a radio access network (RAN), a NodeB, an eNodeB (eNB), a next-generation NodeB (gNB), or other suitable terminology. An NE 102 and a UE 104 may communicate via a communication link, which may be a wireless or wired connection. For example, an NE 102 and a UE 104 may perform wireless communication (e.g., receive signaling, transmit signaling) over a Uu interface.

An NE 102 may provide a geographic coverage area for which the NE 102 may support services for one or more UEs 104 within the geographic coverage area. For example, an NE 102 and a UE 104 may support wireless communication of signals related to services (e.g., voice, video, packet data, messaging, broadcast, etc.) according to one or multiple radio access technologies. In some implementations, an NE 102 may be moveable, for example, a satellite associated with a non-terrestrial network (NTN). In some implementations, different geographic coverage areas associated with the same or different radio access technologies may overlap, but the different geographic coverage areas may be associated with different NE 102.

The one or more UEs 104 may be dispersed throughout a geographic region of the wireless communications system 100. A UE 104 may include or may be referred to as a remote unit, a mobile device, a wireless device, a remote device, a subscriber device, a transmitter device, a receiver device, or some other suitable terminology. In some implementations, the UE 104 may be referred to as a unit, a station, a terminal, or a client, among other examples. Additionally, or alternatively, the UE 104 may be referred to as an Internet-of-Things (IoT) device, an Internet-of-Everything (IoE) device, or machine-type communication (MTC) device, among other examples.

A UE 104 may be able to support wireless communication directly with other UEs 104 over a communication link. For example, a UE 104 may support wireless communication directly with another UE 104 over a device-to-device (D2D) communication link. In some implementations, such as vehicle-to-vehicle (V2V) deployments, vehicle-to-everything (V2X) deployments, or cellular-V2X deployments, the communication link may be referred to as a sidelink. For example, a UE 104 may support wireless communication directly with another UE 104 over a PC5 interface.

An NE 102 may support communications with the CN 106, or with another NE 102, or both. For example, an NE 102 may interface with other NE 102 or the CN 106 through one or more backhaul links (e.g., S1, N2, N6, or other network interface). In some implementations, the NE 102 may communicate with each other directly. In some other implementations, the NE 102 may communicate with each other indirectly (e.g., via the CN 106). In some implementations, one or more NEs 102 may include subcomponents, such as an access network entity, which may be an example of an access node controller (ANC). An ANC may communicate with the one or more UEs 104 through one or more other access network transmission entities, which may be referred to as a radio heads, smart radio heads, or transmission-reception points (TRPs).

The CN 106 may support user authentication, access authorization, tracking, connectivity, and other access, routing, or mobility functions. The CN 106 may be an evolved packet core (EPC), or a 5G core (5GC), which may include a control plane entity that manages access and mobility (e.g., a mobility management entity (MME), an access and mobility management functions (AMF)) and a user plane entity that routes packets or interconnects to external networks (e.g., a serving gateway (S-GW), a packet data network (PDN) gateway (P-GW), or a user plane function (UPF)). In some implementations, the control plane entity may manage non-access stratum (NAS) functions, such as mobility, authentication, and bearer management (e.g., data bearers, signal bearers, etc.) for the one or more UEs 104 served by the one or more NEs 102 associated with the CN 106.

The CN 106 may communicate with a packet data network over one or more backhaul links (e.g., via an S1, N2, N6, or other network interface). The packet data network may include an application server. In some implementations, one or more UEs 104 may communicate with the application server. A UE 104 may establish a session (e.g., a protocol data unit (PDU) session, or the like) with the CN 106 via an NE 102. The CN 106 may route traffic (e.g., control information, data, and the like) between the UE 104 and the application server using the established session (e.g., the established PDU session). The PDU session may be an example of a logical connection between the UE 104 and the CN 106 (e.g., one or more network functions of the CN 106).

In the wireless communications system 100, the NEs 102 and the UEs 104 may use resources of the wireless communications system 100 (e.g., time resources (e.g., symbols, slots, subframes, frames, or the like) or frequency resources (e.g., subcarriers, carriers)) to perform various operations (e.g., wireless communications). In some implementations, the NEs 102 and the UEs 104 may support different resource structures. For example, the NEs 102 and the UEs 104 may support different frame structures. In some implementations, such as in 4G, the NEs 102 and the UEs 104 may support a single frame structure. In some other implementations, such as in 5G and among other suitable radio access technologies, the NEs 102 and the UEs 104 may support various frame structures (i.e., multiple frame structures). The NEs 102 and the UEs 104 may support various frame structures based on one or more numerologies.

One or more numerologies may be supported in the wireless communications system 100, and a numerology may include a subcarrier spacing and a cyclic prefix. A first numerology (e.g., $\mu=0$) may be associated with a first subcarrier spacing (e.g., 15 kHz) and a normal cyclic prefix. In some implementations, the first numerology (e.g., $\mu=0$) associated with the first subcarrier spacing (e.g., 15 kHz) may utilize one slot per subframe. A second numerology (e.g., $\mu 1$) may be associated with a second subcarrier spacing (e.g., 30 kHz) and a normal cyclic prefix. A third numerology (e.g., $\mu=2$) may be associated with a third subcarrier spacing (e.g., 60 kHz) and a normal cyclic prefix or an extended cyclic prefix. A fourth numerology (e.g., $\mu=3$) may be associated with a fourth subcarrier spacing (e.g., 120 kHz) and a normal cyclic prefix. A fifth numerology (e.g., $\mu=4$) may be associated with a fifth subcarrier spacing (e.g., 240 kHz) and a normal cyclic prefix.

A time interval of a resource (e.g., a communication resource) may be organized according to frames (also referred to as radio frames). Each frame may have a duration, for example, a 10 millisecond (ms) duration. In some implementations, each frame may include multiple subframes. For example, each frame may include 10 subframes, and each subframe may have a duration, for example, a 1 ms duration. In some implementations, each frame may have the same duration. In some implementations, each subframe of a frame may have the same duration.

Additionally, or alternatively, a time interval of a resource (e.g., a communication resource) may be organized according to slots. For example, a subframe may include a number (e.g., quantity) of slots. The number of slots in each subframe may also depend on the one or more numerologies supported in the wireless communications system 100. For instance, the first, second, third, fourth, and fifth numerologies (i.e., $\mu=0$, $\mu=1$, $\mu=2$, $\mu=3$, $\mu=4$) associated with respective subcarrier spacings of 15 kHz, 30 kHz, 60 kHz, 120 kHz, and 240 kHz may utilize a single slot per subframe, two slots per subframe, four slots per subframe, eight slots per subframe, and 16 slots per subframe, respectively. Each slot may include a number (e.g., quantity) of symbols (e.g., OFDM symbols). In some implementations, the number (e.g., quantity) of slots for a subframe may depend on a numerology. For a normal cyclic prefix, a slot may include 14 symbols. For an extended cyclic prefix (e.g., applicable for 60 kHz subcarrier spacing), a slot may include 12 symbols. The relationship between the number of symbols per slot, the number of slots per subframe, and the number of slots per frame for a normal cyclic prefix and an extended cyclic prefix may depend on a numerology. It should be understood that reference to a first numerology (e.g., $\mu=0$) associated with a first subcarrier spacing (e.g., 15 kHz) may be used interchangeably between subframes and slots.

In the wireless communications system 100, an electromagnetic (EM) spectrum may be split, based on frequency or wavelength, into various classes, frequency bands, frequency channels, etc. By way of example, the wireless communications system 100 may support one or multiple operating frequency bands, such as frequency range designations FR1 (410 MHz-7.125 GHZ), FR2 (24.25 GHz-52.6 GHz), FR3 (7.125 GHz-24.25 GHz), FR4 (52.6 GHz-114.25 GHz), FR4a or FR4-1 (52.6 GHz-71 GHz), and FR5 (114.25 GHz-300 GHz). In some implementations, the NEs 102 and the UEs 104 may perform wireless communications over one or more of the operating frequency bands. In some implementations, FR1 may be used by the NEs 102 and the UEs 104, among other equipment or devices for cellular communications traffic (e.g., control information, data). In some implementations, FR2 may be used by the NEs 102 and the UEs 104, among other equipment or devices for short-range, high data rate capabilities.

FR1 may be associated with one or multiple numerologies (e.g., at least three numerologies). For example, FR1 may be associated with a first numerology (e.g., $\mu=0$), which includes 15 kHz subcarrier spacing; a second numerology (e.g., $\mu=1$), which includes 30 kHz subcarrier spacing; and a third numerology (e.g., $\mu=2$), which includes 60 kHz subcarrier spacing. FR2 may be associated with one or multiple numerologies (e.g., at least 2 numerologies). For example, FR2 may be associated with a third numerology (e.g., $\mu=2$), which includes 60 kHz subcarrier spacing; and a fourth numerology (e.g., $\mu=3$), which includes 120 kHz subcarrier spacing.

According to implementations, one or more of the NEs 102 and the UEs 104 are operable to implement various aspects of the techniques described with reference to the present disclosure. For example, a UE 104 may be implemented as a sensing Rx node (e.g., a network sensing node), and an NE 102 may be implemented as a SensMF (e.g., a configuration entity) or a sensing Tx node. The UE 104 may also be referred to herein as a first device, and the NE 102 may also be referred to herein as a second device. The UE 104 receives, from the NE 102, a sensing signal, which may be a reference signal, a data channel, or a control channel associated with some transmission direction. The UE 104 may generate measurement quantities for a channel segment observed by the UE 104 based on the sensing signal, where measurement values of the measurement quantities may each correspond to an RP of an antenna array of the UE 104 (e.g., a sensing Rx node array). The UE 104 may transmit a report including the measurement quantities to the NE 102.

It is understood that the described techniques are not limited to a single embodiment and/or implementation elements individually, and one or more elements from one or more implementations and/or embodiments may be combined to construct a new embodiment. Moreover, applicability and utilization of any of the proposed method, message exchange, architecture, configuration, measurement, capability information elements in the described techniques are not intended to be restricted to the particularly defined scenario and are intended to be interpreted as applicable for any alternate application/scenario, e.g., not being limited to a sensing measurement scenario and/or a positioning measurement scenario. As such, the sensing Tx nodes and the sensing Rx nodes may be a target UE device participating in a positioning task, that is participating in a measurement to obtain position information of the UE. A sensing target may be a target UE device for which a positioning information is derived or obtained by the network, or an object attached to, co-located with, or encompassing the UE.

Reference is made herein to communicating data or information, such as signaling that is transmitted or received between devices. It is to be appreciated that other terms may be used interchangeably with signaling, such as communicating, transmitting, receiving, outputting, forwarding, retrieving, obtaining, and so forth.

Figure 2:
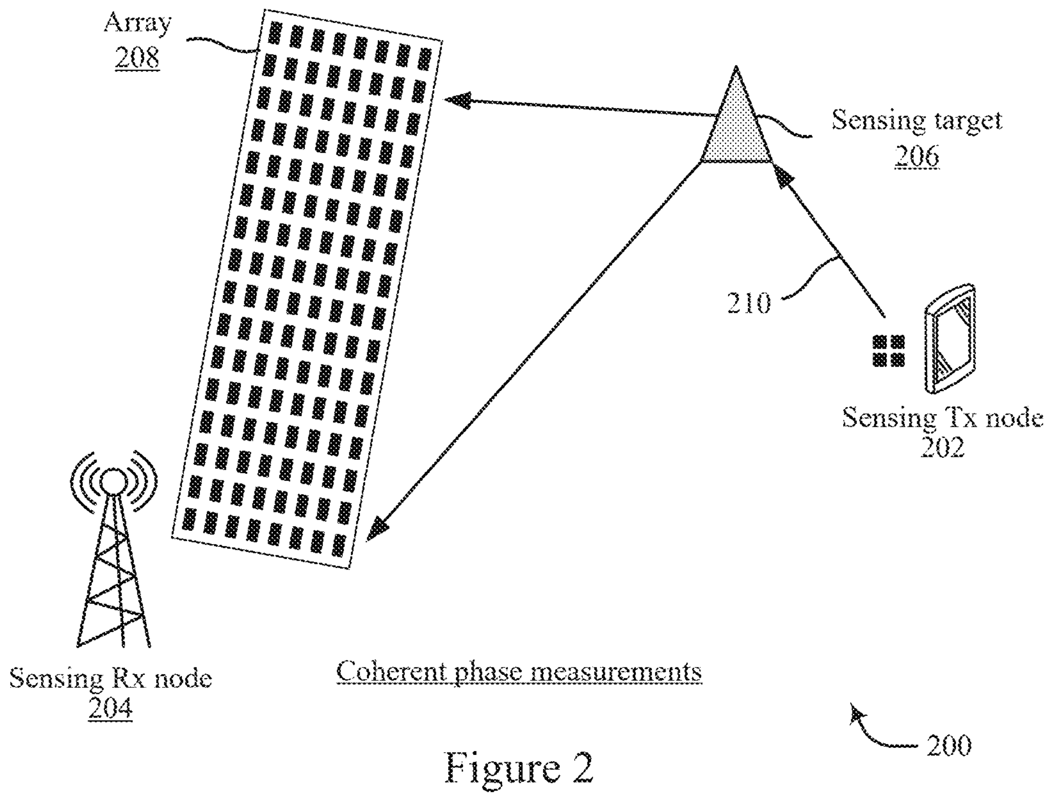
FIG. 2 illustrates an example of coherent phase measurements for sensing scenarios as related to reporting differential measurement quantities for an antenna array, in accordance with aspects of the present disclosure.

FIG. 2 illustrates an example 200 of coherent phase measurements for sensing scenarios as related to reporting differential measurement quantities for an antenna array, in accordance with aspects of the present disclosure. The example 200 specifically depicts coherent phase measurements which lead to angular variation across the antenna array.

In some implementations, radio sensing may include obtaining information of physical objects by means of one or more of transmission of a sensing signal (e.g., an NR downlink channel state information-reference signal (CSI-RS) or an NR downlink, uplink, or sidelink sounding reference signal (SRS), or a sensing-dedicated reference signal) from a network or UE entity referred to as a sensing Tx node 202, reception of the transmitted sensing signal impacted by physical objects or the physical environment (e.g., reflected, refracted, scattered, blocked, attenuated, etc.) by a network or a UE entity referred to as a sensing Rx node 204, or processing of the received reflections and inferring relevant information from the physical objects.

Additionally, large array dimensions may be considered, where impacts of spherical wavefront and spatial non-stationarity may exist for Tx or Rx scattering geometries coinciding with the near field area of a radio. As such, when radio nodes (e.g., the sensing Tx node 202, the sensing Rx node 204) are capable of performing sensing transmission, reception, and measurements for a target object located within a near field region of the radio node, then the measurement framework may be enhanced with the consideration of the near-field effect for a target observed via an array of extended dimensions.

As described in the example 200, a sensing target 206 is depicted from the point of view of an extended or large receiver array, such as an array 208 corresponding to the sensing Rx node 204. The sensing target 206, the sensing Tx node 202, or both may be located within the near field region of the sensing Rx node 204. The coherent observation of the same scattering point, propagation path, or transmission or reception point across a large extended array may lead to observation of a range of (unequal) parameters associated with the same path, scattering point, or transmission or reception point. The current measurement framework may facilitate reporting of a path with an indicated parameter, multiple paths with multiple associated parameters, and a range or uncertainty region of a given path. Nevertheless, the measurement quantity describing multiple parameters of the same path corresponding to the different parts or locations of an array may not be supported by the current measurement framework. In particular, measurements captured over an extended antenna array dimension of the array 208 may be informative of the target shape, geometry and location, and mobility pattern at least when, for a path 210 initiated from the sensing Tx node 202, scattered or reflected by the sensing target 206, and terminated at the sensing Rx node 204 equipped with an extended array dimension at a different angle, delay, or Doppler, the path associated with the sensing target 206 may be perceived across different Rx locations of the sensing Rx node.

As such, the described techniques support the expansion of the current measurement framework (e.g., as part of a new sensing measurement framework of a new positioning measurement framework, e.g., NR Positioning Protocol A (NRPPa), LTE Positioning Protocol (LPP)) of paths or channel samples to support coherent and unequal measurement (e.g., of phases, AoA, ZoA, Doppler shift, power) and reporting of a path associated with a transmission point (e.g., of a target UE) or of scattering points (e.g., of a sensing target) across antenna elements of an extended antenna array, such as the array 208. The described techniques also support differential measurement and reporting of shared propagation paths for different antenna array RPs and segments. Additionally, the described techniques support measurement and reporting of a partial blockage status of a path across antenna element locations of an extended array for paths initiated from a sensing Tx node and terminated at a sensing Rx node.

Figure 3:
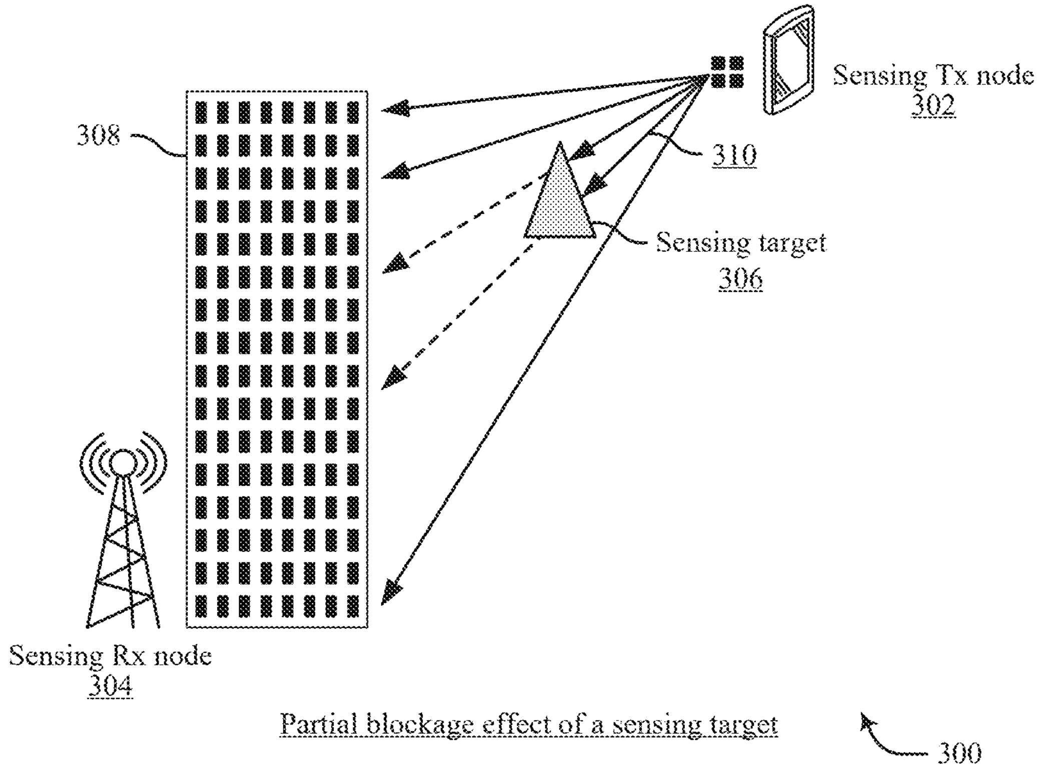
FIG. 3 illustrates an example of a partial blockage effect of a sensing target for sensing scenarios as related to reporting differential measurement quantities for an antenna array, in accordance with aspects of the present disclosure.

FIG. 3 illustrates an example 300 of a partial blockage effect of a sensing target for sensing scenarios as related to reporting differential measurement quantities for an antenna array, in accordance with aspects of the present disclosure. As described with reference to the example 200 of FIG. 2, a sensing target 306 is depicted in the example 300 from the point of view of an extended or large receiver array, such as an array 308 corresponding to a sensing Rx node 304. The sensing target 306, a sensing Tx node 302, or both may be located within the near field region of the sensing Rx node 304. The coherent observation of the same scattering point, propagation path, or transmission or reception point across a large extended array may lead to observation of a range of (unequal) parameters associated with the same path, scattering point, or transmission or reception point. The current measurement framework may facilitate reporting of a path with an indicated parameter, multiple paths with multiple associated parameters, and a range or uncertainty region of a given path. Nevertheless, the measurement quantity describing multiple parameters of the same path corresponding to the different parts or locations of an array may not be supported by the current measurement framework. In particular, measurements captured over an extended antenna array dimension of the array 208 may be informative of the target shape, geometry and location, and mobility pattern at least when, for a path 310 terminated at the sensing Rx node 304 with an extended array dimension and may be blocked by the sensing target 306, presence of the sensing target 306 leads to different blockage conditions (e.g., fully blocked, partially-blocked, non-blocked or unblocked) or attenuation of the path energy across different Rx antenna locations.

As such, the described techniques support the expansion of the current measurement framework (e.g., as part of a new sensing measurement framework of a new positioning measurement framework, e.g., NRPPa, LPP) of paths or channel samples to support coherent and unequal measurement (e.g., of phases, AoA, ZoA, Doppler shift, power) and reporting of a path associated with a transmission point (e.g., of a target UE) or of scattering points (e.g., of a sensing target) across antenna elements of an extended antenna array, such as the array 308.

Figure 4:
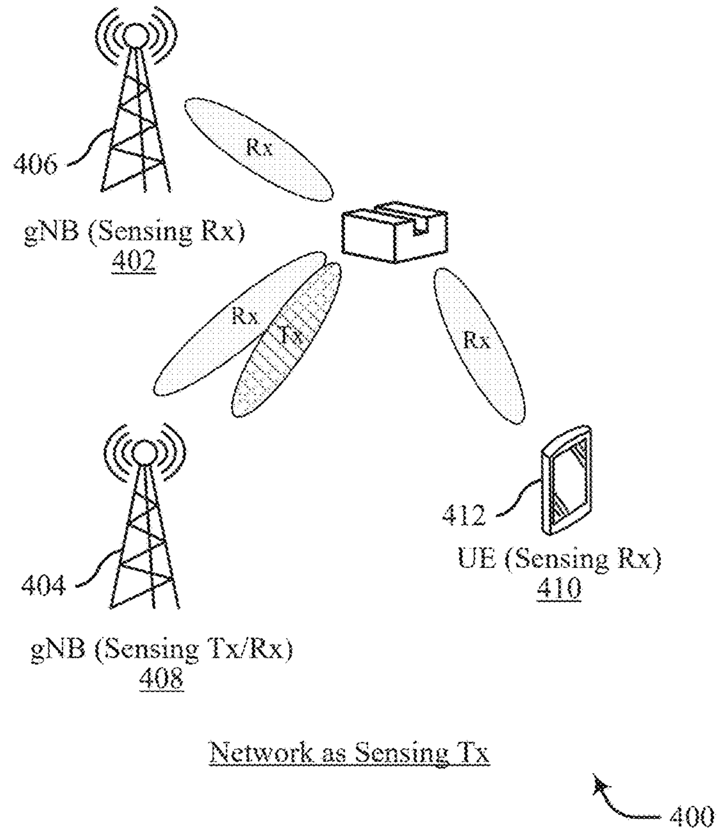
FIG. 4 illustrates an example of a network entity operational as a sensing transmitter (Tx) node for sensing scenarios as related to reporting differential measurement quantities for an antenna array, in accordance with aspects of the present disclosure.

FIG. 4 illustrates an example 400 of a network entity operational as a sensing Tx node for sensing scenarios as related to reporting differential measurement quantities for an antenna array, in accordance with aspects of the present disclosure. As shown in the example 400, a first scenario 402 includes sensing Tx at a network node 404 (e.g., a gNB) and sensing Rx at a separate network node 406 (e.g., a gNB). In this example, the sensing reference signal (or another reference signal used for sensing or the data/control channels known to the network transmit-receive point (TRP) nodes) is transmitted and received by the network entities. The involvement of UE nodes is limited to the aspects of interference management, when necessary, and the network does not utilize the UEs for sensing assistance in this scenario.

A second scenario 408 includes sensing Tx at the network node 404 (e.g., a gNB) and sensing Rx at the same network node 404. In this example, the sensing reference signal (or another reference signal used for sensing or the data/control channels known to the network TRP nodes) is transmitted and received by the same network entity. The involvement of the UE nodes is limited to the aspects of interference management, when necessary, and the network does not utilize the UEs for sensing assistance in this scenario. A third scenario 410 includes sensing Tx at a network node 404 (e.g., a gNB) and sensing Rx at a UE node 412. In this example, the sensing RS or other RS used for sensing is transmitted by a network entity and received by one or multiple UE nodes (e.g., UE node 412). The network configures the UEs to act as a sensing Rx node, according to the UE nodes capabilities for sensing, as well as a desired sensing task.

Figure 5:
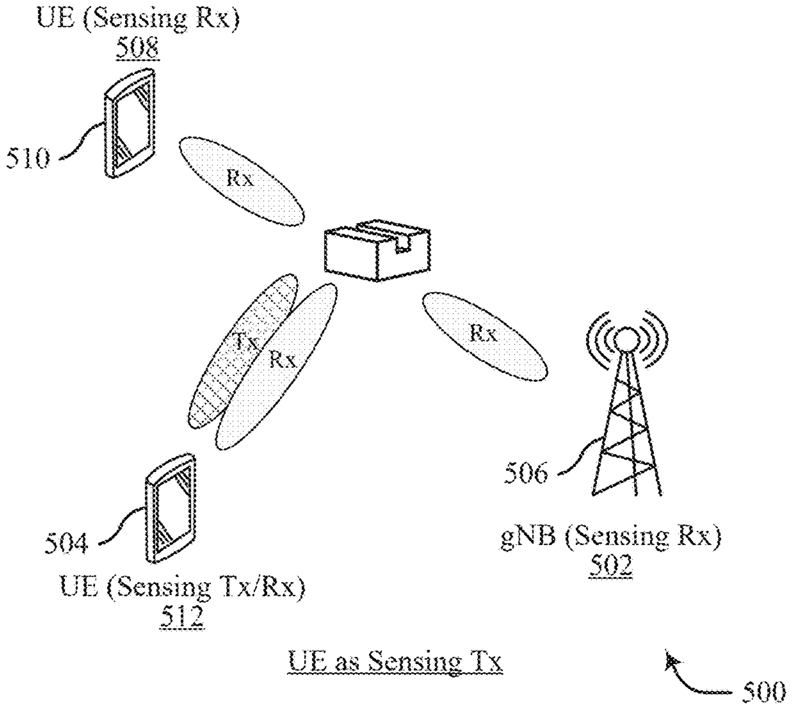
FIG. 5 illustrates an example of a UE operational as a sensing Tx node for sensing scenarios as related to reporting differential measurement quantities for an antenna array, in accordance with aspects of the present disclosure.

FIG. 5 illustrates an example 500 of a UE operational as a sensing Tx node for sensing scenarios as related to reporting differential measurement quantities for an antenna array, in accordance with aspects of the present disclosure. As shown in the example 500, a fourth scenario 502 includes sensing Tx at a UE (e.g., UE node 504) and sensing Rx as a network node 506 (e.g., a gNB). In this example, the sensing RS or other RS used for sensing (or a data/control channel transmitted by the UE node 504) is received by one or multiple network entities and transmitted by a UE node. The network configures the UE node 504 to operate as a sensing Tx node, according to the UE nodes capabilities for sensing, as well as the nature of the desired sensing task.

A fifth scenario 508 includes sensing Tx at the UE node 504 and sensing Rx at a separate UE node 510. In this example, the sensing RS or other RS used for sensing is received by one or multiple UE nodes and transmitted by a UE node. In this case, the network, or a UE node, can be implemented to determine a configuration of the sensing scenario. In one instance, the network configures the UEs to act as sensing Tx and/or sensing Rx nodes, according to the UE nodes capabilities for sensing, as well as the nature of the desired sensing task. A sixth scenario 512 includes sensing Tx at the UE node 504 and sensing Rx at the same UE node 504. In this example, the sensing RS (or another RS used for sensing or the data and/or control channels known to the UE) is transmitted by the UE node and received by the same UE node. In this case, the UE or the network configures the sensing scenario, according to the UE nodes capabilities for sensing, as well as the nature of the desired sensing task.

The above-described scenarios in examples 400 (of FIG. 4) and 500 are not intended to be restricted to a specific UE type, and may include any UE category and/or functionality (e.g., a UE, a road-side unit (RSU)). In any of the above scenarios, any of the roles depicted for a gNB and/or a UE may be replaced (with equal validity as an example of a radio sensing scenario) with a smart repeater node, an integrated access and backhaul (IAB) node, or an RSU.

With reference to a sensing network architecture, integrated sensing and communication can enhance the 5G core architecture by introducing a new sensing function (SF). Proposed architectures for enhancing the 5G core new introduce a SF as a dedicated or logical network function (NF).

Figure 6:
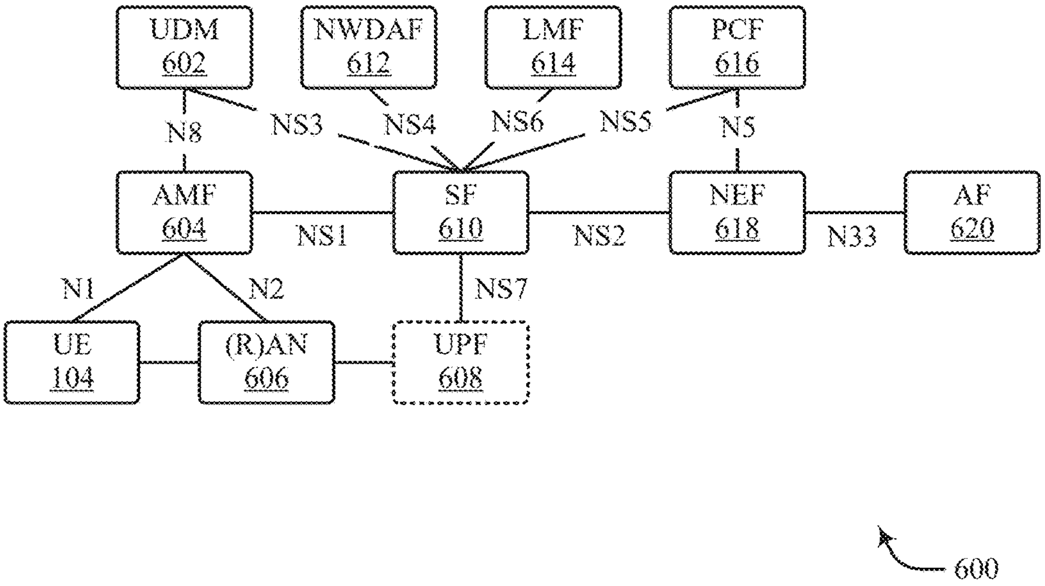
FIG. 6 illustrates a network architecture diagram for a tight coupling Integrated Sensing and Communications (ISAC) network, as related to reporting differential measurement quantities for an antenna array, in accordance with aspects of the present disclosure.

FIG. 6 illustrates a network architecture diagram 600 for a tight coupling ISAC network, as related to reporting differential measurement quantities for an antenna array, in accordance with aspects of the present disclosure. In some examples, the network architecture diagram 600 implements or is implemented by aspects of the wireless communications system 100. For example, the network architecture diagram 600 may implement or be implemented by one or more NEs and UEs, which may be examples of the corresponding devices and actions described herein.

The network architecture diagram 600 may include a unified data management (UDM) 502, which manages subscriber data and profiles. The UDM 602 may be connected to an access and mobility management function (AMF) 604 via an interface for subscriber data management and authentication procedures. The AMF 604 can perform access control and mobility management. An access network (AN) or radio AN (RAN) 606 provides a wireless interface between devices and the CN. For example, an interface may connect the RAN 606 to the AMF 604 and carry signaling related to radio resource management, mobility, and handover procedures. In some cases, the network architecture diagram 600 includes a UPF 608 to perform user data routing and forwarding. An interface between the RAN 606 and the UPF 608 may carry user plane data between the two entities.

For sensing operations, the network architecture diagram 600 may include one or more sensing entities. For example, the network architecture diagram 600 may include an SF 610, which may include an SF-control (SF-C) that manages sensing tasks and an SF-user plane (SF-U) that processes sensing data (e.g., performed by a single sensing entity). In some examples, the network architecture diagram 600 includes a network data analytics function (NWDAF) 612 to provide data analytics capabilities to the SF 610. Additionally, or alternatively, the SF 610 implements an LMF 614 to determine device locations. The network architecture diagram 600 may also include a policy control function (PCF) 616 to define and enforce network policies, a network exposure function (NEF) 618 to expose network capabilities to external applications, and an application function (AF) 620 to represent external applications that utilize network services. In some cases, the entities in the network architecture diagram 600 communicate via interfaces connecting the entities to enable integrated communication and sensing capabilities for devices in a wireless communications system (e.g., the wireless communications system 100).

In some cases, the entities in the network architecture diagram 600 may be arranged in a hierarchical structure, with the SF 610 serving as a central node connecting multiple other entities in the network architecture diagram 600. The UDM 602, the NWDAF 612, the LMF 614, and the PCF 616 may be directly connected to the SF 610, enabling data exchange and control flow between the UDM 602, the NWDAF 612, the LMF 614, and the PCF 616 and the SF

610. The AMF 604 may be connected to both the UDM 602 and the RAN 606, which may provide for management of access and mobility between the CN and RAN 606. The UPF 608 may be connected to both the RAN 606 and the SF 610 to manage user plane data for both communication and sensing functions.

In some cases, the SF 610 (e.g., the SF-C and/or the SF-U) may be a dedicated network function to handle sensing control plane procedures and sensing radio signals for performing analysis or prediction for determining targets. The control plane procedures can include, but is not limited to, interaction with a sensing consumer via a NEF 618 and information exchange with other network functions for gathering UE information, (e.g., from the AMF 604, UDM 602, LMF 614, UE related policies from the PCF 616, and analytics from the NWDAF 612). In some cases, the SF 610 may be collocated with the LMF 614, such that the sensing function is a logical network function embedded in the LMF 614 that performs wireless sensing using UE location information. In some other cases, the sensing function is independent of the 5G core (e.g., for local field scenarios or private networks). The sensing function may be close to the RAN 606 to collect and process the sensing radio signals locally and may interact with the 5G core for the purpose of exposure via a NEF 618 for sending the UE location from the AMF 604 and for analytics at the NWDAF 612.

With reference to a tight coupling ISAC network architecture (without a CP/UP split), the SF 610 appears as a dedicated NF handling both: (i) the sensing control plane aspects, such as the interaction with the sensing consumer via NEF 618 and information exchange with other NFs, for gathering UE information (i.e., from the AMF 604, UDM 602, LMF 614, UE related policies from the PCF 616, and analytics from the NWDAF 612; and (ii) the sensing radio signals for performing the analysis or prediction for determining the sensing target.

With reference to SF 610 collocated with the LMF 614 as described with reference to FIG. 8, this appears as a logical NF embedded in the LMF to perform sensing taking advantage of the knowledge of a UE location. For a loose coupling ISAC network architecture as described with reference to FIG. 9, the SF 610 is independent of the 5G core and typically used for local field scenarios or private networks, and the interaction with the 5G core is minimal. The main idea is to use the SF 610 close to the RAN 606, such as to collect and process the sensing radio signals locally, and interact with 5G core for the purpose of exposure via NEF 618, for getting the UE location from the AMF 604 and for analytics (the NWDAF 612).

In some examples, the SensMF is a sensing controller function that includes or is embedded into one or more of a UE, a RAN node, a gNB or gNB-CU, a logical entity residing in RAN (e.g. a sensing management component co-located with/embedded in a gNB, gNB-CU, or gNB-DU or independent from a gNB), an LMF, a sensing function, or any combination thereof. The SensMF may receive a request for sensing information from a service consumer (e.g., a requesting third party application). Additionally, or alternatively, the SensMF may determine a selection and/or a configuration of a sensing operation, including a configuration of one or more of a transmitting device (e.g., a sensing Tx node) and/or a receiving device (e.g., a sensing Rx node). Additionally, or alternatively, the SensMF may select and/or configure the involved devices (e.g., nodes) for sensing transmission, sensing reception, sensing measurement, and reporting of the conducted measurements. Additionally, or alternatively, the SensMF may collect the sensing measurements. Additionally, or alternatively, the SensMF may perform, configure, or request computation of the sensing measurements and determine the sensing information based on the obtained sensing measurements. Additionally, or alternatively, the SensMF may report (e.g., expose) obtained sensing information to the entity requesting the sensing information.

In some examples, if the SensMF includes multiple nodes (e.g., entities), then one or more of processes for sensing may be implemented by a node of the SensMF and one or more different processes may be implemented by additional nodes of the SensMF (e.g., implemented in the sensing function and a NE (gNB)). In some examples, if the SensMF includes multiple nodes and/or entities, then the communication among the SensMF entities are transparent to the outside entities, nevertheless, the communication among the SensMF entities are implicit to the overall procedure for sensing. In some examples, if a SensMF includes an SF 610 and an NE, such as a gNB (e.g., serving or head gNB of a related UE to the sensing task or a selected serving gNB for a sensing task), then the sensing function receives the request, collects the sensing measurements, performs, configures, or requests computation of the sensing measurements, and reports the sensing information. The gNB node determines the selection and/or configuration of the sensing operation and selects and/or configures the involved devices for sensing transmission and sensing reception. In some other examples, the sensing function and gNB jointly determine selection and/or configuration of the sensing operation and collect the sensing measurements, where a first part of the configuration or determination is performed by the sensing function and a second part of the configuration or determination is performed by the gNB. For example, the SF supports the serving gNB of a sensing task with some recommendations and the serving gNB will decide and configure the involved nodes, or the serving gNB of a sensing task supports the SF with some recommendations and the SF will decide or choose among the possible configurations. In other variations, the SensMF may be a RAN node (e.g., a selected gNB node acting as serving gNB of a sensing task), may be a sensing function residing in CN, may be a UE, or any combination thereof.

Figure 7:
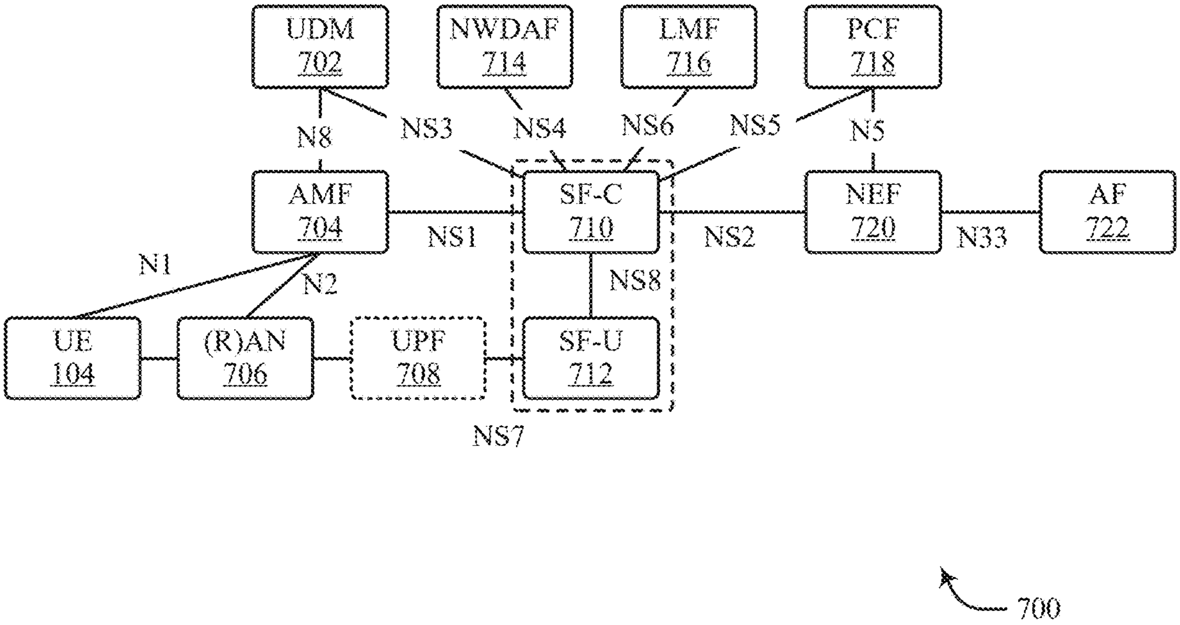
FIG. 7 illustrates a network architecture diagram for a tight coupling ISAC network with a control plane (CP)/user plane (UP) split, as related to reporting differential measurement quantities for an antenna array, in accordance with aspects of the present disclosure.

FIG. 7 illustrates a network architecture diagram 700 for a tight coupling ISAC network with a CP/UP split, as related to reporting differential measurement quantities for an antenna array, in accordance with aspects of the present disclosure. In some examples, the network architecture diagram 700 implements or is implemented by aspects of the wireless communications system 100. For example, the network architecture diagram 700 may implement or be implemented by one or more NEs and UEs, which may be examples of the corresponding devices and actions described herein.

Similarly to the network architecture diagram 600 of FIG. 6, the network architecture diagram 700 may include a UDM 702, which manages subscriber data and profiles. The UDM 702 may be connected to an AMF 704 via an interface for subscriber data management and authentication procedures. The AMF 704 can perform access control and mobility management. An AN or a RAN 706 provides a wireless interface between devices and the CN. For example, an interface may connect the RAN 706 to the AMF 704 and carry signaling related to radio resource management, mobility, and handover procedures. In some cases, the network architecture diagram 700 includes a UPF 708 to perform user data routing and forwarding. An interface between the RAN 706 and the UPF 708 may carry user plane data between the two entities.

For sensing operations, the network architecture diagram 700 may include one or more sensing entities. For example, the network architecture diagram 700 may include an SF-C 710 that manages sensing tasks and an SF-U 712 that processes sensing data. Additionally, or alternatively, the functions performed by the SF-C 710 and the SF-U 712 may be performed by a single sensing entity. In some examples, the network architecture diagram 700 includes an NWDAF 714 to provide data analytics capabilities to the SF-C 710. Additionally, or alternatively, the SF-C 710 implements an LMF 716 to determine device locations. The network architecture diagram 700 may also include a PCF 718 to define and enforce network policies, an NEF 720 to expose network capabilities to external applications, and an AF 722 to represent external applications that utilize network services. In some cases, the entities in the network architecture diagram 700 communicate via interfaces connecting the entities to enable integrated communication and sensing capabilities for devices in a wireless communications system (e.g., the wireless communications system 100).

In some cases, the entities in the network architecture diagram 700 may be arranged in a hierarchical structure, with the SF-C 710 serving as a central node connecting multiple other entities in the network architecture diagram 700. The UDM 702, the NWDAF 714, the LMF 716, and the PCF 718 may be directly connected to the SF-C 710, enabling data exchange and control flow between the UDM 702, the NWDAF 714, the LMF 716, and the PCF 718 and a sensing function. The AMF 704 may be connected to both the UDM 702 and the RAN 706, which may provide for management of access and mobility between the CN and RAN 706. The UPF 708 may be connected to both the RAN 706 and the SF-U 712 to manage user plane data for both communication and sensing functions.

In some cases, the sensing function (e.g., the SF-C 710 and/or the SF-U 712) may be a dedicated network function to handle sensing control plane procedures and sensing radio signals for performing analysis or prediction for determining targets. The control plane procedures can include, but is not limited to, interaction with a sensing consumer via a NEF 720 and information exchange with other network functions for gathering UE information, (e.g., from the AMF 704, UDM 702, LMF 716, UE related policies from the PCF 718, and analytics from the NWDAF 714). In some other cases, the sensing function may include two dedicated network functions, including the SF-C 710 and the SF-U 712. The SF-C 710 handles control plane procedures, while the SF-U 712 is responsible for collecting the sensing radio signals via the user plane (e.g., via the RAN 706 and UPF 708). Thus, the SF-C 710 and the SF-U 712 route (e.g., divide, split, offload) data volumes associated with sensing radio signals to the user plane to enable relatively lighter data traffic (e.g., singling) in the control plane. In some cases, the sensing function may be collocated with the LMF 716, such that the sensing function is a logical network function embedded in the LMF 716 that performs wireless sensing using UE location information. In some other cases, the sensing function is independent of the 7G core (e.g., for local field scenarios or private networks). The sensing function may be close to the RAN 706 to collect and process the sensing radio signals locally and may interact with the 7G core for the purpose of exposure via a NEF 720 for sending the UE location from the AMF 704 and for analytics at the NWDAF 714.

With reference to a tight coupling ISAC network architecture, the SF appears as a dedicated NF handling both: (i) the sensing control plane aspects, such as the interaction with the sensing consumer via NEF 720 and information exchange with other NFs, for gathering UE information (i.e., from the AMF 704, UDM 702, LMF 716, UE related policies from the PCF 718, and analytics from the NWDAF 714; and (ii) the sensing radio signals for performing the analysis or prediction for determining the sensing target. With reference to a tight coupling ISAC network architecture with CP/UP split, the SF has two dedicated NF counter parts: (i) the SF-C 710 that handles the control plane aspects as described above and (ii) the SF-U 712 that is responsible for collecting the sensing radio signals via the user plane (i.e., via the RAN 706 and UPF 708). The idea of this architecture is to split and offload heavy data volumes associated with sensing radio signals to the user plane to ensure light traffic (i.e., only signaling in the control plane).

With reference to SF collocated with the LMF 716, this appears as a logical NF embedded in the LMF to perform sensing taking advantage of the knowledge of a UE location. For a loose coupling ISAC network architecture, the SF is independent of the 7G core and typically used for local field scenarios or private networks, and the interaction with the 7G core is minimal. The main idea is to use SF close to the RAN 706, such as to collect and process the sensing radio signals locally, and interact with 7G core for the purpose of exposure via NEF 720, for getting the UE location from the AMF 704 and for analytics (the NWDAF 714).

Figure 8:
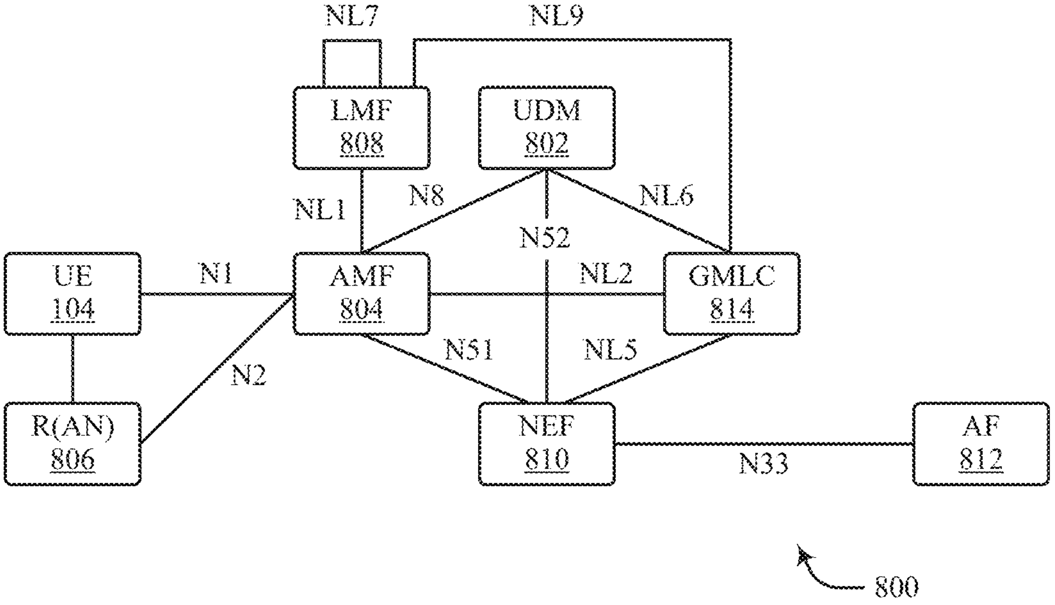
FIG. 8 illustrates a network architecture diagram where a sensing function (SF) is collocated with a Location Management Function (LMF), as related to reporting differential measurement quantities for an antenna array, in accordance with aspects of the present disclosure.

FIG. 8 illustrates a network architecture diagram 800 where an SF is collocated with an LMF, as related to reporting differential measurement quantities for an antenna array, in accordance with aspects of the present disclosure. In some examples, the network architecture diagram 800 implements or is implemented by aspects of the wireless communications system 100. For example, the network architecture diagram 800 may implement or be implemented by one or more NEs and UEs, which may be examples of the corresponding devices and actions described herein.

The network architecture diagram 800 may include a UDM 802, which manages subscriber data and profiles. The UDM 802 may be connected to an AMF 804 via an interface for subscriber data management and authentication procedures. The AMF 804 can perform access control and mobility management. An AN or a RAN 806 provides a wireless interface between devices and the CN. For example, an interface may connect the RAN 806 to the AMF 804 and carry signaling related to radio resource management, mobility, and handover procedures.

For sensing operations, the network architecture diagram 800 may include one or more sensing entities. For example, the network architecture diagram 800 may include an SF, which may include an SF-C manages sensing tasks and an SF-U that processes sensing data (e.g., performed by a single sensing entity). In some examples, the SF implements an LMF 808 to determine device locations. The network architecture diagram 800 may also include an NEF 810 to expose network capabilities to external applications, and an AF 812 to represent external applications that utilize network services. In some examples, the network architecture diagram 800 may also include a gateway mobile location center (GMCL) 814 to locate mobile devices that are connected to a mobile operator at any time. In some cases, the entities in the network architecture diagram 800 communicate via interfaces connecting the entities to enable integrated communication and sensing capabilities for devices in a wireless communications system (e.g., the wireless communications system 100).

As described in the network architecture diagram 800, the SF may be collocated with the LMF 808, such that the sensing function is a logical network function embedded in the LMF 808 that performs wireless sensing using UE location information. With reference to SF collocated with the LMF 808, this appears as a logical NF embedded in the LMF to perform sensing taking advantage of the knowledge of a UE location.

Figure 9:
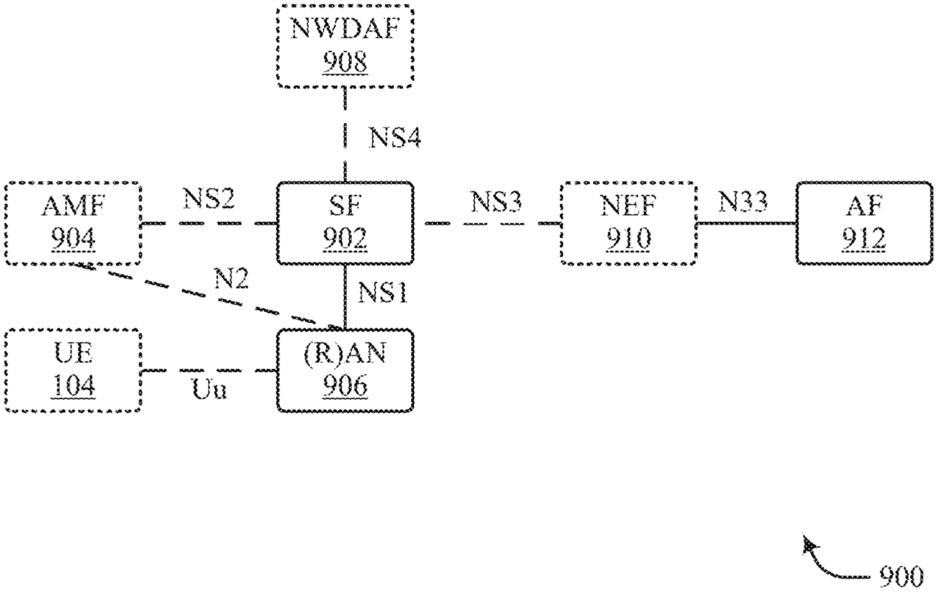
FIG. 9 illustrates a network architecture diagram for a loose coupling ISAC network architecture, as related to reporting differential measurement quantities for an antenna array, in accordance with aspects of the present disclosure.

FIG. 9 illustrates a network architecture diagram 900 for a loose coupling ISAC network architecture, as related to reporting differential measurement quantities for an antenna array, in accordance with aspects of the present disclosure. In some examples, the network architecture diagram 900 implements or is implemented by aspects of the wireless communications system 100. For example, the network architecture diagram 900 may implement or be implemented by one or more NEs and UEs, which may be examples of the corresponding devices and actions described herein.

The network architecture diagram 900 may include AMF 904 for subscriber data management and authentication procedures. The AMF 904 can perform access control and mobility management. An AN or a RAN 906 provides a wireless interface between devices and the CN. For example, an interface may connect the RAN 906 to the AMF 904 and carry signaling related to radio resource management, mobility, and handover procedures.

For sensing operations, the network architecture diagram 900 may include one or more sensing entities. For example, the network architecture diagram 900 may include an SF 902, which may include an SF-C that manages sensing tasks and an SF-U that processes sensing data (e.g., performed by a single sensing entity). In some examples, the network architecture diagram 900 includes an NWDAF 908 to provide data analytics capabilities to the SF 902. The network architecture diagram 900 may also include an NEF 910 to expose network capabilities to external applications, and an AF 912 to represent external applications that utilize network services. In some cases, the entities in the network architecture diagram 900 communicate via interfaces connecting the entities to enable integrated communication and sensing capabilities for devices in a wireless communications system (e.g., the wireless communications system 100).

For a loose coupling ISAC network architecture as in the network architecture diagram 900, the SF 902 is independent of the 5G core (e.g., for local field scenarios or private networks). The SF 902 may be close to the RAN 906 to collect and process the sensing radio signals locally and may interact with the 5G core for the purpose of exposure via a NEF 910 for sending the UE location from the AMF 904 and for analytics at the NWDAF 908. For a loose coupling ISAC network architecture, the SF 902 is typically used for local field scenarios or private networks, and the interaction with the 5G core is minimal.

With respect to NG-RAN measurement capabilities, the following indicates at least some types of measurements which may be relevant considering variations across a large array for sensing paths.

A secondary synchronization signal (SSS) transmit power:

| | |
|---|---|
| Definition | SSS transmit power is determined as the linear average over the power contributions (in 16) of the resource elements that carry secondary synchronization signals within the SSS bandwidth.<br>For downlink reference signal transmit power determination the secondary synchronization signal can be used.<br>For frequency range 1, the reference point for the downlink reference signal power measurement shall be the transmit antenna connector. |

An uplink (UL) relative time of arrival (TUL-RTOA):

| | |
|---|---|
| Definition | The UL Relative Time of Arrival (TUL-RTOA) is the beginning of subframe i containing SRS received in Reception Point (RP) j, relative to the RTOA Reference Time.<br>The UL RTOA reference time is defined as T_0+t_SRS, where<br>T_0 is the nominal beginning time of SFN 0 provided by SFN Initialization Time<br>t_SRS=(10n_f+n_sf )×10^(−3), where n_f and n_sf are the system frame number and the subframe number of the SRS, respectively.<br>Multiple SRS resources can be used to determine the beginning of one subframe containing SRS received at an RP.<br>The reference point for TUL-RTOA shall be:<br>for type 1-C base station: the Rx antenna connector,<br>for type 1-O or 2-O base station: the Rx antenna (i.e. the centre location of the radiating region of the Rx antenna),<br>for type 1-H base station: the Rx Transceiver Array Boundary connector. |

A gNB Rx-Tx time difference:

| | |
|---|---|
| Definition | The gNB Rx − Tx time difference is defined as TgNB-RX − TgNB-TX<br>Where:<br>TgNB-RX is the Transmission and Reception Point (TRP) received timing of uplink subframe #i containing SRS associated with UE, defined by the first detected path in time. |

-continued

| | |
|---|---|
| | TgNB-TX is the TRP transmit timing of downlink subframe #j that is closest in time to the subframe #i received from the UE.<br>Multiple SRS resources can be used to determine the start of one subframe containing SRS.<br>The reference point for TgNB-RX shall be:<br>for type 1-C base station: the Rx antenna connector,<br>for type 1-O or 2-O base station: the Rx antenna (i.e. the centre location of the radiating region of the Rx antenna),<br>for type 1-H base station: the Rx Transceiver Array Boundary connector.<br>The reference point for TgNB-TX shall be:<br>for type 1-C base station: the Tx antenna connector,<br>for type 1-O or 2-O base station: the Tx antenna (i.e. the centre location of the radiating region of the Tx antenna),<br>for type 1-H base station: the Tx Transceiver Array Boundary connector.<br>In NTN, the gNB Rx − Tx time difference at the uplink time synchronization reference point is reported. |

An uplink AoA (UL AoA):

| | |
|---|---|
| Definition | UL Angle of Arrival (UL AoA) is defined as the estimated azimuth angle (A-AoA) and vertical angle (Z-AoA) of a UE with respect to a reference direction, wherein the reference direction is defined:<br>In the global coordinate system (GCS), wherein estimated azimuth angle is measured relative to geographical North and is positive in a counter-clockwise direction and estimated vertical angle is measured relative to zenith and positive to horizontal direction.<br>In the local coordinate system (LCS), wherein estimated azimuth angle is measured relative to x-axis of LCS and positive in a counter-clockwise direction and estimated vertical angle is measured relative to z-axis of LCS and positive to x-y plane direction. The bearing, downtilt and slant angles of LCS are defined.<br>The UL-AoA is determined at the gNB antenna for an UL channel corresponding to this UE. |

An uplink SRS reference signal received power (UL SRS-RSRP):

| | |
|---|---|
| Definition | UL SRS reference signal received power (UL SRS-RSRP) is defined as linear average of the power contributions (in 16) of the resource elements carrying sounding reference signals (SRS). UL SRS RSRP shall be measured over the configured resource elements within the considered measurement frequency bandwidth in the configured measurement time occasions.<br>The reference point for UL SRS-RSRP shall be:<br>for type 1-C base station: the Rx antenna connector,<br>for type 1-O or 2-O base station: based on the combined signal from antenna elements corresponding to a given receiver branch,<br>for type 1-H base station: the Rx Transceiver Array Boundary connector.<br>For frequency range 1 and 2, if receiver diversity is in use by the gNB, the reported UL SRS-RSRP value shall not be lower than the corresponding UL SRS-RSRP of any of the individual receiver branches. |

An uplink SRS reference signal received path power (UL SRS-RSRPP):

| | |
|---|---|
| Definition | UL SRS reference signal received path power (UL SRS-RSRPP) is defined as the power of the linear average of the channel response at the i-th path delay of the resource elements that carry the received UL SRS signal configured for the measurement, where UL SRS-RSRPP for 1st path delay is the power contribution corresponding to the first detected path in time<br>The reference point for UL SRS-RSRPP shall be:<br>for type 1-C base station: the Rx antenna connector,<br>for type 1-O or 2-O base station: based on the combined signal from antenna elements corresponding to a given receiver branch<br>for type 1-H base station: the Rx Transceiver Array Boundary connector. |

-continued

| | |
|---|---|
| | For frequency range 1 and 2, if receiver diversity is in use by the gNB for UL SRS-RSRPP measurements: The reported UL SRS-RSRPP value for the first and additional paths shall be provided for the same receiver branch(es) as applied for UL SRS-RSRP measurements, or The reported UL SRS-RSRPP value for the first path shall not be lower than the corresponding UL SRS-RSRPP for the first path of any of the individual receiver branches and the reported UL SRS-RSRPP for the additional paths shall be provided for the same receiver branch(es) as applied UL SRS-RSRPP for the first path. |

A downlink PRS reference signal received path power (DL SRS-RSRPP) (e.g., for CSI-RS, i-th path and an associated per-reference signal delay, Doppler, or angle of the path):

| | |
|---|---|
| Definition | DL PRS reference signal received path power (DL PRS-RSRPP), is defined as the power of the linear average of the channel response at the i-th path delay of the resource elements that carry DL PRS signal configured for the measurement, where DL PRS-RSRPP for the 1st path delay is the power contribution corresponding to the first detected path in time. For frequency range 1, the reference point for the DL PRS-RSRPP shall be the antenna connector of the UE. For frequency range 2, DL PRS-RSRPP shall be measured based on the combined signal from antenna elements corresponding to a given receiver branch. |
| Applicable for | RRC_CONNECTED, RRC_INACTIVE |

A timing advance ($T_{ADV}$):

| | |
|---|---|
| Definition | Timing advance (TADV) is defined as the time difference TADV = (TgNB-RX − TgNB-TX), Where: TgNB-RX is the Transmission and Reception Point (TRP) received timing of uplink subframe #i containing PRACH transmitted from UE, defined by the first detected path in time. TgNB-TX is the TRP transmit timing of downlink subframe #j that is closest in time to the subframe #i received from the UE. The detected PRACH is used to determine the start of one subframe containing that PRACH. The reference point for TgNB-RX shall be: for type 1-C base station: the Rx antenna connector, for type 1-O or 2-O base station: the Rx antenna (i.e. the centre location of the radiating region of the Rx antenna), for type 1-H base station: the Rx Transceiver Array Boundary connector. The reference point for TgNB-TX shall be: for type 1-C base station: the Tx antenna connector, for type 1-O or 2-O base station: the Tx antenna (i.e. the centre location of the radiating region of the Tx antenna), for type 1-H base station: the Tx Transceiver Array Boundary connector. |

A uplink reference signal carrier phase (UL RSCP):

| | |
|---|---|
| Definition | UL reference signal carrier phase (RSCP) is defined as the phase of the channel response at the 1st path delay derived from the resource elements carrying sounding reference signals (SRS) configured for the measurement. UL RSCP is associated with the center frequency of the transmission bandwidth of the SRS for positioning purposes configured for the measurement. The reference point for UL RSCP shall be: for type 1-C base station: the Rx antenna connector, for type 1-O or 2-O base station: the Rx antenna (i.e., the centre location of the radiating region of the Rx antenna), for type 1-H base station: the Rx Transceiver Array Boundary connector. |

With respect to NRPPa support for path reporting, the following indicates at least some types of information elements (IEs) included in the path reporting.

An allocation and retention priority (ARP) identifier (ID) information element (IE), which is used to uniquely identify an ARP associated with a TRP:

| IE/Group Name | Presence | Range | IE Type and Reference | Semantics Description |
|---|---|---|---|---|
| ARP identifier | M | | INTEGER (1 . . . 16, . . . ) | |

An ARP location information IE, which indicates the relative position of ARP(s) to the TRP:

| IE/Group Name | Presence | Range | IE Type and Reference | Semantics Description |
|---|---|---|---|---|
| ARP Location Information | | 1 | | |
| >ARP Location Information Item | | 1 . . . <maxnoARPs> | | |
| >>ARP ID | M | | 9.2.75 | |
| >>CHOICE ARP Location Type | M | | | |
| >>>geodetic | | | | |
| >>>>ARP Position Relative Geodetic | M | | Relative Geodetic Location 9.2.48 | |
| >>>cartesian | | | | |
| >>>>ARP Position Relative Cartesian | M | | Relative Cartesian Location 9.2.50 | |

| Range Bound | Explanation |
|---|---|
| maxnoARPs | Maximum no. of ARPs associated with a TRP. Value is 16. |

A TRP measurement result IT, which include the measurement result:

| IE/Group Name | Presence | Range | IE Type and Reference | Semantics Description | Criticality | Assigned Criticality |
|---|---|---|---|---|---|---|
| Measured Result Item | | 1 . . . <maxnoPosMeas> | | | | |
| >CHOICE Measured Results Value | M | | | | | |
| >>UL Angle of Arrival | M | | 9.2.38 | | — | |
| >>UL SRS-RSRP | M | | INTEGER (0 . . . 126) | | — | |
| >>UL RTOA | M | | 9.2.39 | | — | |
| >>gNB Rx-Tx Time Difference | M | | 9.2.40 | | — | |
| >>Z-AoA | M | | 9.2.67 | | YES | reject |
| >>Multiple UL-AoA | M | | 9.2.71 | | YES | reject |
| >>UL SRS-RSRPP | M | | 9.2.72 | | YES | reject |
| >Time Stamp | M | | 9.2.42 | | | |
| >Measurement Quality | O | | 9.2.43 | | — | |
| >Measurement Beam Information | O | | 9.2.57 | | — | |
| >SRS Resource type | O | | 9.2.73 | | YES | ignore |
| >ARP ID | O | | 9.2.75 | | YES | ignore |
| >LoS/NLOS Information | O | | 9.2.77 | | YES | ignore |

A TRP ID IE, which may be used to identify a TRP uniquely within an NG-RAN node:

| IE/Group Name | Presence | Range | IE Type and Reference | Semantics Description |
|---|---|---|---|---|
| TRP identifier | M | | INTEGER (1 . . . 65535, . . . ) | Identifies a TRP within an NG-RAN node |

A TRP information IE, which includes information for a TRP within an NG-RAN node:

| IE/Group Name | Presence | Range | IE Type and Reference | Semantics Description | Criticality | Assigned Criticality |
|---|---|---|---|---|---|---|
| TRP ID | M | | 9.2.24 | | — | |
| TRP Information Type | | 1 . . . <maxnoTRPInfoTypes> | | | — | |
| >CHOICE TRP Information Item | M | | | | — | |
| >>NR PCI | M | | INTEGER (0 . . . 1007) | NR Physical Cell ID | — | |
| >>NR CGI | M | | 9.2.9 | | — | |
| >>NR ARFCN | M | | INTEGER (0 . . . 3279165) | | — | |
| >>PRS Configuration | M | | 9.2.44 | | — | |
| >>SSB Information | M | | 9.2.54 | | — | |
| >>SFN Initialisation Time | M | | Relative Time 1900 9.2.36 | | — | |
| >>Spatial Direction Information | M | | 9.2.45 | | | |
| >>Geographical !Coordinates | M | | 9.2.46 | | — | |
| >>TRP type | M | | ENUMERA TED (prs-only-tp, srs-only-rp, tp, rp, trp . . . ) | TS 38.305 [18] | YES | reject |
| >>On-demand PRS TRP Information | M | | 9.2.65 | | YES | reject |
| >>TRP Tx TEG Association | M | | 9.2.79 | | YES | reject |
| >>TRP Beam Antenna Information | M | | 9.2.82 | | YES | reject |

| Range Bound | Explanation |
|---|---|
| maxnoTRPInfoTypes | Maximum no. of TRP information types that can be requested and reported with one message. Value is 64. |

An UL RTOA measurement IE, which may include an uplink RTOA measurement:

| IE/Group Name | Presence | Range | IE Type and Reference | Semantics Description | Criticality | Assigned Criticality |
|---|---|---|---|---|---|---|
| CHOICE UL RTOA Measurement | M | | | | — | |
| >k0 | M | | INTEGER (0 . . . 1970049) | | — | |

-continued

| IE/Group Name | Presence | Range | IE Type and Reference | Semantics Description | Criticality | Assigned Criticality |
|---|---|---|---|---|---|---|
| >k1 | M | | INTEGER (0 . . . 985025) | | — | |
| >k2 | M | | INTEGER (0 . . . 492513) | | — | |
| >k3 | M | | INTEGER (0 . . . 246257) | | — | |
| >k4 | M | | INTEGER (0 . . . 123129) | | — | |
| >k5 | M | | INTEGER (0 . . . 61565) | | — | |
| Additional Path List | O | | 9.2.41 | This IE is ignored if the Extended Additional Path List IE is included | — | |
| Extended Additional Path List | O | | 9.2.74 | | YES | ignore |
| TRP Rx TEG ID | O | | INTEGER (0 . . . 31) | | YES | ignore |
| TRP Rx Timing Error Margin | O | | Timing Error Margin 9.2.84 | Timing error margin associated to the TRP Rx TEG ID. | YES | ignore |

A gNB Rx-Tx time difference IE, which may include a gNB Rx-Tx time difference measurement:

| IE/Group Name | Presence | Range | IE Type and Reference | Semantics Description | Criticality | Assigned Criticality |
|---|---|---|---|---|---|---|
| CHOICE gNB Rx-Tx Time Difference Measurement | M | | | | | |
| >k0 | M | | INTEGER (0 . . . 1970049) | | — | |
| >k1 | M | | INTEGER (0 . . . 985025) | | — | |
| >k2 | M | | INTEGER (0 . . . 492513) | | — | |
| >k3 | M | | INTEGER (0 . . . 246257) | | — | |
| >k4 | M | | INTEGER (0 . . . 123129) | | — | |
| >k5 | M | | INTEGER (0 . . . 61565) | | — | |
| Additional Path List | O | | 9.2.41 | This IE is ignored if the Extended Additional Path List IE is included | — | |
| Extended Additional Path List | O | | 9.2.74 | | YES | ignore |
| TRP TEG ID Information | O | | 9.2.80 | | YES | ignore |

An additional path list IE, which may include additional path results of a time measurement:

| IE/Group Name | Presence | Range | IE Type and Reference | Semantics Description | Criticality | Assigned Criticality |
|---|---|---|---|---|---|---|
| Additional Path Item | | 1 . . . <max nopath> | | | — | |
| >CHOICE Relative Path Delay | M | | | | — | |
| >>k0 | M | | INTEGER (0 . . . 16351) | | — | |
| >>k1 | M | | INTEGER (0 . . . 8176) | | — | |
| >>k2 | M | | INTEGER (0 . . . 4088) | | — | |
| >>k3 | M | | INTEGER (0 . . . 2044) | | — | |
| >>k4 | M | | INTEGER (0 . . . 1022) | | — | |
| >>k5 | M | | INTEGER (0 . . . 511) | | — | |
| >Path Quality | O | | Measurement Quality 9.2.43 | | — | |
| >Multiple UL-AoA | O | | 9.2.71 | | YES | ignore |
| >Path Power | O | | UL SRS-RSRPP 9.2.72 | | YES | ignore |

| Range Bound | Explanation |
|---|---|
| Maxnopath | Maximum no. of additional path measurement. Value is 2. |

A time stamp IE, which may include a time stamp:

| IE/Group Name | Presence | Range | IE Type and Reference | Semantics Description |
|---|---|---|---|---|
| System Frame Number | M | | INTEGER (0 . . . 1023) | |
| CHOICE Slot Index | M | | | |
| >SCS-15 | M | | INTEGER(0 . . . 9) | |
| >SCS-30 | M | | INTEGER(0 . . . 19) | |
| >SCS-60 | M | | INTEGER(0 . . . 39) | |
| >SCS-120 | M | | INTEGER(0 . . . 79) | |
| Measurement time | O | | Relative Time 1900 9.2.36 | |

In aspects of this disclosure, near-field propagation and spatial non-stationarity are taken into consideration. For a near-field channel, the following formula is adopted to model the angular domain parameters of direct path between TRP and UE as antenna element-wise channel parameter:

$$\begin{bmatrix} F_{rx,u,\theta}(\theta_{LOS,ZOA,u,s},\ \phi_{LOS,AOA,u,s}) \\ F_{rx,u,\phi}(\theta_{LOS,ZOA,u,s},\ \phi_{LOS,AOA,u,s}) \end{bmatrix}^T \begin{bmatrix} 1 & 0 \\ 0 & -1 \end{bmatrix} \begin{bmatrix} F_{tx,s,\theta}(\theta_{LOS,ZOD,u,s},\ \phi_{LOS,AOD,u,s}) \\ F_{tx,s,\phi}(\theta_{LOD,ZOD,u,s},\ \phi_{LOS,AOD,u,s}) \end{bmatrix}$$

where $\theta_{LOS,ZOA,u,s}$>$\phi_{LOS,AOA,u,s}$, $\theta_{LOS,ZOD,u,s}$, and $\phi_{LOS,AOD,u,s}$ are the respective antenna element-wise elevation arrival angles, azimuth arrival angles, elevation departure angles and azimuth departure angles of LoS path between the transmit antenna element s and receive antenna element u. This may be used for per-antenna angle modeling.

At the side of a large array, a blockage model may be used for modeling a partial blockage (e.g., physical blocker may be the same as the target). In such cases, for the modelling of spatial non-stationarity at the base station side, if physical blocker-based approach is adopted, the nearest K blockers from the base station are selected. For the modelling of spatial non-stationarity at the base station side, if the physical blocker-based approach is adopted, at least for blockage model B, the following parameters define the building edge:

| | Typical set of blockers | Blocker dimensions | Mobility pattern |
|---|---|---|---|
| Outdoor | Building edge | Cartesian: w = 50 m; h = 20 m | Stationary |

In the blockage model B, the following equation is used to calculate the attenuation caused by the building edge: $L_{dB}$=20 $\log_{10}$(0.5−F), where F represents one of $F_{h_1}$, $F_{h_2}$, $F_{v_1}$, and $F_{v_2}$ as defined.

For the modelling of spatial non-stationarity at the UE side mainly due to close proximity, if blocker-based approach is adopted, the Option-3 is supported with following details. Three typical cases are introduced: one hand grip, dual hand grip, head and one hand grip (with a probability of each case in the simulation for future study); For each case, to model the attenuation for each of antenna in the candidate antenna location defined in the UE antenna model for handheld device with one of following alternatives: introducing a fixed value for each candidate antenna position per case, or introducing a distribution for candidate antenna position (with distribution per antenna position(s) and per case for future study).

For the modelling of spatial non-stationarity at the base station side, if physical blocker-based approach is adopted, the rotation and power variation calculation are conducted in ray level. For near-field channel, for the non-direct paths, the distance between the base station and the first point associated with cluster is generated with one of following options to be selected. Option 1: The distance $d_1$ is generated directly following a specific distribution. For the $k_1$ clusters, $d_1$=speed of light times the absolute delay of the cluster. For other $k_2$ clusters, the distance $d_1$ is equal or less than the speed of light times the absolute delay of the cluster and generated following a specific distribution (with the specific distribution, e.g., log-normal distribution for UMi, and the values of $k_1$ and $k_2$ for future study). The generation of absolute delay of the cluster is according to some defined procedures (where the value for UMi, UMa, and InH-Office are for future study). Option 2: The distance $d_1$ is generated by a scaling factor multiplied by the absolute distance corresponding to the absolute delay of the cluster, where the scaling factor is generated from a specific distribution. For the $k_1$ clusters, $d_1$=speed of light times the absolute delay of the cluster (i.e., the scaling factor is 1). For other $k_2$ clusters, the distance $d_1$ is equal to less than the speed of light times the absolute delay of the cluster and the scaling factor generated following a specific distribution (i.e., the scaling factor is equal or less than 1) (with the distribution of the scaling factor, e.g., Beta distribution for UMa, is for future study).

In aspects of this disclosure, the spatial non-stationarity characteristics at UE side (e.g., due to the impact of hand(s) and/or head), i.e., the antenna element-wise power variation, is supported in the channel modelling in with potential updates. For near-field channel, if necessary, to model the following antenna element-wise channel parameters of direct path between TRP and UE, angular domain parameters, Doppler shift, and delay, with Option 2 "Determined by the antenna element locations of both TRP and UE." Angular domain parameters can be optionally modeled. For the modeling of spatial non-stationarity, if the physical blocker-based approach is adopted, at least for blockage model B, the following new blocker type/size can be introduced:

| | Typical set of blockers | Blocker dimensions | Mobility pattern |
|---|---|---|---|
| Outdoor | Billboard | Cartesian: w = 2.4 m; h = 3.6 m | Stationary |
| Outdoor | Street lamp | Cartesian: w = 0.4 m; h = 0.8 m | Stationary |
| Outdoor | Building edge | Cartesian: w = X m; h = Y m | Stationary |
| Indoor | Pillar | Cartesian: w = 0.3 m; h = 3 m | Stationary |

Future studies include the value of X and Y for the blocker dimensions of building edge, and the details related to the user hand/head, including:

| | | | |
|---|---|---|---|
| Indoor; Outdoor | FFS: User hand | Cartesian: w = [0.2] m; h = [0.1] m | Stationary |
| Indoor; Outdoor | FFS: User head | Cartesian: w = [0.24] m; h = [0.20] m | Stationary |

Future studies also include the details of blockage model B to implement the impact of user hand and head, and the location of the user hand and head.

Regarding options for modeling of blocker effect from the UE side due to proximity, for the modelling of spatial non-stationarity at the base station side, if physical blocker-based approach is adopted, for blockage model B, the procedure to determine the number of blockers and locations are same as existing blockage model B. For the modelling of spatial non-stationarity at the UE side, if blocker-based approach is adopted, an attenuation per antenna element is introduced, the following options can be considered with down-selection. Option 1: generated by leveraging the existing blockage Model-B with potential updates, including at most two hand type blockers and one head type blocker for a specific UE is assumed; Option 2: generated by leveraging the existing blockage Model-A with potential updates; Option 3: generated by a distribution or a fixed value due to the hand grip and/or head proximity (with the details regarding how to determine the value of loss for the case of one hand grip, a dual hand grip, and/or head proximity are for future study).

Previous agreements are updated, including for the assumption on the aperture size of antenna array, where the following is considered for near-field and spatial non-stationarity channel model study, e.g., simulation/measurement and calibration: Up to 1.5 m for UMa with maximum antenna elements in the array is 5 k for single Polarization; Up to 1 m for UMi with maximum antenna elements in the array is 2.22 k for single Polarization; Up to 0.71 m for Indoor factory with maximum antenna elements in the array is 1.12 k for single Polarization; and Up to 0.25 (for rectangular antenna array), 0.5 (for linear antenna array) m for Indoor office with maximum antenna elements in the array is 256, 80 for single Polarization, respectively.

For the near-field channel modeling, no changes are expected on both value and parameter generation procedure of at least following large-scale parameters including: pathloss model, SF, and LOS probability (with DS, ASA, ASD, ZSA, ZSD, and K factor for future study). The spatial non-stationarity characteristics, i.e., the antenna element-wise power variation at least at the base station side, is supported in the channel modelling (with the antenna element-wise power variation and the UE side and the causes and details of methodology for modeling the spatial non-stationarity characteristics are for future study). For near-field channels, the following formula is adopted to model the phase of direct path between TRP and UE as antenna element-wise channel parameter:

$$\exp\left(-j2\pi\frac{d_{3D}}{\lambda_0}\right)\exp\left(-j2\pi\frac{|\vec{r}_{u,s}|d_{3D}}{\lambda_0}\right),$$

where $\vec{r}_{u,s}$ refers to the vector determined by the location of antenna element u and s. The $d_{3D}$ refers to the three-dimensional (3D) distance between reference antenna at TRP and UE side.

To align the understanding of the terminology for channel model study, the following equations are considered for reference. For a non-direct path:

$$H_{u,s,n,m}^{NLOS}(t) = \sqrt{\frac{P_n}{M}}\begin{bmatrix} F_{rx,u,\theta}(\theta_{LOS,ZOA},\ \phi_{LOS,AOA}) \\ F_{rx,u,\phi}(\theta_{LOS,ZOA},\ \phi_{LOS,AOA}) \end{bmatrix}^{\tau} \begin{bmatrix} \exp\left(j\phi_{n,m}^{\theta\theta}\right) & \sqrt{\kappa_{nm}^{-1}\exp\left(j\phi_{n,m}^{\theta\phi}\right)} \\ \sqrt{\kappa_{n,m}^{-1}\exp\left(j\phi_{n,m}^{\phi\theta}\right)} & \exp\left(j\phi_{n,m}^{\phi\phi}\right) \end{bmatrix} \begin{bmatrix} F_{tx,s,\theta}(\theta_{LOS,ZOD},\ \phi_{LOS,AOD}) \\ F_{tx,s,\phi}(\theta_{LOS,ZOD},\ \phi_{LOS,AOD}) \end{bmatrix} \exp\left(j2\pi\frac{\hat{r}_{rx,n,m}^{T}\cdot\bar{d}_{rx,u}}{\lambda_0}\right)\exp\left(j2\pi\frac{\hat{r}_{tx,n,m}^{T}\cdot\bar{d}_{tx,s}}{\lambda_0}\right)\exp\left(j2\pi\frac{\hat{r}_{rx,n,m}^{T}\cdot\bar{v}}{\lambda_0}t\right),$$

where $$\sqrt{\frac{P_n}{M}}$$

represents an impact of amplitude, $$\begin{bmatrix} F_{rx,u,\theta}(\theta_{LOS,ZOA}, \phi_{LOS,AOA}) \\ F_{rx,u,\phi}(\theta_{LOS,ZOA}, \phi_{LOS,AOA}) \end{bmatrix}^T \text{ and } \begin{bmatrix} F_{tx,s,\theta}(\theta_{LOS,ZOD}, \phi_{LOS,AOD}) \\ F_{tx,s,\phi}(\theta_{LOS,ZOD}, \phi_{LOS,AOD}) \end{bmatrix}$$

represent the impact of angular domain parameters, $$\begin{bmatrix} \exp(j\phi_{n,m}^{\phi\phi}) & \sqrt{\kappa_{n,m}^{-1}}\exp(j\phi_{n,m}^{\theta\phi}) \\ \sqrt{\kappa_{n,m}^{-1}}\exp(j\phi_{n,m}^{\phi\theta}) & \exp(j\phi_{n,m}^{\phi\phi}) \end{bmatrix}$$

represents an impact of polarization matrix, $$\exp\left(j2\pi\frac{\hat{r}_{rx,n,m}^T \cdot \bar{d}_{rx,u}}{\lambda_0}\right)\exp\left(j2\pi\frac{\hat{r}_{tx,n,m}^T \cdot \bar{d}_{tx,s}}{\lambda_0}\right)$$

represent the impact of phase, and $$\exp\left(j2\pi\frac{\hat{r}_{rx,n,m}^T \cdot \bar{v}}{\lambda_0}t\right)$$

represents the impact of Doppler shift.

In addition:

$$H_{u,s}^{NLOS}(\tau, t) = \sum_{n=1}^{2}\sum_{i=1}^{3}\sum_{m \in R_i} H_{u,s,n,m}^{NLOS}(t)\delta(\tau - \tau_{n,i}) + \sum_{n=3}^{N} H_{u,s,n,}^{NLOS}(t)\delta(\tau - \tau_n),$$

where $\delta(\tau-\tau_{n,i})$ and $\delta(\tau-\tau_n)$ may represent the impact of delay.

In addition, for a direct path:

$$H_{u,s,l}^{LOS}(t) = \begin{bmatrix} F_{rx,u,\theta}(\theta_{LOS,ZOA}, \phi_{LOS,AOA}) \\ F_{rx,u,\phi}(\theta_{LOS,ZOA}, \phi_{LOS,AOA}) \end{bmatrix}^T$$

$$\begin{bmatrix} 1 & 0 \\ 0 & -1 \end{bmatrix}\begin{bmatrix} F_{tx,s,\theta}(\theta_{LOS,ZOD}, \phi_{LOS,AOD}) \\ F_{tx,s,\phi}(\theta_{LOS,ZOD}, \phi_{LOS,AOD}) \end{bmatrix} \cdot \exp\left(-j2\pi\frac{d_{3D}}{\lambda_0}\right)$$

$$\exp\left(j2\pi\frac{\hat{r}_{rx,LOS}^T \cdot \bar{d}_{rx,u}}{\lambda_0}\right)\exp\left(j2\pi\frac{\hat{r}_{tx,LOS}^T \cdot \bar{d}_{tx,s}}{\lambda_0}\right)\exp\left(j2\pi\frac{\hat{r}_{rx,LOS}^T \cdot \bar{v}}{\lambda_0}t\right),$$

where $$\begin{bmatrix} F_{rx,u,\theta}(\theta_{LOS,ZOA}, \phi_{LOS,AOA}) \\ F_{rx,u,\phi}(\theta_{LOS,ZOA}, \phi_{LOS,AOA}) \end{bmatrix}^T \text{ and } \begin{bmatrix} F_{tx,s,\theta}(\theta_{LOS,ZOD}, \phi_{LOS,AOD}) \\ F_{tx,s,\phi}(\theta_{LOS,ZOD}, \phi_{LOS,AOD}) \end{bmatrix}$$

may represent an impact of angular domain parameters, $$\begin{bmatrix} 1 & 0 \\ 0 & -1 \end{bmatrix}$$

may represent an impact of polarization matrix, $$\exp\left(-j2\pi\frac{d_{3D}}{\lambda_0}\right)\exp\left(j2\pi\frac{\hat{r}_{rx,LOS}^T \cdot \bar{d}_{rx,u}}{\lambda_0}\right)\exp\left(j2\pi\frac{\hat{r}_{tx,LOS}^T \cdot \bar{d}_{tx,s}}{\lambda_0}\right)$$

may represent the impact phase, and $$\exp\left(j2\pi\frac{\hat{r}_{rx,LOS}^T \cdot \bar{v}}{\lambda_0}t\right)$$

may represent the impact of the Doppler shift.

In addition, $$H_{u,s}^{LOS}(\tau, t) = \sqrt{\frac{1}{K_R+1}}H_{u,s}^{NLOS}(\tau, j) + \sqrt{\frac{K_R}{K_R+1}} + H_{u,s,l}^{LOS}(t)\delta(\tau - \tau_1),$$

where $$\sqrt{\frac{K_R}{K_R+1}}$$

may represent an where impact of amplitude and $\delta(\tau-\tau_1)$ may represent the impact of delay.

For near-field channel, no changes are expected on the parameters of amplitude and polarization matrix for direct path.

Figure 10:
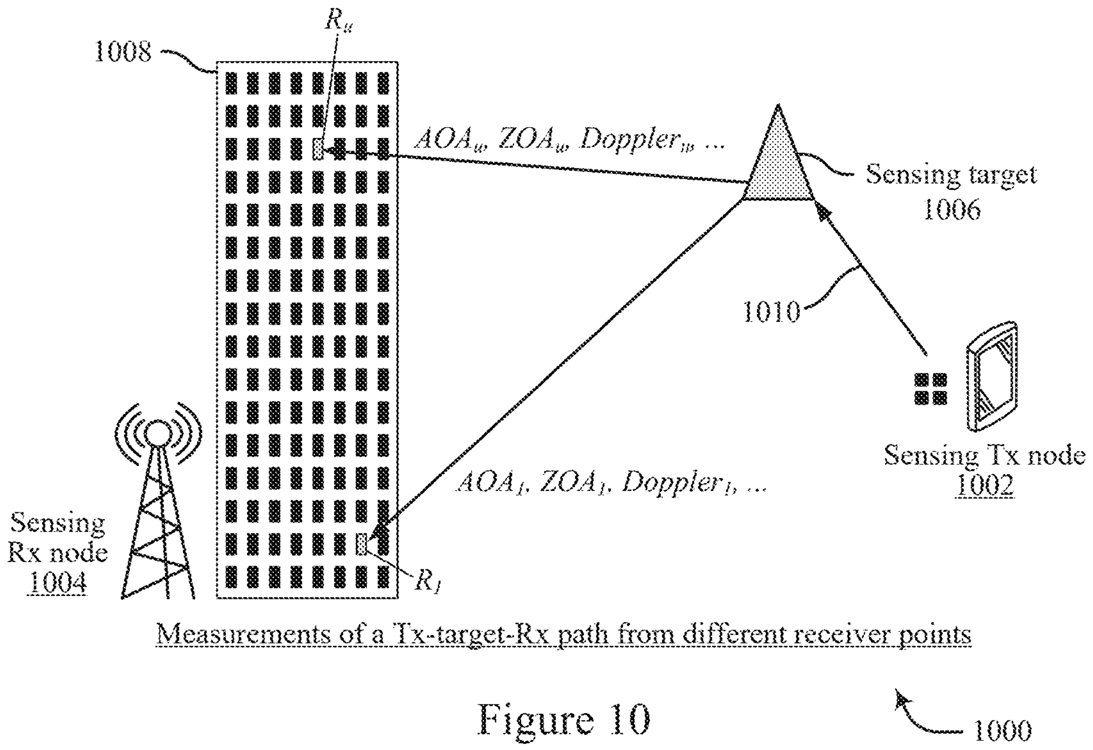
FIG. 10 illustrates an example of measurements of a Tx-target-receiver (Rx) path from different receiver points in accordance with aspects of the present disclosure.

FIG. 10 illustrates an example 1000 of measurements of a Tx-target-Rx path from different receiver points in accordance with aspects of the present disclosure. In the example 1000, the path may be associated with a sensing target reflection or scattering, or with a target UE transmission.

As described herein, a sensing Rx node 1004 reports measurement quantities (as multiple individual quantities or as quantities describing a group of measurements) of a path 1010 to an SensMF, where the path 1010 may be initiated from a sensing Tx node 1002 and terminated at the sensing Rx node 1004. Additionally, each of the measurement quantities may be separately associated with an RP within an antenna array 1008 of the sensing Rx node 1004. As such, the SensMF may derive sensing results of a sensing task (e.g., detecting an intruder in a smart home) based on reception of the measurement report including an association of reported path parameters to the RPs.

According to the example 1000, the sensing Rx node 1004 may report a measurement quantity, e.g., $\mathcal{M}$ (TX, $T_u$, RX, $R_u$, $P_i$, $S_j$, T, t), to the SensMF, where $\mathcal{M}$ may represent a measurement quantity based on one or more of the parameters described in Table 1.

TABLE 1

| Measurement parameters of an extended array including Tx and Rx RPs | |
|---|---|
| TX | The transmitter node (the sensing Tx node) of the signal by which the measurement is conducted/report is generated |
| RX | The receiver node (the sensing Rx node) of the signal by which the measurement is conducted/report is generated |
| $T_u$ | The transmitter RP including/describing one or more of an antenna reference point, a physical or virtual antenna ID, index, number, or position, an array segment, area ID, index, or location, for transmission of the signal, for which the measurement quantity is generated/reported |
| $R_u$ | The receiver RP including one or more of an antenna reference point, a physical or virtual antenna ID, index, number, position, array segment, area ID, index, or location, for which the measurement quantity is generated/reported |
| $P_i$ | The segment or part of the channel for which the measurement quantity is reported. May include one or more of<br>A path associated with a path identifier or a path index i, where i may refer to an assigned ID, or an implicit index of a path in a reported list (e.g., the $3^{rd}$ reported path). In such examples, the reporting of the group of paths are assumed/interpreted to refer to the same group of paths with the consistent/same ordering among different measurement/path lists<br>A subpath or a ray associated with a subpath ID or a ray ID or an index i<br>A path group, a subpath group, or a ray group associated with a path group identifier, a ray group identifier, or an index i<br>A sample of the estimated channel between the sensing Tx node and sensing Rx node in any of the delay, doppler, time, azimuth, elevation domains<br>$P_i$ may be associated with a scattering point of a sensing target or a non-target object with known or unknown location/physical properties. $P_i$ may be associated with a direct path between the sensing Tx node and sensing Rx node. The $P_i$ may be associated to a path determined or indicated according to a path condition or filter. |
| $S_j$ | The signal transmitted by the sensing Tx node and by which the measurement quantity is obtained at the sensing Rx node. |
| T | The one or multiple time samples or time instances, a time duration, or a time window, based on which the measurement quantity is generated (e.g., based on the signals associated with the time samples, the time instances, the time duration, or the time window) |
| t | The one or multiple time samples or time instances, a time duration, or a time window, at which the measurement quantity is valid (e.g., a prediction, extrapolation, interpolation or estimation of a measurement quantity for the time samples, the time instances, the time duration, or the time window which may be potentially different than the time instance of the signal based on which the measurement is performed). |

The sensing Rx node 1004 may generate different measurement values based on different RPs of the antenna array 1008 (e.g., based on the reflection of the path 1010 off the sensing target 1006). For example, measurement values for the path 1010 corresponding to the RP $R_u$ may include $AOA_u$, $ZOA_u$, $Doppler_u$, and so forth, measurement values for the path 1010 corresponding to the RP $R_1$ may include $AOA_1$, $ZOA_1$, $Doppler_1$, and so forth.

Figure 11:
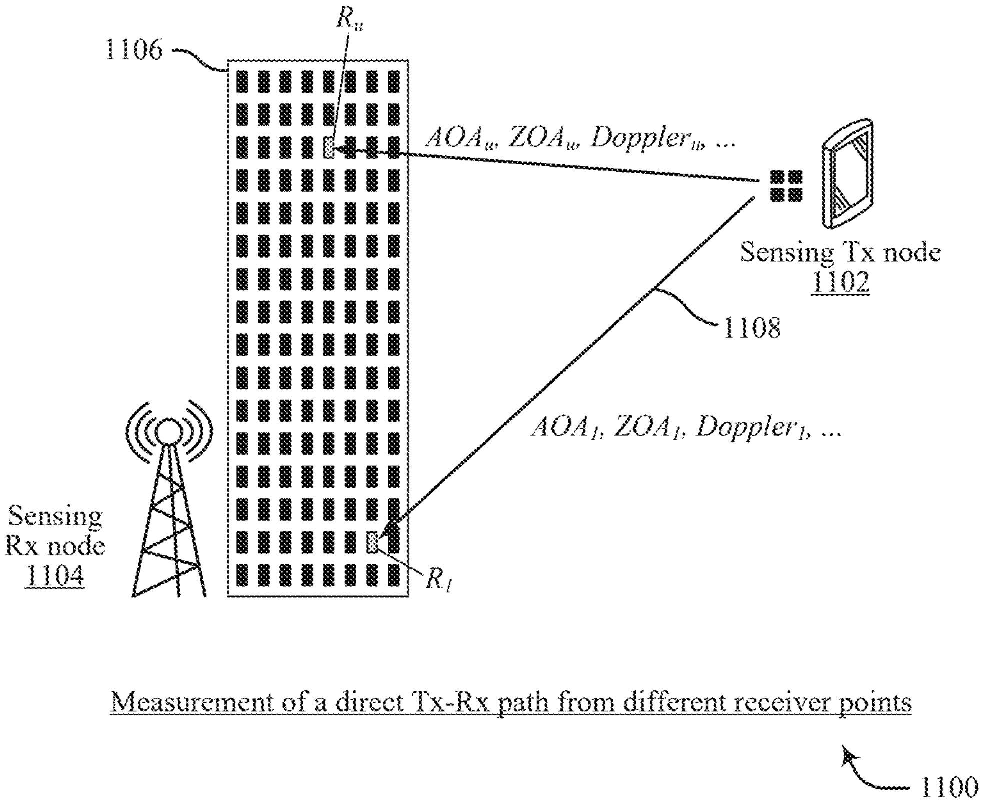
FIG. 11 illustrates an example of measurements of a direct Tx-Rx path from different receiver points in accordance with aspects of the present disclosure.

FIG. 11 illustrates an example 1100 of measurements of a direct Tx-Rx path from different receiver points in accordance with aspects of the present disclosure. In the example 1100, the path may be associated with a sensing target reflection or scattering, or with a target UE transmission.

As described herein, a sensing Rx node 1104 reports measurement quantities (as multiple individual quantities or as quantities describing a group of measurements) of a path 1108 to an SensMF, where the path 1108 may be initiated from a sensing Tx node 1102 and terminated at the sensing Rx node 1104. Additionally, each of the measurement quantities may be separately associated with an RP within an antenna array 1106 of the sensing Rx node 1104. As such, the SensMF may derive sensing results of a sensing task (e.g., detecting an intruder in a smart home) based on reception of the measurement report including an association of reported path parameters to the RPs.

According to the example 1100, the sensing Rx node 1104 may report a measurement quantity, e.g., $\mathcal{M}$ (TX, $T_u$, RX, $R_u$, $P_i$, $S_j$, T, t), to the SensMF, where $\mathcal{M}$ may represent a measurement quantity based on one or more of the parameters described in Table 1. While the example 1000 of FIG. 10 is directed to measurements of a Tx-target-Rx path, the example 1100 is directed to measurements of a direct Tx-Rx path, the path 1108. As such, the sensing Tx node 1102 may transmit signaling directly to the sensing Rx node 1104 without a sensing target or object. The sensing Rx node 1104 may generate different measurement values based on different RPs of the antenna array 1106. For example, measurement values for the path 1010 corresponding to the RP $R_u$ may include $AOA_u$, $ZOA_u$, $Doppler_u$, and so forth, measurement values for the path 1010 corresponding to the RP $R_1$ may include $AOA_1$, $ZOA_1$, $Doppler_1$, and so forth.

The following information regarding reporting measurement quantities $\mathcal{M}$, including the information of Table 1, applies to the example 1000 of FIG. 10 and the example 1100 of FIG. 11.

As described herein, a path (e.g., the path 1010 or the path 1108) may be referred to as a propagation path or a channel segment, which may include one or more of a direct propagation path or a direct ray between the sensing Tx node and the sensing Rx node, an indirect propagation path or an indirect ray between the sensing Tx node and the sensing Rx node that is associated with a scattering point of a scattering object, or multiple propagation paths or multiple rays between the sensing Tx node and the sensing Rx node that are associated with at least one of the scattering object or a property of a propagation path or a ray. Properties of propagation paths and rays may include one or more of a delay, a power, an energy, an azimuth angle, a zenith angle, an elevation angle, a micro-Doppler value, a vibration rate, or a Doppler value within a numerical range.

In some implementations, a type of the measurement quantity $\mathcal{M}$ (i.e., a measurement quantity type) may include one or more of timing-based measurements, Doppler-based measurements, phase-based measurements, angle-based measurements, energy-based measurements, power-based measurements, micro-Doppler measurements, vibration rate measurements, or information associated with sensing results of a sensing target (e.g., a sensing object).

The timing-based measurements may include one or more of delay, path delay, relative delay, delay of paths, time or difference of arrival (e.g., reference signal time difference), relative time-of-arrival (RTOA), or Rx-to-Tx time difference of paths (e.g., UE Rx-Tx time difference, gNB Rx-Tx time difference) measurements. The Doppler-based measurements may include one or more of frequency or Doppler frequency shift, path Doppler shift, relative Doppler shift, relative frequency or Doppler shift of paths, frequency-difference of arrival of paths, or Rx-to-Tx frequency difference of paths measurements. The phase-based measurements may include one carrier phase of arrival of a path measurements, and the angle-based measurements may include one or more of AoA, ZoA, AoD, ZoD, azimuth or zenith/elevation of a path, or relative angle of arrival of paths measurements. The energy-based measurements and power-based measurements may include one or more of received power of a signal via a path, total received power of a signal, or total received power of signals at a given resource or within a filtered signal domain (e.g., by a delay, an AoA, a Zoa, or a Doppler filter) measurements. The micro-Doppler measurements and the vibration rate measurements may include observed or received path vibration rate or micro-Doppler shift, or vibration rate or micro-Doppler shift difference of paths measurements. In some implementations, the information describing sensing results of the sensing target may include one or more of presence, position, velocity or speed, heading, orientation, or vibration rate measurements of an object.

In some examples, the vibration of a path or a channel segment may include (e.g., in addition to a non-vibrating value) a harmonic, sin, cosine, or $e^{j2\pi ft}$ function describing any of the AoA, delay, ZoA, Doppler shift, or other value. For example, the function may describe the AoA of an indicated path as initialAoAValue+VibrationAmplitude*sin (2πVibrationFrequency*t), where the measurement quantity may be reported via a constant parameter (e.g., initialAoAValue or initialDelayValue), a frequency parameter (e.g., PathVibrationFrequency), a vibration amplitude parameter (e.g., VibrationAmplitude), and a type of parameter describing which parameter type the harmonic function corresponds to (e.g., AoA, ZoA, delay, Doppler).

In some implementations, multiple measurements, e.g., time-based measurements, Doppler-based measurements, or angular-measurements, correspond to multiple reference signals transmitted from multiple antenna sub-arrays of an antenna array of the sensing Tx node, received from multiple antenna sub-arrays of the antenna array of the sensing Rx node, or a combination thereof. In some examples, each measurement corresponds to a distinct antenna sub-array of the antenna array. In some implementations, each measurement may be based on an uplink signal, a downlink signal, a sidelink signal, or a remote interference management (RIM) signal.

In some examples, the sensing Rx node may report the $\mathcal{M}$ (TX, $T_u$, RX, $R_u$, $P_i$, $S_j$, T, t) measurement values, where each measurement value is jointly associated with ta same propagation path, i.e., the path. The path may be initiated via the sensing Tx node, terminated at the sensing Rx node, and in the example, associated with a shared reflector, scatter point, or object, such as the sensing target, where the measurement values for the path are associated with or obtained from different RPs corresponding to the sensing Rx node. For example, the RPs may include $R_u$ and $R_1$. In some implementations, the sensing Rx node may report the measurement values for the same one or more parameters TX, $T_u$, RX, $P_i$, $S_j$, t. For example, the sensing Rx node may report AoA and ZoA measurements for the same configured PRS signal transmitted from the sensing Tx node 1002 and received by the sensing Rx node, which may be measured and observed at different antenna elements, segments, or parts of the antenna. In some cases, such measurements (associated with multiple RPS) may be further associated with one or more different $S_j$, T, t parameters. For examples, the sensing Rx node may report AoA and ZoA measurements once for a first RP measured via a first PRS associated with values $T_1$, $t_1$, and once for a second RP measured via a second PRS associated with $T_1$, $t_1$. The example 1000 and the example 1100 support measurements of a path (e.g., a propagation path), initiated from the sensing Tx node (e.g., a transmitter node) and terminated at the sensing Tx node (e.g., a received node) equipped with the antenna array, where each measurement is associated with a different RP of the antenna array.

In some examples, the reported measurement values may be associated with the same path (e.g., the path) which the sensing Rx node may observe and measure at different RPs of the antenna array, i.e., different $R_u$s such as $R_1$. In some other examples, the reported measurement values may be associated with multiple propagation paths which are initiated from the sensing Tx node, reflected from the same object, reflector, or area, such as the sensing target, and received by the sensing Rx node via different RPs. Such measurement values may be considered as measurements of separate or different paths. In such cases, the measurement values may further include indications of the measurements being for different paths and the different paths being associated with the same reflector, scattering object, or point (e.g., the sensing target 1006 in the example 1000), the sensing Tx node, and the sensing Rx node (e.g., in the case of a direct path between the sensing Tx node and an extended Rx array). That is, the measurement group over an extended array (e.g., the antenna array) may be reported as measurements of a group of paths associated with the same reflector.

In some implementations, the association of the group of paths for which the sensing Rx node reports measurement values may be indicated via a QCL relationship for paths. The QCL relationship may be defined between a first path (e.g., a path which has been previously known to the sensing Rx node), a path previously detector or reported by the sensing Rx node or indicated to the sensing Rx node) and a second path. That is, a measurement value of the measurement quantities may include the measurement value over multiple paths, the multiple paths having a geometric relationship, where the geometric relationship between two paths of the multiple paths is a QCL relationship.

In some implementations, the QCL relationship (e.g., different geometric path relations) may be based on one or more of a second path initiated from the same RP as the first path (e.g., the same RP or ARP), a second path initiated from the same sensing Tx node (e.g., the same transmitter RP) as the first path, a second path terminated at the same RP as the first path (e.g., the same RP or ARP), a second path terminated at the same sensing Rx node (e.g., the same transmitter RP) as the first path, a second path associated with the same intermediate object, scattering points, or reflector entities (e.g., the sensing target) as the first path (e.g., the second path has been reflected off the same reflector or scattering objects as the first path), a second path associated with the same number of intermediate reflection or scattering bounces as the first path, or a second path associated with a same object or reflector entity as the last reflection or scattering stage prior to the reception by the sensing Rx node as the first path (e.g., the second path has been reflected off the same reconfigurable intelligent surface (RIS) or the same wall as the first path).

In some examples, a QCL relationship between two paths may be interpreted as two paths sharing a same propagation geometry of a Tx node-reflector object-Rx node (e.g., sensing Tx node-sensing target-sensing Rx node), however, the sensing Rx node may receive the paths via different reception RPs of the antenna array, and/or the sensing Tx node may transmit the paths via different transmission RPs. The QCL relation of the two paths may be reported by the sensing Rx node 1004 or another measurement node to the SensMF, e.g., upon reporting of multiple measurement values over multiple paths observed at the sensing Rx node. Additionally, or alternatively, the QCL relation of the two paths may be indicated by the SensMF to the sensing Rx node as assisting information (e.g., where the two paths may be previously known, indicated, or reported to or from the sensing Rx node).

Alternatively, the QCL relationship may be based on two reference signals or two beams, where each reference signal of the two reference signals may be associated with a distinct antenna sub-array of the antenna array. That is, a first reference signal of the two reference signals may be mapped to a first set of antennas, and a second reference signal of the two reference signals may be mapped to a second set of antennas.

In some implementations, a sensing signal $S_j$ transmitted by the sensing Tx node and received by the sensing Rx node may be one or more of numerous reference signal types, including downlink sensing signals, uplink sensing signals, UE-UE sidelink sensing signals, or gNB-gNB sensing signals. For example, the downlink sensing signals may include a synchronization signal (SS)/physical broadcast channel (PBCH) block reference signal, a synchronization reference signal, a CSI-RS, a downlink positioning reference signal (PRS), a tracking reference signal (TRS), a phase tracking reference signal (PT-RS), a demodulation reference signal (DMRS), a physical downlink control channel (PDCCH), a DMRS physical downlink shared channel (PDSCH), a PDCCH, a PDSCH, a PBCH, any of the downlink reference signals or downlink physical data or control channels defined within the communication system (e.g., 5G or 6G system), or a downlink sensing reference signal. The uplink sensing signals may include a multiple-input multiple-output (MIMO) SRS, an SRS for positioning, an SRS for sensing, a new reference signal for uplink, any of the uplink reference signals or uplink physical data or control channels defined within the communication system (e.g., 5G or 6G system), or an uplink sensing reference signal). The UE-UE sidelink sensing signals may include a sidelink-positioning reference signal (PRS), a sidelink-CSI, a physical sidelink shared channel (PSSCH) DMRS, a physical sidelink control channel (PSCCH) DMRS, a new reference signal for UE-UE-links, any of the sidelink reference signals or sidelink physical data or control channels defined within the communication system (e.g., 5G or 6G system), or a sidelink sensing reference signal. The gNB-gNB sensing signals may include a downlink sensing signal, an uplink sensing signal or a remote interference management (RIM) signal, including legacy NR RIM signals or enhanced RIM signals corresponding to sensing.

In some examples, the sensing signal $S_j$ may be a reference signal which is specific to one or more of the sensing operation, the transmission by the sensing node with an extended array, the reception by a sensing node with an extended array, or joint transmission and reception (e.g., a reference signal type X may be considered for transmission and reception by a node with an extended array for the purpose of sensing of the environment). Additionally, or alternatively, the sensing signal $S_j$ may be a reference signal transmitted by a TRP and received by another TRP. In such cases, the sensing signal may be associated with specific properties associated with transmission by a TRP (or an RP or an array segment of a TRP) and reception by a TRP (or an RP or array segment of a TRP). Additionally, or alternatively, the sensing signal $S_j$ may include multiple reference signals, where the multiple reference signals may correspond to multiple antenna sub-arrays of an antenna array of at least one of the sensing Tx node and the sending Rx node. In some cases, the multiple antenna sub-arrays may be mutually exclusive. In some other cases, the multiple antenna sub-arrays may correspond to multiple reference antenna ports that may be distributed over the antenna array.

The sensing Rx node may report one or multiple Tx RPs for one or more measurement quantities to the SensMF. That is, the sensing signal may be associated with one or more of the RPs at a transmitter antenna array of the sensing Tx node. In such cases, the report to the SensMF regarding a sensing or positioning measurement process also includes the information about the RPs of the transmitter antenna array associated with the sensing signal by which the sensing measurement report is generated. As such, in some examples, multiple measurement reports may be generated and transmitted by the sensing Rx node for different associations of the sensing signal and the RPs of the transmitter antenna array associated with the sensing signal. Additionally, for a reported measurement quantity by the sensing Rx node, one or multiple transmitter array RPs may also be reported to the SensMF (e.g., by the same sensing Rx node, by a sensing Tx node, or by a gNB or a RAN controller entity for the sensing process residing in RAN).

In some implementations, the reporting of measurement quantities over an array or over a segment or subarea of the array includes an indication of a function of change of the measurement values of the measurement quantities over different antennas or RPs of different areas or positions of the array. That is, the reported measurement quantities may include a function indicating a variation of a measurement value over one or more of a segment of the sensing Rx node, a subarray of the sensing Rx node, or RPs of the antenna array of the sensing Rx node. The function may be one or more of a single or constant value, an affine function, a quadratic function, a harmonic function or an exponential function. The measurement M may be, but is not limited to, any of the measurement quantities described herein. In some examples, the function may describe a rate of change or a first derivative of a defined measurement quantity (e.g., rate of change of an angle measurement at the sensing Rx node over a segment of the antenna array).

A single or constant value as the function may represent a measurement quantity within an array segment or a sub-area of the array as, e.g., a mean value or a median value, $M=a_0$, wherein M is the measurement quantity and $a_0$ is the constant value describing the measurement quantity as the single or constant value.

A linear function may describe a measurement quantity over different positions or virtual or physical antenna elements or RPs as $M=a_1X+a_0$, wherein M represents the measurement quantity, $a_0$, $a_1$ represent constants describing the measurement quantity as a linear function, and X represents RPs or positions and displacements within the array, e.g., the ARP/RP number/index, or the displacement of position alongside a given direction across the array. For reporting and indication of the defined function, in some examples, the constant values or a quantized version of the constant values are used.

A quadratic function may describe a measurement quantity over different positions or virtual or physical antenna elements or RPs as $M=a_2X^2+a_1X+a_0$, for X being a scarar and $$M = X^H a_2 X + a_1^H X + a_0$$

for X being a vector, wherein M represents (a scalar) measurement quantity. The constants $a_2$, $a_1$, and $a_0$ may represent the measurement quantity as a quadratic function, where $a_0$ represents a scalar and dimension of $a_2$, $a_1$ according to the dimensionality of X, which represents RPs or displacements within the array, e.g., the ARP/RP number/index, or the displacement of position alongside a given direction across the array (e.g., X=[x, y] according to the LCS of the sensing Rx node). For reporting and indication of the defined function, in some examples, the constant values or a quantized version of the constant values are used.

A polynomial function of order Q may describe a measurement quantity over different positions or virtual or physical antenna elements or RPs as $M=a_{Q-1}X^{Q-1}+\ldots+a_1X+a_0$ wherein M represents the measurement quantity, $a_{Q-1}, \ldots, a_0$ represent constants describing the measurement quantity as a polynomial function, and X represents RPs or displacements within the array, e.g., the ARP/RP number/index, or the displacement of position alongside a given direction across the array. For reporting and indication of the defined function, in some examples, the constant values or a quantized version of the constant values are used.

An exponential function may describe a measurement quantity over different positions or virtual or physical antenna elements or RPs as $M=a_2e^{a_1X}+a_0$, wherein M represents the measurement quantity, $a_0$, $a_1$, $a_2$ represent constants describing the measurement quantity as an exponential function, and X describes RPs or displacements within the array, e.g., the ARP/RP number/index, or the displacement of position alongside a given direction across the array. For reporting and indication of the defined function, in some examples, the constant values or a quantized version of the constant values are used. In some examples, X may be a multi-dimensional variable describing a pattern jointly over multiple dimensions of the array and the $a_1$ may be of the dimension with the same length and according to X.

A harmonic function (e.g., a sin( ) or cos( ) function) may describe a vibrating measurement quantity over different positions, virtual or physical antenna elements, or RPs, as $M=a_1 \sin(2*\pi*\text{SpatialVibrationFrequency}*X)+a_2$, or $M=a_1 \exp(2*\pi*\text{SpatialVibrationFrequency}*X)+a_2$, where M represents the measurement quantity, SpatialVibrationFrequency, $a_1$, and $a_2$ represent constants describing the measurement quantity as a sin or harmonic function, and X describes RPs or displacements within the array.

Additionally, or alternatively, an autocorrelation function may describe a variation in measurement of a reference signal over at least one of a time domain, a Doppler domain, a frequency domain, a delay domain, a phase domain, or a spatial domain. The autocorrelation function may be represented in a form of a selection of a set of amplitude parameters each having a value from a codebook of amplitude values varying between 0 and 1, which may be pre-configured. An additional set of phase parameters each having on a value from a uniform set of phase values spanning a range [0, 2π] may also be pre-configured.

In some implementations, the function may include a combination of one or more of the described functions, e.g., a combination of a polynomial function of order 3 and an exponential function. Where a function is used to describe a pattern of a measurement quantity over an array segment, a sub-area, or a sub-array, then the report may include additional information including one or more of an indication of a type of the function, a set of parameter values associated with the function, a set of parameter values associated with one or more of a correlation or a variance of the measurement value across RPs of the antenna array, or a set of parameter values associated with one or more coefficients of the function in a frequency domain. In some cases, the indication of the type of the function may be an index of a codebook, where the codebook includes multiple types of functions indicating a variation of the measurement value across the antenna array. Additionally, or alternatively, the function may be associated with an indicated direction.

For example, the report may include a measurement quantity or type for which the function of change of the measurement values are reported (e.g., the azimuth-AoA, delay, etc.). Additionally, or alternatively, the report may include a type or category of the function (e.g., an index from a table or codebook including different possible function types or patterns). In some examples, the function of a measurement quantity may correspond to a table or codebook, where the table or codebook includes a possible set of values for the input arguments to the function. Additionally, or alternatively, the report may include one or multiple values for the parameters associated with the function type or category (e.g., one or more of $a_{Q-1}, \ldots, a_0$ for a function type as a polynomial). Additionally, or alternatively, the report may include a type of X including a position, a relative position, or an antenna index or an antenna number. Additionally, or alternatively, the report may define a dimension (e.g., one-dimensional (1D) or two-dimensional (2D)) and one or more directions along with the variable of X (as a scalar or a vector) (e.g., defined as the position of antenna index over the x-axis of the LCS of the array or according to the GCS). Additionally, or alternatively, the report may indicate an array segment for which the function holds (e.g., a boundary of the segment or subarea, limits of X along one or multiple indicated directions, e.g., an antenna index or position $[c_1, c_2]$ along the x-axis according to the LCS of the array and an antenna index or position $[d_1, d_2]$ along the y-axis according to the LCS of the array).

Additionally, or alternatively, the report may include an indication of continuity of the measurement for adjacent segments or areas, e.g., across one or more directions, for multiple segments or areas. This may result in relaxed or skipped reporting of one or more parameters, where the parameters that are not reported may be determined or calculated at the SensMF based on the indicated continuity of the parameter value. Additionally, or alternatively, the report may include an indication of a path or a group of paths or signals for which a measurement quantity holds (e.g., the reported function if for the observed direct path from the sensing Tx node).

In some implementations, the example 1000 and the example 1100 support reporting of the measurement of over a group or RPs in a bitmap format. A measurement or a status of a path observed across multiple RPs of the antenna array may be generated and reported according to a bitmap format, where different value points and pixels are associated with different RPs, and/or different dimensions (e.g., x, y, dimensions) of the bitmap format are associated with different dimensions (e.g., x, y dimensions) of the antenna array according to a coordinate system known to the sensing Rx node. In some examples, the bitmap format describes the measurement value for a 2D image, where the 2D image describes the value of the status or measurement (e.g., as a binary blocked or a non-blocked status, a complex or real value for a measured absolute or relative energy/intensity or measurement of angle, or for measurement of phase or Doppler frequency shift) for different physical or virtual antenna elements of the array, or for different RPs or ARPs.

By way of example, as part of reporting of a function of change over a segment of an array, the function may be indicated via an index from a codebook or a table, where the codebook or table may include different possible function types or patterns. Additionally, the report may include quantities or values describing the indicated function type or pattern. For example, a function "Quadratic-2D" may be indicated via a first index, which defines the pattern of the measurement quantity of a path associated with the sensing target to be described as a 2D quadratic function over the x and y axes according to the LCS of the measurement node (e.g., the sensing Rx node). In some such examples, values corresponding to the function type or pattern are also reported, including $a_2$, $a_1$, $a_0$. Some examples of the codebook or table including the function of change and the corresponding reporting structure are provided in Table 2.

TABLE 2

Measurement parameters of an extended array including Tx and Rx RPs

| Pattern/Function Type | Description | Parameters to be reported |
|---|---|---|
| "Affine" | The change of the values of the measurement quantity over the antenna array RPs is described as an affine function | $a_1$, $a_0$ as scalar or vector of constants describing the affine function<br>The dimensionality of the function's input X [e.g., function defined over 1-D or a 2-D or a 3-D space described with variable X]<br>The coordinate system over which the independent variable(s) X are described [e.g., LCS of the measurement node or GCS, or a translated LCS]<br>Measurement quantity type described by the function<br>Any, one or more of $\mathcal{TX}$, $\mathcal{RX}$, $\mathcal{P}_i$, $\mathcal{S}_j$, $\mathcal{T}$, $t$ as described in Table 1.<br>The array segment/area, RPs over which the function describes the measurement quantity [e.g., array segment/area identifier] |
| "Quadratic" | The (change of) the values of the measurement quantity over the antenna array RPs is described as a quadratic $2^{nd}$ order polynomial function | $a_2$, $a_1$, $a_0$ as matrix, vector or scalar of constants describing the quadratic function<br>other parameters as highlighted above |
| "Exponential" | The (change of) the values of the measurement quantity over the antenna array RPs is described as an exponential function | $a_2$, $a_1$, $a_0$ as vector or scalar of constants describing the quadratic function<br>other parameters as highlighted above |
| " . . . " | . . . | . . . |

In some examples, different functions and corresponding parameter values may be defined, reported, and indicated for different dimensions of the array (e.g., a first pattern and corresponding values along the x-axis according to the LCS of the array and a second pattern and corresponding values along the y-axis according to the LCS of the array). Additionally, or alternatively, an indicated or reported function for measurement quantities over an array may be associated with a set of RPs or a segment of the antenna array corresponding to the sensing Rx node, and not all of the antenna array (e.g., a pattern of change describing the measured energy of an angle of a path within RPs of half or an otherwise defined portion or segment) of the array area. Additionally, or alternatively, the variable X may be a position of an RP or an ARP of the antenna array according to a coordinate system known to the sensing Rx node (e.g., LCS of the sensing Rx node, translation of the LCS to a second coordinate system, or the GCS).

Additionally, or alternatively, the function may be reported or indicated in a frequency domain, e.g., by transforming measurement values of the measurement quantities across the array (e.g., as a function of the variable X) into a 1D or 2D Fourier transform. In such cases, the parameters to be reported corresponding to the function include a value of the observed function in all or a subset of the frequency domain, e.g., the reported quantities comprising the values of the Fourier-transformed measurements at all or a subset of the frequency points defined for the sensing Rx node across the direction d (e.g., direction of the x-axis according to the LCS of the array or along a defined direction to the sensing Rx node). Additionally, or alternatively, the report of a measurement quantity may include a function of change of a differential measurement (e.g., a function describing an observed AoA, delay, or Doppler shift of a path associated with a sensing target over the array RPs relative (e.g., as an algebraic ratio or as a difference or subtraction) to the observed AoA of a first arrival or direct path between the Tx and Rx at a fixed reference RP of the antenna array of the sensing Rx node.

In some implementations, a value corresponding to "not applicable" or "out of range" is included as a valid value for a subset of the parameters or features to be reported with the measurement quantities, where the "not applicable" or the "out of range" indication correspond to at least one of a value of a parameter or feature in the subset of the parameters or features not being applicable to any of the values of a codebook of values associated with the parameter or feature, or that the sensing Rx node is unable to measure the received sensing signal with sufficient confidence. Such parameters may be determined by the SensMF or by the sensing Rx node.

In some examples, all or a subset of the parameters or features to be reported may be determined by the sensing Rx node (e.g., autonomously or based on a prior recommendation of the SensMF). In such cases, the sensing Rx node may determine a coordinate system (e.g., the LCS or the GCS when available to the sensing Rx node), the array segment for which the change of the measurement quantity is to be reported, or both. In some cases, all or a subset of the parameters or features to be reported may be communicated to the sensing Rx node, e.g., as part of configuration information sent by the SensMF.

Various signaling may be used for sensing related message. Information exchanges between sensing entities (e.g., the sensing Tx node and the sensing Rx node) and the SensMF, may include communications for one or more of configuration of the sensing Tx node for sensing signal transmission or configuration of sensing Rx node for sensing signal reception, measurements of the received signal, and/or reporting of the obtained measurements or a subset thereof. Such communications may be received by sensing Rx nodes, transmitted by sensing Rx nodes, received by sensing Tx nodes, transmitted by sensing Tx nodes, transmitted and/or received by the SensMF, transmitted and/or received by components of the SensMF (e.g., between an SF and an SMC or a RAN node controlling sensing operations), or any combination thereof. Additionally, the communications may be performed via uplink, downlink, or sidelink physical data and/or control channels defined within the communication network, for example, via any physical cannel belonging to a 5G system (5GS) or 6G system (6GS), PBCH, PDSCH, PDCCH, PUSCH, PUCCH, PSBCH, PSCCH, PSSCH, or via higher layer signaling, e.g., MAC-CE or RRC signaling where the sensing Tx node, the sensing Rx node, or both are UEs.

Additionally, or alternatively, the communications may be performed via a logical interface between the SensMF and the sensing nodes, e.g., as part of the LPP, as a message framework for sensing, or as an interface defined for sensing message exchanges over the N1 interface between the SF and a UE, where the sensing Tx node, the sensing Rx node, or both are UEs.

Additionally, or alternatively, the communications may be performed via a logical interface between the SensMF and the sensing nodes, e.g., as part of the NRPPa (or a modified or enhanced NRPPa message framework for sensing), or as an interface defined over an NGAP interface, where the sensing Tx node, the sensing Rx node, or both are a gNB, gNB-CU, gNB-DU or TRP of a RAN, and the SensMF is a core network function (e.g., SF, LMF, or the like).

Additionally, or alternatively, the communications may be performed via a logical interface between the SensMF and the sensing nodes, where the SensMF is a serving gNB of a sensing task or a sensing management component residing in a RAN, and the sensing node is a UE or a TRP of the RAN. In some examples, the interface may utilize the X2/Xn interface between the associated gNB of the sensing node and the serving gNB of the sensing task.

Additionally, or alternatively, the communications may be performed via an interface which is defined between the transmission and reception entities and not necessarily specified within the network standard operations (e.g., data or message exchanged via the application layer of the device and view an over-the-top (OTT) application connection).

In some implementations, the measurement quantities described herein may be reported based on a received request trigger. For example, the sensing Rx node may report the measurement quantities based on receiving a request for such measurement reporting quantities from components of the SensMF (e.g., between the SF and the SMC or a RAN node controlling sensing operations). The request may be transmitted to the sensing Rx node prior to the sensing Rx node performing the desired measurement and associated measurement quantities.

Additionally, or alternatively, the measurement quantities described herein may be reported in relation to a defined RP. For example, the sensing Rx node may signal various RPs, e.g., i sub-arrays associated with i RPs, including a number of RPs to the SensMF such that a measurement quantity generated and reported at an antenna array element is reported in relation to the signaled RPs. The number of RPS may be less than the number of array elements. The locations of RPs may be known, and the measurement quantity generated at an antenna array element may be reported in relation to the RP, for example, in the form of difference or delta location values. The measurement quantity reported in relation to an RP may be described in terms of one or more elements, including a delta height, which is a delta value in terms of height of a desired antenna array element location (e.g., "desired antenna array location" minus "RP location"), a delta latitude, which is a delta value in terms of latitude of the desired antenna array element location (e.g., "desired antenna array location" minus "RP location"), a delta longitude, which is a delta value in terms of longitude of the desired antenna array element location (e.g., "desired antenna array location" minus "RP location"), or location uncertainty, which is an uncertainty in terms of location coordinates corresponding to a horizontal uncertainty of the RP or antenna array element location and a vertical uncertainty of the RP or antenna array element location.

According to the described techniques, a sensing Rx node may report differential measurements of paths, where parameters of a differential measurement may be associated with a different RP of an antenna array of the sensing Rx node and with the same or a different propagation path. That is, based on a received sensing signal, the sensing Rx node may generate or determine a differential measurement quantity that indicates a difference between a first measurement of a first channel segment associated with the sensing Rx node at a first RP and a second measurement of a second channel segment associated with the sensing Rx node at a second RP. The first RP and the second RP may be associated with one or more antenna arrays of the sensing Rx node (e.g., the first RP and the second RP may be the same or different RPs). The sensing Rx node may transmit a report including the differential measurement quantity. As such, the SensMF may derive sensing results of a sensing task based on the report, including an association of the differential measurements to the pair of RPs based on which differential measurements are determined.

In some examples, a sensing Rx node associated with a large or extended antenna array system may report one or more differential measurements of paths, where each of a pair of parameters of a differential measurement may be associated with a different RP of the antenna array, and is associated with the same or a different propagation path. That is, a sensing Rx node may receive a sensing signal (e.g., from a sensing Tx node). The sensing Rx node may determine a differential measurement quantity based on the sensing signal, where the differential measurement quantity indicates a difference between a first measurement of a first channel segment associated with the first device at a first RP and a second measurement of a second channel segment associated with the first device at a second RP, and wherein the first RP and the second RP are associated with one or more antenna arrays of the first device. As such, the SensMF may derive sensing results of a sensing task based on the differential measurement report including association of the differential measurements to the pair of the RPs based on which differential measurement is obtained.

According to the described techniques, a measurement quantity reported for a sensing Rx node may include a differential measurement as $\mathcal{M}=\mathcal{M}_1(TX_2, T_{u,2}, RX_2, R_{u,2}, P_{i_2}, S_{j,2}, T_2, t_2)-\mathcal{M}_2(TX_1, T_{u,1}, RX_1, R_{u,1}, P_{i_1}, S_{j,1}, T_1, t_1)$, where $\mathcal{M}$ may be based on one or more of the parameters described in Table 3.

TABLE 3

| Parameters of a differential measurement over an extended array including Tx and Rx RPs | |
|---|---|
| $TX_1$, $TX_2$ | The same or different transmitter nodes (sensing Tx nodes) of the signal by which the measurement quantities $\mathcal{M}_1$, $\mathcal{M}_2$ are generated/reported |
| $RX_1$, $RX_2$ | The same or different receiver nodes (sensing Rx nodes) of the signal by which the measurement quantities $\mathcal{M}_1$, $\mathcal{M}_2$ are generated/reported |
| $T_{u,1}$, $T_{u,2}$ | The same or different transmission RPs of the same or different sensing Tx nodes $TX_1$, $TX_2$ for which the measurement quantities $\mathcal{M}_1$, $\mathcal{M}_2$ are generated/reported |
| $R_{u,1}$, $R_{u,2}$ | The same or different reception RPs of the same or different sensing Rx nodes $RX_1$, $RX_2$ for which the measurement quantities $\mathcal{M}_1$, $\mathcal{M}_2$ are generated/reported |
| $P_{i,1}$, $P_{i,2}$ | The same or different paths or segment/part of the channel for which the measurement quantity is generated/reported. Examples of $P_{i,1}$, $P_{i,2}$ are given in Table 1 |
| $S_{j,1}$, $S_{j,2}$ | The same or different signals transmitted by the TX node and by which the measurement quantity is obtained at the RX node. |
| $T_1$, $T_2$ | The same or different time samples, time instances, time durations, time windows, based on which (e.g., based on the signals associated with the time samples, time instances, time durations, time windows) the measurement quantities $\mathcal{M}_1$, $\mathcal{M}_2$ are generated |
| $t_1$, $t_2$ | The same or different time samples, time instances, time durations, time windows, at which the generated/reported measurement quantities $\mathcal{M}_1$, $\mathcal{M}_2$ are valid |

According to the parameters described in Table 3, a differential measurement quantity may include one or more dependencies according to a difference between a first differential measurement quantity type $\mathcal{M}_1$ and a second differential measurement quantity type $\mathcal{M}_2$ based on one or more of a first sensing transmitter node and a second sensing transmitter node that transmit the sensing signal, a first sensing receiver node and a second sensing receiver node that receive the sensing signal, a first transmission RP corresponding to the first sensing transmitter node and a second transmission RP corresponding to the second sensing transmitter node, a first reception RP corresponding to the first sensing receiver node and a second reception RP corresponding to the second sensing receiver node, a first channel segment and a second channel segment, a first signal transmitted by the first sensing transmitter node and received by the first sensing receiver node and a second signal transmitted by the second sensing transmitter node and received by the second sensing receiver node, or a first time period and a second time period for which the first differential measurement quantity type and the second differential measurement quantity type are determined, or a third time period and a fourth time people for which the first differential measurement quantity type and the second differential measurement quantity type are valid.

In some examples, the measurement quantity types $\mathcal{M}_1$, $\mathcal{M}_2$ may include any one of measurement types described in Table 1, with reference to example 1000 and example 1100. For example, the differential measurement quantities may include one or more of time-based measurements, Doppler-based measurements, phase-based measurements, angle-based measurements, energy-based measurements, power-based measurements, micro-Doppler measurements, vibration-rate measurements, or information associated with sensing results of a sensing target. The differential measurement quantities may include statistical measures (e.g., variance, spread, root mean square) obtained from an underlying distribution of a parameter (e.g., angle, Doppler shift, any of the measurement quantity types) observed over different parts or RPs of the antenna array.

The sensing Rx node may receive signaling including the configuration information, and the sensing Rx node may receive sensing signals and determine differential measurement quantities based on the configuration information. The configuration information may include one or more of a set of parameters associated with the sensing signal to be used for generating the measurement quantities, a type of measurement value to be reported, information associated with the channel segment for which the measurement quantities are to be reported, RPs of the antenna array for which the measurement quantities are to be generated, a configuration for transmission of the report, or a trigger for the transmission of the report.

In some implementations, the configuration for generating and reporting a differential measurement quantity may include one or more of an indication of a measurement quantity type, an indication of dependent parameters of the measurement quantity as described in Table 3 (e.g., indication of the one or more propagation paths $P_{i,1}$, $P_{i,2}$ or the RPs $R_{u,1}$, $R_{u,2}$ for which the differential measurement is to be reported, a reporting configuration for reporting the measurement quantity (e.g., time, frequency, and beam resources by which the generated measurement quantity may be reported, or a reporting trigger or threshold, or an indication that a differential measurement is above an indicated significance threshold (e.g., when a difference of a Doppler shift, AoA, ZoA, delay, or any other measurement quantities measurable at a single RP between at least two RPs measurable by the sensing Rx node is larger than an indicated threshold). For example, a differential measurement quantity may include one or more of a time difference of arrival, an angle difference of arrival, or a Doppler shift difference of arrival between the first channel segment received via a first RP and the second channel segment received via a second RP. Additionally, or alternatively, a differential measurement quantity may include a differential measurement quantity may one or more of a time difference or a frequency difference between reception of the first channel segment via the first RP and transmission of the second channel segment via the second RP.

In some examples, the sensing Rx node may determine a second differential measurement quantity over one or more RPs of at least one antenna array, a full antenna array, or a segment of an antenna array and a variation measurement of the second differential measurement quantity and report the second differential measurement quantity and the variation measurement.

In some examples, the sensing Rx node may receive an indication of one or multiple RPs (e.g., $R_{u,1}$, $R_{u,2}$) for which the differential measurement is to be reported. The sensing Rx node may measure a differential measurement quantity between the indicated RPs and report the differential measurement quantity when the value of the measurement is above a threshold for reporting of that differential measurement quantity. In some examples, the sensing Rx node may determine the RPs $R_{u,1}$, $R_{u,2}$ for which the differential measurement may be reported. In such cases, the sensing Rx node may receive or obtain a threshold (e.g., indicated, configured, or pre-configured threshold value) for reporting of the measured differential measurement quantity. As such, the sensing Rx node may determine one or multiple pairs of the RPs $R_{u,1}$, $R_{u,2}$ for which the differential measurement is above the indicated threshold (e.g., observed AoA of a known or indicated path is above a threshold for the pair of RPs), and reports the differential measurement quantity together with the determined RPs corresponding to the reported differential measurement quantity.

In some examples, the first RP for which the differential measurement is to be reported is received or obtained by the sensing Rx node as part of the known, pre-configured, or configured parameters, where the second one or more RPs is determined by the sensing Rx node (e.g., according to a configuration or criteria known to the sensing Rx node or received by the sensing Rx node). The sensing Rx node may receive a threshold for reporting the measured differential measurement quantity. As such, the sensing Rx node may determine a second RP (using the first RP as the one previously received via a configuration) for which the differential measurement is above the indicated threshold (e.g., observed AoA of a known, indicated, or pre-determined path is above a threshold for the pair of RPs including the first RP and the second RP by the sensing Rx node), and reports the differential measurement quantity together with the second RPs corresponding to the reported differential measurement quantity.

In some examples, the sensing Rx node may determine one or more RPs (e.g., according to a number of the differential measurements or pairs received as a configuration information from the SensMF) with maximum difference in terms of the value of the indicated measurement type and uses the determined pairs of the RPs for reporting of the differential measurement value. In some examples, the reporting of a differential measurement quantity is performed for multiple differential measurement quantities corresponding to the determined pairs of RPs (e.g., multiple determined pairs of RPs for which the measurement quantity exceeds an indicated reporting threshold).

In some implementations, the number of differential measurements to be reported or a maximum number of the differential measurements to be reported are indicated to the sensing Rx node as part of the configuration parameters. In some examples, the number of differential measurements to be reported are indicated for one or multiple types (e.g., the number or maximum number of reports for an observed Doppler shift difference), paths (e.g., the number or maximum number of reports for an indicated path), direction or dimension of the array (e.g., the number or maximum number of reports for the variations across x-axis according to the LCS of the array).

In some examples, the sensing Rx node determines the pairs of RPs for which an indicated differential measurement is above a threshold, and then reports the differential measurement values corresponding to N number of pairs, where N may be a minimum of the number of determined measurement quantities and the indicated maximum number of the measurements to be reported. In some examples, any of the threshold value for the differential measurement quantity, the pair of the RPs for which the measurement quantity is to be reported, and reporting of a differential measurement quantity, are associated to a direction or axis along which an indicated threshold value is to be evaluated, or a differential measurement quantity is to be measured. In some examples, the direction or axis is defined according to the LCS of the receiver antenna array, according to a known coordinate system (jointly by the SensMF and the sensing Rx node), or the GCS. For example, the threshold for reporting of a delay difference is indicated to be 1 nsec for displacement of the RP of the sensing Rx antenna array across the x-axis according to the LCS of the sensing Rx antenna array. In some examples, the threshold may be provided as a value of the measurement quantity (e.g., a delay, a Doppler, an AoA, a ZoA, etc. for a particular measurement type, such as 1 nsec of delay for a delay difference of arrival or a path at two RPs). In some cases, the threshold may be given in terms of a ratio of the change of a measurement quantity relative to (e.g., in ratio of) the displacement of the corresponding RPs in a distance unit. The sensing Rx node may be indicated to report a differential measurement of a measured Doppler shift associated with a direct or reflective path across the antenna array, if the change of the Doppler shift is bigger than the 1 kHz-per-1 meter displacement of the RP along with the x-axis according to the LCS of the sensing Rx antenna array.

In some implementations, one or more of the differential measurement types provided in Table 4 may be generated and reported according to the described techniques.

TABLE 4

Differential measurement types

| Example Name | Description | Example Reporting/configuration parameters |
|---|---|---|
| PathDelayDifference | Difference of the measured delay of a path at two RPs of the sensing Rx antenna array. May be associated with all sensing Rx array, or a specific direction of the array (across X-axis or Y-axis) | Delay value, RP1, RP2, the direction of the RP2-RP1, Path description/ID, measurement CS (e.g., LCS of the array), measurement timestamp |
| PathDopplerShiftDifference | Difference of the measured doppler shift of a path at two RPs of the sensing Rx antenna array. May be associated with all sensing Rx array, or a specific direction of the array (across X-axis or Y-axis) | Value of the doppler frequency shift or estimated received frequency, RP1, RP2, the direction of the RP2-RP1, Path description/ID, measurement CS (e.g., LCS of the array), measurement timestamp |
| PathAzimuth-AoADifference | Difference of the measured azimuth angle of arrival of a path at two RPs of the sensing Rx antenna array. May be associated with all sensing Rx array, or a specific direction of the array (across X-axis or Y-axis) | Azimuth angle of arrival value, RP1, RP2, the direction of the RP2-RP1, Path description/ID, measurement CS (e.g., LCS of the array), measurement timestamp |
| PathZenith/Eleveation-AoADifference | Difference of the measured elevation or Zenith angle of arrival of a path at two RPs of the sensing Rx antenna array. May be associated with all sensing Rx array, or a specific direction of the array (across X-axis or Y-axis) | Zenith/Elevation angle of arrival value, RP1, RP2, the direction of the RP2-RP1, Path description/ID, measurement CS (e.g., LCS of the array), measurement timestamp |
| PathPowerDifference | Difference of the measured power/energy of a path at two RPs of the sensing Rx antenna array. May be associated with all sensing Rx array, or a specific direction of the array (across X-axis or Y-axis) | Power/energy value, RP1, RP2, the direction of the RP2-RP1, Path description/ID, measurement CS (e.g., LCS of the array), measurement timestamp |
| ObservedDelay (Mean, Spread) | Observed channel mean delay and delay spread/variance caused/observed by changing the receiver RPs across the array. May be associated with all sensing Rx array, or a specific direction of the array (across X-axis or Y-axis) | Mean delay and delay spread values, description of the plurality of RPs (boundary of the RPs, direction of the RPs across which axis) used in generating the mean and spread, measurement timestamp |
| ObservedDopplerShift (Mean, Spread) | Observed channel mean doppler frequency shift and doppler shift spread/variance caused/observed by changing the receiver RPs across the array. May be associated with all sensing Rx array, or a specific direction of the array (across X-axis or Y-axis) | Mean doppler shift and doppler shift spread values, description of the plurality of RPs (boundary of the RPs, direction of the RPs across which axis) used in generating the mean and spread, measurement timestamp |
| ObservedAzimuthAoA (Mean, Spread) | Observed channel mean azimuth of arrival and azimuth of arrival spread/variance caused/observed by changing the receiver RPs across the array. May be associated with all sensing Rx array, or a specific direction of the array (across X-axis or Y-axis) | Mean azimuth AoA and azimuth AoA spread values, description of the plurality of RPs (boundary of the RPs, direction of the RPs across which axis) used in generating the mean and spread, measurement timestamp |

TABLE 4-continued

| Differential measurement types | | |
|---|---|---|
| Example Name | Description | Example Reporting/configuration parameters |
| ObservedZenith/ElevationAoA (Mean, Spread) | Observed channel mean zenith/elevation of arrival and zenith/elevation of arrival spread/variance caused/observed by changing the receiver RPs across the array. May be associated with all sensing Rx array, or a specific direction of the array (across X-axis or Y-axis) | Mean zenith/elevation AoA and zenith/elevation AoA spread values, description of the plurality of RPs (boundary of the RPs, direction of the RPs across which axis) used in generating the mean and spread, measurement timestamp |
| . . . | . . . | . . . |

Figure 12:
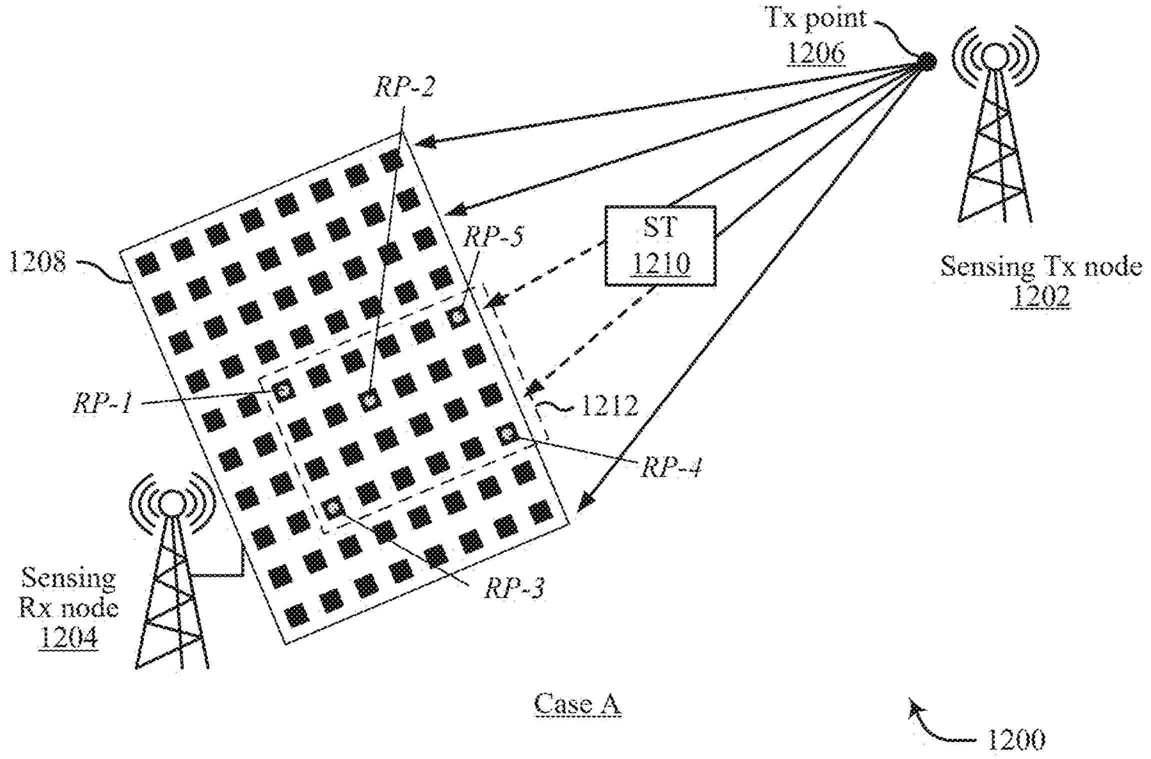
FIG. 12 illustrates an example of extended sensing Rx node antenna arrays observing line-of-sight (LOS) conditions in accordance with aspects of the present disclosure.

FIG. 12 illustrates an example 1200 of extended sensing Rx node antenna arrays observing LOS conditions in accordance with aspects of the present disclosure. In the example 1200 (e.g., Case A), a sensing Rx node 1204 with an extended antenna array, an antenna array 1208, may receive a path and observe LOS conditions for the path, where the path is associated with a sensing target object (ST) 1210.

As described herein, the sensing Rx node 1204 may report one or more LOS, NLOS, blocked, or non-blocked states of a path to a SensMF, where the path may be initiated from the sensing Tx node 1202 and terminated at the sensing Rx node 1204. To do so, the sensing Rx node 1204 may receive a sensing signal (e.g., from the sensing Tx node 1202, via a path). The sensing Rx node 1204 may determine a status of a channel segment observed by the sensing Rx node 1204 over an area associated with the sensing Rx node 1204. That is, each of the states of the path may be associated with a subarea (also referred to herein as a segment or a subspace) of the antenna array 1208 of the sensing Rx node 1204. The sensing Rx node 1204 may also determine the subarea, where the status is applicable to the subarea and where the subarea is a portion of the area. The sensing Rx node 1204 may transmit a report indicating the status and the subarea. That is, the sensing Rx node 1204 may report the subarea of the antenna array 1208 for which the determined status holds. In some examples, the SensMF may derive sensing results of a sensing task based at least on reception of the measurement report, including an association of a blockage status to multiple receiver array segments or RPs.

In some examples, the sensing Rx node 1204 may report the status for a direct path (e.g., channel segment). In such examples, the reported path may include a direct propagation path between the sensing Tx node 1202 and the sensing Rx node 1204, where different blockage, LOS, or NLOS statuses may hold at different areas, segments, or RPs of the antenna array 1208, for example, upon presence of an ST 1210 as a blocker entity. The example 1200 depicts Case A, in which a Tx point 1206 is the transmission point of the sensing Tx node 1202.

In the example 1200, sensing signals transmitted from the Tx point 1206 of the sensing Tx node 1202 may be received by the sensing Rx node 1204, and the sensing Rx node 1204 may determine a status for the signal path based on the ST 1210. For example, RPs RP-1, RP-2, RP-3, RP-4, and RP-5 may correspond to a blocked or partially-blocked status as they are in an area 1212, which may be a shadowed or blocked region. Other RPs outside of the area 1212 may correspond to a non-blocked status. The example 1200 may represent LOS conditions as the path is received by the sensing Rx node 1204 directly from the Tx point 1206 of the sensing Tx node 1202.

Figure 13:
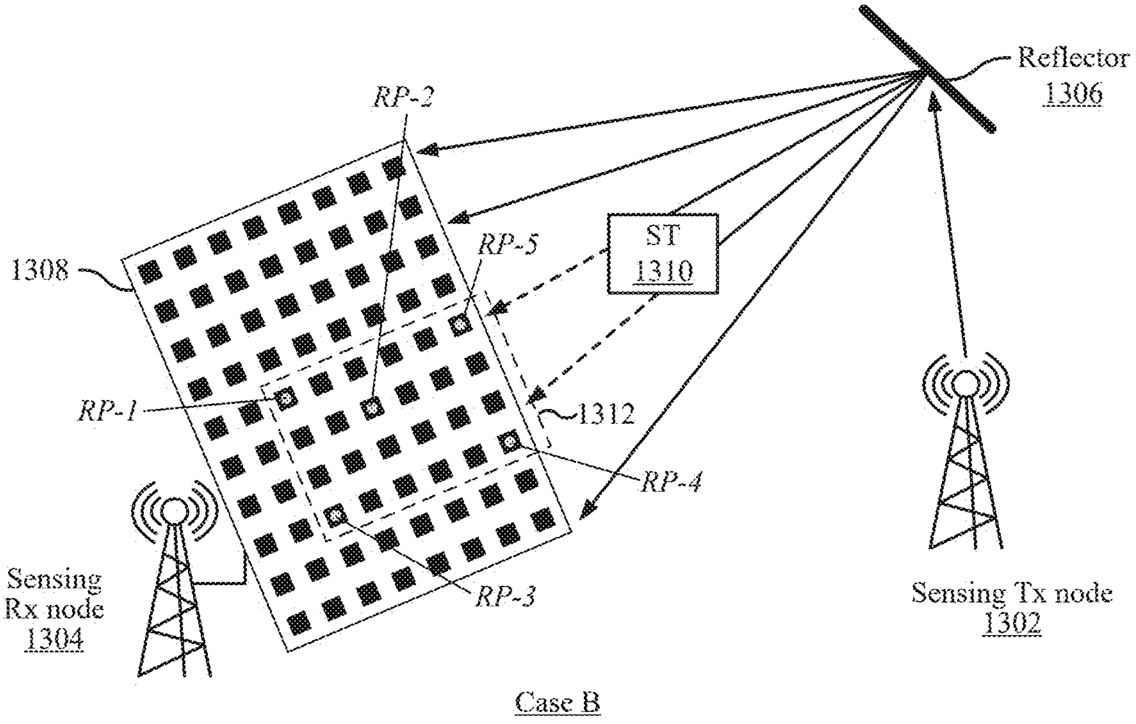
FIG. 13 illustrates an example of extended sensing Rx node antenna arrays observing non-LOS (NLOS) conditions in accordance with aspects of the present disclosure.

FIG. 13 illustrates an example 1300 of extended sensing Rx node antenna arrays observing NLOS conditions in accordance with aspects of the present disclosure. In the example 1300 (e.g., Case B), a sensing Rx node 1304 with an extended antenna array, an antenna array 1308, may receive a path and observe NLOS conditions for the path, where the path is associated with a sensing target object (ST) 1310.

As described herein, the sensing Rx node 1304 may report one or more LOS, NLOS, blocked, or non-blocked states of a path to a SensMF, where the path may be initiated from the sensing Tx node 1302 and terminated at the sensing Rx node 1304. To do so, the sensing Rx node 1304 may receive a sensing signal (e.g., from the sensing Tx node 1302, via a path). The sensing Rx node 1304 may determine a status of a channel segment observed by the sensing Rx node 1304 over an area associated with the sensing Rx node 1304. That is, each of the states of the path may be associated with a subarea (also referred to herein as a segment or a subspace) of the antenna array 1308 of the sensing Rx node 1304. The sensing Rx node 1304 may also determine the subarea, where the status is applicable to the subarea and where the subarea is a portion of the area. The sensing Rx node 1304 may transmit a report indicating the status and the subarea. That is, the sensing Rx node 1304 may report the subarea of the antenna array 1308 for which the determined status holds. In some examples, the SensMF may derive sensing results of a sensing task based at least on reception of the measurement report, including an association of a blockage status to multiple receiver array segments or RPs.

In some examples, the sensing Rx node 1304 may report the status for a non-direct path (e.g., channel segment). In such examples, the propagation path for which the sensing Rx node 1304 reports a status may be associated with a reflection or scattering of another object (e.g., another sensing target, a known object or reflector object, an environmental object with apriori known position, orientation, and physical properties, or an unknown object or environment). For example, the object may be a reflector 1306, which may be a known or configured and network-controlled repeaters (NCRs) CP or RIS, where a reflection condition of the reflector 1306 holds during time window that is indicated, configured, or known by the SensMF, the sensing Rx node 1304, or both. The example 1300 depicts Case B, in which a reflection or scattering point of the reflector 1306 corresponds to a known or unknown reflector or object, to another ST 1310, or to a known or configured RIS.

In the example 1300, sensing signals transmitted from the sensing Tx node 1302 may be received by the sensing Rx node 1304, and the sensing Rx node 1304 may determine a status for the signal path based on the ST 1310. For example, RPs RP-1, RP-2, RP-3, RP-4, and RP-5 may correspond to a blocked or partially-blocked status as they are in an area 1312, which may be a shadowed or blocked region. Other RPs outside of the area 1312 may correspond to a non-blocked status. The example 1300 may represent NLOS conditions as the path from the sensing Tx node 1302 is reflected to the sensing Rx node 1304 off the reflector 1306.

The following information regarding determining blockage statuses of a sensing target applies to the example 1200 of FIG. 12 and the example 1300 of FIG. 13.

As described herein, a path may be referred to as a propagation path or a channel segment, which may include one or more of a direct propagation path or a direct ray between the sensing Tx node and the sensing Rx node, an indirect propagation path or an indirect ray between the sensing Tx node and the sensing Rx node that is associated with a scattering point of a scattering object, or multiple propagation paths or multiple rays between the sensing Tx node and the sensing Rx node that are associated with at least one of the scattering object or a property of a propagation path or a ray. Properties of propagation paths and rays may include one or more of a delay, a power, an energy, an azimuth angle, a zenith angle, an elevation angle, a micro-Doppler value, a vibration rate, or a Doppler value within a numerical range.

According to the example 1200 and the example 1300, the status of a propagation path or a group of propagation paths received and terminated at a sensing Rx node may include one or more of blocked status, a non-blocked status, an LOS status, an NLOS status, or multiple reported statuses each associated with different subareas, segments, or RPs of an extended sensing Rx array. As such, for a path received at the sensing Rx node, a blocked status may be reported for a one or a subset of the RPs or one or more subareas defined on the sensing Rx antenna array, whereas the non-blocked status may be reported on another one or more RPs or segments of the sensing Rx array.

The sensing Rx node may receive a sensing signal and determine a status of a channel segment observed by the sensing Rx node over an area associated with the sensing Rx node. The area may correspond to one or more of a portion or all of a physical area at which an antenna of the sensing Rx node is present, a physical area at which at least one antenna array or at least one transmission RP is present, or an area for which the sensing Rx node is capable of determining the status of a path that is or is not confined by a physical area covered by antenna arrays associated with the sensing Rx node. The sensing Rx node may determine a subarea associated with the sensing Rx node, wherein the status is applicable (e.g., holds) to the subarea, and where the subarea is at least a portion of the area. The subarea may also be referred to as an array segment or an array subarea. The sensing Rx node may transmit a report indicating the status and the subarea. In some implementations, the sensing Rx node may determine the status on a path or channel-segment basis. By way of example, the sensing Rx node may determine a second status of a second channel segment observed by the sensing Rx node over a second area associated with the sensing Rx node, determine a second subarea associated with the sensing Rx node, where the second status is applicable to the second subarea and is at least a portion of the second area, and report the second status and the second subarea.

In some other implementations, the multiple blocked and non-blocked statuses of the multiple RPs or array subareas may be reported describing different paths, where the paths may be indicated such that the paths are associated to the same path group sharing the same Tx/Rx geometry (e.g., when the status describes blockage condition of a direct Tx-Rx path as in Case A) or the same Tx-reflector object-Rx geometry (e.g., when the blockage status describing a blockage condition on a first order reflective path between a sensing Tx node, an object, reflector, or scatterer, and a sensing Rx node and/or reflector entities). For example, a path P1 associated with an RP1 (e.g., a first RP) is indicated to be with a "blocked" status whereas the path P2 associated with RP2 is indicated with a "non-blocked" status. Additionally, the paths P1 and P2 may be indicated as associated with the same path geometry based on being a direct path with the same Tx-Rx entities (e.g., the same sensing Tx node and the same sensing Rx node). In some embodiments, the similar propagation geometries of the paths may be indicated via a defined QCL relation of the paths, as described with reference to example 10 of FIG. 10 and example 11 of FIG. 11. In this way, the sensing Rx node may measure channel parameters based on reception of a sensing signal (e.g., a reference signal). The channel parameters of interest for sensing and position may include a channel delay, a channel power, and a channel angle response (e.g., including a first or multiple other arrival path energy and delay). As described herein, the path report may be associated with a partial blockage state.

In any of the examples or implementations described herein, a path or a propagation path may be referred to as a channel segment, which may include multiple propagation paths or rays for which a defined propagation condition holds (e.g., a channel segment including a group of paths or rays with an AoA between 30-45 degrees observable at the sensing Rx node according to the sensing Rx LCS. That is, a blockage status may be defined in association with a subarray or RP of the sensing Rx node and associated with the channel segment (including a group of propagation paths or rays, or a distinct single path or ray) defined via a range of one or more of a delay, Doppler, AoA, ZoA, and so forth.

According to the example 1200 and the example 1300, a path status may be reported as a current or absolute property, or as an event or relative condition. In some implementations, a status of a propagation path may be interpreted as a property of a path (e.g., by the SensMF to the sensing Rx node, or by the sensing Rx node to the SensMF). For example, the status may be associated with a blocked property, a static property, or a mobile property of a path that originated from the sensing Tx node and terminated at the sensing Rx node. In some implementations, the status of the propagation path may be interpreted as an event or a relative property or condition of a previously measured path (e.g., a blocked status as a blockage event on a previously observed direct, non-direct, or reflective path, or a path determined to be a sensing path for monitoring, for which the path status is to be reported). In some implementations, the propagation path for which the status is reported may include a path previously observed and reported by the sensing Rx node (e.g., according to the path properties or filters), or a path previously indicated by the SensMF (e.g., a path for which the path ID, index, or description has been previously indicated to the sensing Rx node for further monitoring and reporting, or a path indicated as being a sensing path).

In some examples, a general status of an antenna array may be reported as a partial blockage or spatial non-stationarity (SNS) condition (e.g., according to a threshold and along a given array dimension, such as x, with respect to a path). For a sensing Rx node that is determined to be in a partial blockage or SNS condition, at least one RP may experience a first status or first value of a measurement quantity (e.g., blocked status, NLOS status, F0 Doppler shift value, T delay value), and another RP may experience a second status or a second measurement value different from the first status and the first measurement value, respectively, with a threshold (e.g., a non-blocked or LOS status).

In some implementations, the partial blockage or SNS condition may be determined with respect to a particular path or a particular reflector or scattering object. In such cases, at least one RP may experience a first status or a first measurement value (e.g., a blocked status, NLOS status, F0 Doppler shift value) in regard to a path observed at the sensing Rx node, and another RP may experience a second status or a second measurement value different from the first status and the first measurement value, respectively, with a threshold (e.g., a non-blocked or LOS status).

In some implementations, the partial blockage or SNS condition may be determined with respect to a particular array dimension (e.g., sensing Rx node indicated as being associated with an SNS condition or a partial blockage condition with respect to the path Pj and along the x-axis according to the LCS of the antenna array. Additionally, or alternatively, the partial blockage or SNS condition may be determined with respect to a particular threshold (e.g., as pre-configured or configured for the sensing Rx node) for a difference of measurement value or status across different RPs.

In some implementations, the conditions describing the partial blockage or SNS condition may be reported explicitly by the sensing Rx node. In some other implementations, the conditions may be indicated implicitly, e.g., where upon reporting of a measurement type value for different RPs, the sensing Rx is interpreted (by the SensMF) as being with the SNS and/or partial blockage condition at least with respect to the path or array direction for which the measurement values are reported.

In some implementations, the status of the path is reported as a status associated with the full Tx-Rx propagation path. Alternatively, the status is reported as the status associated with a segment (e.g., a channel segment) of the path. The segment of the path may include one or more of a full Tx-Rx path including intermediate bounces, reflections, and scattering effects, a first segment of the propagation path associated with the Tx-to-last reflector, bounce, or scattering point before the path arrives and is terminated at the sensing Rx node, a last segment of the propagation path associated with a last reflector, bounce, or scattering point (before the path arrives and is terminated at the sensing Rx node) to the sensing Rx node, or any segment of the propagation path between any two of the sensing Tx node, the sensing Rx node, or apriori known or unknown environment object, target, reflector, or scattering points.

In some examples, the sensing Rx node may report a path segment associated with a blockage, which may include interpreting the blocked path segment based on a full or partial blockage status of the sensing Rx node of the path. Upon observation of a path being blocked across different RPs, array subareas, or array segments of an extended sensing Rx array (where a last reflector, bounce, or scatterer) of the path is associated with the near-field region of the sensing Rx node and corresponding antenna array), then the shared blockage status across the antenna array of the sensing Rx node may be associated with a path segment prior to the last reflection, bounce, or scattering point. In some other examples, when the sensing Rx node observes a partial blockage status for a path (e.g., sensing Rx node observes a path associated with a reflection, scattering point, or object via some of the RPs of the sensing Rx node with a blocked status and via some other RPs having a non-blocked status), the blockage status of the path may be reported (by the sensing Rx node or the SensMF) to be associated with the last segment of the path from the last reflector or bounce toward the sensing Rx node.

In some implementations, when a sensing Rx node observes multiple paths sharing the same last reflector or scatter object (e.g., an ST 1210 or an ST 1310) toward the antenna array of the sensing Rx node, the sensing Rx node may infer the blockage of a path segment associated with the last reflector or bounce toward the RPs of the sensing Rx node based on the multiple paths sharing the same last reflector or bounce toward the RPs of the sensing Rx node. In such examples, when the blockage status is observed on a path-1 sharing the last reflector-sensing Rx node path segment as a path-2, and where the blockage status has not yet been observed for the path-2 (e.g., observed at a same time or measurement instance), then the blockage status of the path-1 may be inferred and reported as associated with a path segment excluding the last reflector-sensing Rx node path segment. That is, the blockage status may be associated with a Tx-last reflector path segment. When the blockage status is observer for multiple paths sharing the same last reflector toward the sensing Rx node, then the blockage is inferred and reported as being associated with the last reflector toward the antenna array of the sensing Rx node.

A status of a propagation path corresponding to a partial blockage condition may include one or more indications. For example, the status may include a blocked or non-blocked state of the path (e.g., the path segment from the reflector to the sensing Rx node may be observed as blocked at RP-1 in Case B of FIG. 13, or the direct path observed between the sensing Tx node and the sensing Rx node is blocked at RP-1 in Case A of FIG. 12). Additionally, or alternatively, the status may include an LOS condition or a NLOS condition (e.g., the direct path observed between the sensing Tx node and the sensing Rx node is blocked at RP-1 in Case A of FIG. 12, corresponding to an LOS condition). Additionally, or alternatively, the status may include a probability or reliability for which the status holds (e.g., a reported blocked status holds with 90% probability). The probability may be indicated separately for an individual status of a path observed at an RP and at an instance of a report in time, or the probability may be indicated for a group of measurements. For example, the probability may be indicated for multiple reports for a path and an RP indicated at different times, for each path across different reported statuses for RPs, array subareas, or array segments, or for all reported paths, RPs, array subareas, or array segments, at the same or different times.

Additionally, or alternatively, the status may include a level indicating an intensity for which the status holds (e.g., a blockage or obstruction with an intensity or level3, where the level is indicated to the sensing Rx node via a criteria or threshold on the measured corresponding path energy or power). Additionally, or alternatively, the status may include a time window at which the measurement may be conducted (e.g., the indication of a start and an end time stamp, symbol, slot, subframe, frame, or any time reference of the measurements). Additionally, or alternatively, the status may include a time window or a time reference for which the measurement is reported (e.g., an indication of a time reference, such as a time stamp, a symbol, a slot, a subframe, a frame, or a time window between two time references or from a time reference with an indicated time duration of N number of symbols for which a blocked status is reported).

Additionally, or alternatively, the status may include a measured energy or power of the path observed at an RP, array subarea, or array segment of the antenna array. The measured energy or power may include one or more of an absolute measured energy or power of the path observed at an RP, array subarea, or array segment, a relative measured energy or power of the path observed at an RP, array subarea, or array segment, (which may be normalized to one or more of a transmission energy or power, a total energy or power received by the sensing Rx node at one or more of a given time window, a given direction, or a given frequency or band window, the total energy or power received by the sensing Rx node at some or all of the RPs, array subareas, or array segments, or an energy or power ratio of non-blocked paths to the blocked paths), or a quantized value of the measured (absolute or relative) energy or power according to pre-configured or configured quantization thresholds (e.g., a relative measured power at an RP, array subarea, or array segment to the transmission power of a sensing signal and to the total received power across the sensing Rx array). Additionally, or alternatively, the status may include any of the path properties or measurement quantities described herein with reference to example 10 of FIG. 10 and example 11 of FIG. 11.

According to the described techniques, capability information of a radio node (e.g., a sensing Rx node, a sensing Tx node) associated with an antenna array may include multiple RPs, including one or more of an antenna RP, a physical or virtual antenna ID, index, or number, a position inside or outside of the physical antenna array, an ID or index corresponding to a position inside or outside of the physical antenna array, an array segment as a subset of the antenna array of the radio node or an ID or index associated with the array segment, an area (e.g., a 2D surface) inside, partially outside, or outside of the surface area of the array or an ID or index associated with the area, or a 3D box (or any 3D shape corresponding to a non-zero volume) including, subsuming, or coinciding with an inside, partial outside, or outside of an antenna array position or an ID or index associated with the 3D box. As such, the measurement of the radio node may be reported for one or multiple RPs.

In some examples, the supported measurement quantity types, functions of a measurement quantity (e.g., linear, polynomial, quadratic, and exponential functions), supported RPs (e.g., a supported RP grid over an antenna array), a number (e.g., a maximum number) of supported RPs, a description or configuration of the Ros (e.g., physical position of the RPs, physical description of the array segment or surface associated with the RP), are determined by the sensing Rx node or the sensing Tx node, and in some cases, indicated to the SensMF (e.g., SF, LMF, SMC residing in a RAN) as radio node capability information (e.g., of the sensing Rx node or the sensing Tx node).

In some implementations, the capability information of the sensing Rx node may include a number (e.g., a maximum number) of RPs for which the measurement quantities may be obtained and reported by the sensing Rx node concurrently (e.g., reported utilizing a same signal or a same measurement time window). For example, a measurement quantity of an AoA of a path associated with a sensing target may reported for RPs of the sensing Rx node to the SensMF.

In some cases, the capability information may include a capability of supporting X RPs (for measurement and reporting) with corresponding position and area information of $A_1, \ldots, A_X$. The capability information may also indicate a maximum number of Y RPs for which the measurements may be reported utilizing a same signal or a same measurement time window, or associated with the same channel or path.

Any of the capability information associated with the RPs described herein may, and any of the supported functions or patterns, may be different and/or reported separately for one or more of different array dimensions or different measurement types. The different array dimensions may include position, spacing, and a number of RPs or ARPs, number of concurrently reportable RPs or ARPs for x-y dimensions of a sensing Rx node according to the LCS of the corresponding array. The different measurement types may include capability information of the supported maximum number of RPs, a maximum number of concurrent RPs being reported, information about the RPs, and supported functions for reporting RPs (e.g., where an RP is reported once for a power or energy measurement quantity and once separately for an angle-related measurement quantity).

In some implementations, where any of the measurement quantities or statuses associated with a sensing Rx node is reported for one or more RPs, the RPs and/or a function for reporting the measurement quantity may be determined by the SensMF and indicated to the sensing Rx node via an indication or configuration information. That is, the sensing Rx node may receive signaling including the configuration information, and the sensing Rx node may receive sensing signals, generate measurement quantities, and determine status of paths or channel segments based on the configuration information. The configuration information may include one or more of a set of parameters associated with the sensing signal to be used for generating the measurement quantities, a type of measurement value to be reported, information associated with the channel segment for which the measurement quantities are to be reported, RPs of the antenna array for which the measurement quantities are to be generated, a configuration for transmission of the report, or a trigger for the transmission of the report.

The sensing Rx node may have previously informed the SensMF of the capability information, including information about one or more of the supported functions, supported RPs, or a recommendation of the function, pattern, number, and description of the RPs for reporting of a measurement quantity. As such, regarding the configuration of a sensing report of a sensing Rx node, the SensMF may determine a number of RPs and other information about the RPs for which the indicated reporting quantity is to be reported, at least based on prior capability information and/or a recommendation of the sensing Rx node The SensMF may configure the measurement reporting of the sensing Rx node according to the determination of the information about the RPs.

In some implementations, the number and other information related to the RPs, the function, or both for reporting the measurement quantities may be determined by the sensing Rx node, for example, based on the sensing Rx node capability and the variation of a measurement quantity over the array or over different RPs. As such, the measurement quantities may be reported by the sensing Rx node for one or more RPs determined by the sensing Rx node. In some cases, the sensing Rx node may determine the RP information and the function based on criteria or configuration information received from the SensMF. In some examples, the criteria or configuration information may include a required maximum accuracy of a measurement quantity over the array or over some directions of the array (e.g., x-axis according to the LCS of the array), or over multiple RPs (e.g., in some examples, the sensing Rx node reports measurements for a group of RPs such that the measurement for the array is represented with sufficient accuracy). Additionally, or alternatively, the criteria or configuration information may include a required maximum tolerable deviation or difference of a measurement quantity over an RP without being represented in a measurement report. When a measurement quantity of AoA of a path is inaccurately represented via a report of a single AoA value or pattern over a single RP (as an array or area segment) then the RP may be divided into two separate RPs (as two separate antennas or area segments), where an independent measurement report is generated by the sensing Rx for each of the obtained smaller RPs.

When a measurement quantity to be reported includes a pattern over the RPs of a sensing Rx array, the determination of the pattern may be performed jointly with the RP number and information by the SensMF or the sensing Rx node. The sensing Rx node may determine a subarea to which the status is applicable, where the subarea is based on one or more of the RPs or ARPs, an ID associated with a set of antenna RPs or an ID associated with a previously-determined subarea of an antenna array of the sensing Rx node, one or more boundaries of the subarea, a convex combination of two or more RPs or ARPs, or two or more previously-determined subareas of the antenna array. The boundary of the subarea may be based on one or more of a line segment having a first ARP at a start of the line segment and a second antenna RP at an end of the line segment, a direction according to which a half-space is determined for the antenna array of the sensing Rx node, or an indication that the subarea extends at least until an end of a physical area of the antenna array along an indicated direction (e.g., x-y axis). In some cases, the boundary may be located inside of the physical area of the antenna array, partially inside and partially outside of the physical area of the antenna array, or outside of the physical area of the antenna array.

By way of example, an RP of an array (e.g., at a sensing Tx node or a sensing Rx node) may be defined or interpreted as one or more of an apriori determined set of subarrays or areas associated with the sensing Rx node or the sensing Rx node, a subarray or an area index or ID, a union of two or more RPs (e.g., a union of two array segments or areas each represented by one of the RPs, a union or combination of multiple ARPs), an intersection of two or more RPs (e.g., intersection of two array segments or areas each represented by one of the RPs), one or multiple RPs where each RP represents a position (e.g., position of physical antenna elements or virtual points inside or outside of the array at which there may or may not be a physical antenna element, an area or array segment obtained by a convex combination of two or more of the RPs (e.g., a 2D rectangular or 3D box obtained as $\omega(RP_1, RP_2, RP_3, RP_4)$ as described with reference to FIGS. 12 and 13, where $\psi$ represents a set of points generated via a convex combination, or a 2D rectangular or 3D box obtained as a subset of its dimensions as a separate convex combination or RPs, which may include a 2D rectangular box for which the boundary of the x-axis is determined as $\psi(RP_1, RP_2)$ projected into the x-axis and the boundary of the y-axis is determined as $\psi(RP_3, RP_4)$ projected into the y-axis), or an area or array segment given as a subtraction of a second defined area or segment from a first defined area or segment.

Alternatively, in some variation of any of the techniques described herein, the blockage, LOS, and NLOS measurement and reporting may be associated with an antenna sub-array of multiple antenna sub-arrays within the antenna array of at least one of the sensing Tx node or the sensing Rx node, rather than a path. Any of the measurement quantities or the LOS, NLOS, or blockage statuses described herein may be associated with a channel segment which is not equivalent to a specific path, but rather a group of paths or a portion of the propagation channel that satisfies a property (e.g., the channel corresponding to the group of paths with an AoA between 30-45 degrees observable at the sensing Rx node). As such, the LOS, NLOS, or blockage status may be reported for one or more subarray or RPs of the sensing Tx node, the sensing Rx node, or both, and additionally with an identified channel segment to the sensing Rx node.

Figure 14:
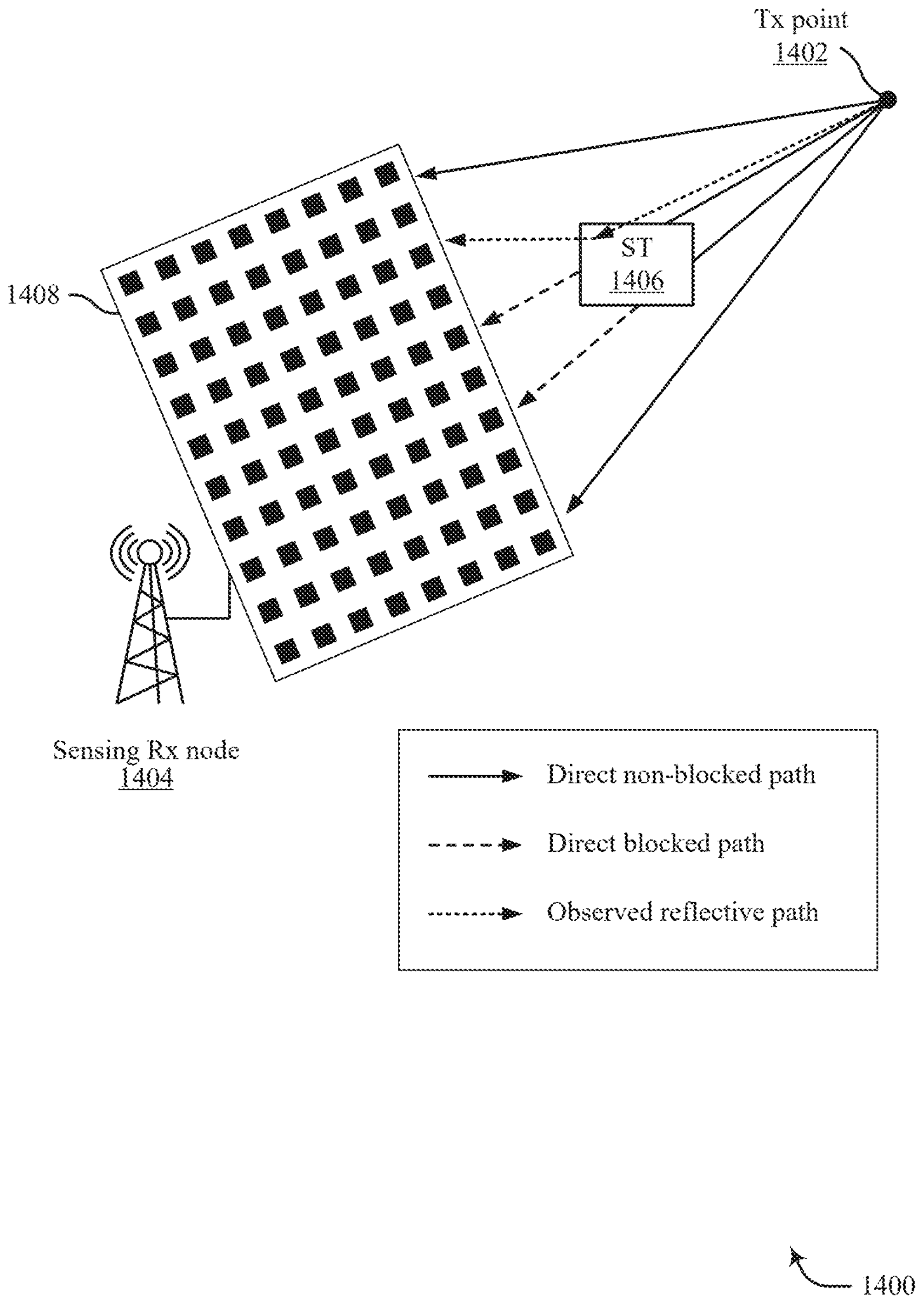
FIG. 14 illustrates an example of an extended sensing Rx node antenna array observing a reflected path in accordance with aspects of the present disclosure.

FIG. 14 illustrates an example 1400 of an extended sensing Rx node antenna array observing a reflected path in accordance with aspects of the present disclosure. In the example 1400, the sensing Rx node 1404 may observe, via an antenna array 1408 (e.g., an extended antenna array) a reflected path of an object causing a partial blockage status, where the blocked or NLOS status of the paths and the received and observed reflected path may be associated with the same object. The object may be a sensing target object (ST) 1406, the blocked/NLOS status of the path may correspond to a direct blocked path, and a non-blocked/LOS status of the path (e.g., before the ST 1406) may correspond to a direct non-blocked path.

As described herein with reference to the example 1200 of FIG. 12 and the example 1300 of FIG. 13, the sensing Rx node 1404 may report one or more LOS, NLOS, blocked, or non-blocked states of a path to a SensMF, where the path may be initiated from the Tx point 1402 of a sensing Tx node and terminated at the sensing Rx node 1404. To do so, the sensing Rx node 1404 may receive a sensing signal (e.g., from the Tx point 1402, via a path). The sensing Rx node 1404 may determine a status of a channel segment observed by the sensing Rx node 1404 over an area associated with the sensing Rx node 1404. That is, each of the states of the path may be associated with a subarea (also referred to herein as a segment or a subspace) of the antenna array 1408 of the sensing Rx node 1404. The sensing Rx node 1404 may also determine the subarea, where the status is applicable to the subarea and where the subarea is a portion of the area. The sensing Rx node 1404 may transmit a report indicating the status and the subarea. That is, the sensing Rx node 1404 may report the subarea of the antenna array 1408 for which the determined status holds. In some examples, the SensMF may derive sensing results of a sensing task based at least on reception of the measurement report, including an association of a blockage status to multiple receiver array segments or RPs.

In some examples, the reported status of a path is further indicated by the sensing Rx node 1404 to the SensMF as a measurement report, or by the SensMF to the sensing Rx node 1404 as assisting information for sensing measurements and processing. In some examples, the reported status may be associated with an object which is previously known (e.g., the sensing Rx node 1404 may report a blockage status over a set of RPs, array subareas, or array segments as associated with or caused by an object indicated with an object ID X). In some examples, the association of a first path with a blocked status and a second (reflective) path observed by the sensing Rx node 1404 may be determined and indicated via a QCL or geometric path relationship, indicating the reflecting or scattering object associated with the scattering or reflection of the second path and the blocking object associated with the blockage status of the first path are the same or collocated objects.

In some other examples, the reported status may be associated with other paths observed by the sensing Rx node 1404 via the same or different RPs, array subareas, or array segments of the sensing Rx node 1404, where the other paths may be determined as being caused by the same object that caused the blockage condition (e.g., the ST 1406). In the example 1400, the ST 1406 may block a path toward one or multiple RPs, array subareas, or array segments of the antenna array 1408 of the sensing Rx node 1404. The ST 1406 may generate additional reflective paths (e.g., observed reflective paths) toward one or multiple RPs, array subareas, or array segments of the antenna array 1408 of the sensing Rx node 1404. That is, in addition to a blockage effect of a previously observable path, the ST 1406 may generate additional reflective paths toward the sensing Rx node 1404, which may differ in one or more of delay, angle, and Doppler toward the RPs, array subareas, or array segments corresponding to the sensing Rx node 1404. In this way, the sensing Rx node 1404 may report measurements of the additional reflective paths caused by the presence of the ST 1406 together with the report of the blockage status of the path, where the blocked path and the additional path (from the view of the antenna array 1408 or one or more of the RPs, array subareas, or array segments of the sensing Rx node 1404) are indicated as being associated with the same object, the ST 1406. In such example, the report of the observed reflective paths includes measured path parameters at different RPs, array subareas, or array segments (e.g., delay, Doppler, angle, micro-Doppler, vibration, energy and power, and so forth).

Additionally, or alternatively, the reported status may be associated with properties or features associated with the object causing the blocked or partially-blocked status (e.g., the ST 1406). For example, the properties may include shape, type, or mobility pattern, including being static or mobile, or a velocity value and direction of the blocked object.

In some implementations, the report from the sensing Rx node 1404 (associated with a path, a channel segment, or a ray group) may include an indication of explicit blockage boundaries. For example, the sensing Rx node 1404 may report a drop in energy across a horizontal direction of the antenna array 1408, including horizontal positions of the antenna array 1408 for which the energy drop occurs. Additionally, or alternatively, the report may indicate a type of the blockage effect, where the blockage boundaries may or may not be directly observable within an area of the antenna array 1408. In some cases, a first blockage boundary may be observed and measured over an area, where another blockage boundary may not be directly observable over or across the area. In such cases, the report of the blockage status may include one or more of a first directly measured boundary, a direction of the blockage area (e.g., toward a direction within the array, such as toward a right, up, or down direction, or a direction according to an indicated or pre-defined coordinate system of the LCS of the sensing Rx array), an indication that eh blockage exceeded the boundary, array edges which are under the blockage status, or an estimated blockage boundary based on the measurements over the array (e.g., a reported blockage boundary is outside of the physical and measurable array area and is indicated as being an estimated blockage boundary).

In some examples, a blockage status may be reported (e.g., for a path, a path group, or a channel segment) by the sensing Rx node 1404, where all the blockage boundaries are outside of the physical area of the antenna array 1408 (e.g., all of the area of the array is experiencing a blockage status). In such cases, the report of the path status may include one or more of an indication of a blockage observable outside of the physical area of the antenna array 1408, one or more edges of the array which are closest to the observable blockage boundaries, an estimated closest blockage boundary (e.g., a blockage boundary described or defined via, e.g., a line segment including two vertices or as one or multiple RPs) located outside of the physical area of the antenna array 1408, a set of the estimated blockage boundaries located outside of the physical area of the antenna array 1408, or the observed energy of the path or channel segment at the antenna array 1408 of at an RP of the antenna array 1408.

In some examples, the report of the blockage condition over the antenna array 1408 of the sensing Rx node 1404 may include an index from a codebook or a table, where the codebook or table includes different blockage conditions of a path or a channel segment related to the antenna array 1408 (e.g., the codebook may include a set of pre-defined statuses of the channel segment). An example of such a codebook or table is provided in Table 5.

TABLE 5

Example types of the blockage condition

| Status | Description | Reporting parameter/values (parameter/fields of one row can be used in another row) |
|---|---|---|
| FullBlockage | The blockage effect (a region with a blocked/NLOS status) is detected/observed over the full array; the boundary of the blocked area are not inside the physical array area. | Blockage loss value, associated path/channel segment/path group, estimated blockage region/area external boundary external to the physical array area (line segments/edges, set of RPs, set of the line segments ($P_i$, $P_j$) where the line segment is obtained via a convex combination of the points $P_i$, $P_j$ defined in a given/known coordinate system to the sensing Rx node) |
| FullPartialBlockage | The blockage effect (a region with a blocked/NLOS status) is detected/observed over a part of the array; the blocked area is located internal to the array area. | Blockage area boundary within the array, blockage loss value, associated path/channel segment/path group |

TABLE 5-continued

| Example types of the blockage condition | | |
|---|---|---|
| Status | Description | Reporting parameter/values (parameter/fields of one row can be used in another row) |
| HalfBlockage | The blockage effect (a region with a blocked/NLOS status) is detected/observed over a part of the array; at least part of the blockage boundaries is not within the physical array area and/or at least one of the edges of the antenna array is within the blocked area. | Blockage area boundary within the array, blockage loss value, associated path/channel segment/path group, estimated blockage area external boundary direction (according to a known/indicated coordinate system) over which the blockage status will hold until the end of the physical array area (e.g., right direction from a defined edge/line segment/RP, defining the blockage status holds for all the physical array located at the right-hand side of the defined edge/line segment/RP) |
| ExternalBlockage | The blockage effect (a region with a blocked/NLOS status) is not detected/observed over a part of the array, however it is estimated/predicted at an area external to the physical array area. | Energy/loss pattern over the array or over the RPs associated with/close to/in the vicinity of the predicted/estimated blocked area, blockage area boundaries external to the array, the closest edge of the array to the predicted blocked area external to the array, estimated distance of the blocked area to the edge of an antenna array |
| . . . | . . . | . . . |

By way of example and as described in Table 5, a blocked status may include a full-blocked status (e.g., FullBlockage), where the area of the antenna array of the sensing Rx node may be in the full-blocked state, a partial-blocked state (e.g., FullPartialBlockage or HalfBlockage) in which a first portion of the antenna array is in a blocked state and a second portion of the antenna array is in an unblocked state, or an external-blocked state (e.g., ExternalBlockage), where the area of the antenna array is in an unblocked state and a blockage is predicted outside of a physical area of the antenna array.

In some examples, the report of the blockage condition over the antenna array 1408 of the sensing Rx node 1404 may include an index from a codebook or a table, where the codebook or table includes different blockage conditions of a path or a channel segment related to the antenna array 1408. An example of such a codebook or table is provided in Table 5.

Figure 15:
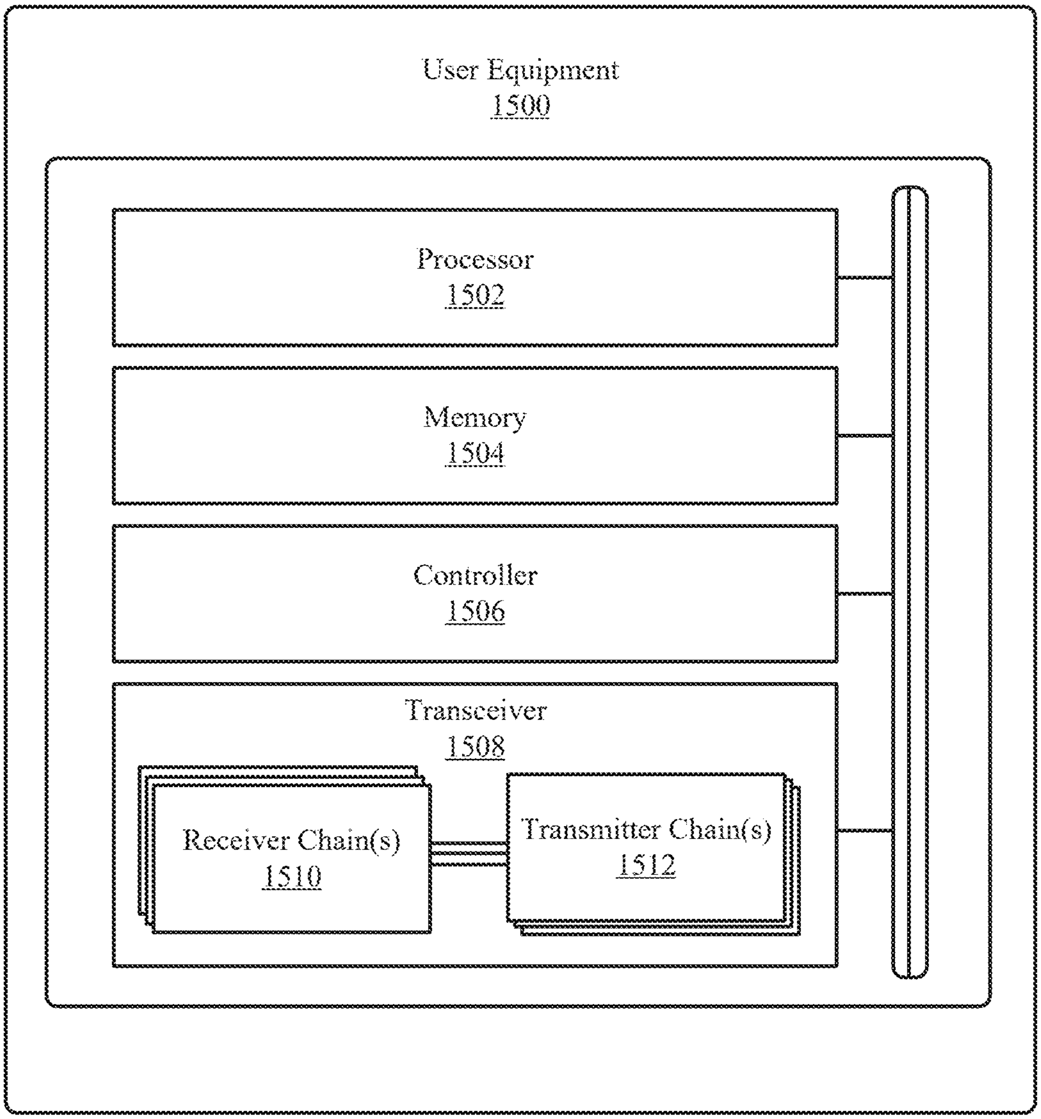
FIG. 15 illustrates an example of a UE in accordance with aspects of the present disclosure.

FIG. 15 illustrates an example of a UE 1500 in accordance with aspects of the present disclosure. The UE 1500 may include a processor 1502, a memory 1504, a controller 1506, and a transceiver 1508. The processor 1502, the memory 1504, the controller 1506, or the transceiver 1508, or various combinations thereof or various components thereof may be examples of means for performing various aspects of the present disclosure as described herein. These components may be coupled (e.g., operatively, communicatively, functionally, electronically, electrically) via one or more interfaces.

The processor 1502, the memory 1504, the controller 1506, or the transceiver 1508, or various combinations or components thereof may be implemented in hardware (e.g., circuitry). The hardware may include a processor, a digital signal processor (DSP), an application-specific integrated circuit (ASIC), or other programmable logic device, or any combination thereof configured as or otherwise supporting a means for performing the functions described in the present disclosure.

The processor 1502 may include an intelligent hardware device (e.g., a general-purpose processor, a DSP, a CPU, an ASIC, an FPGA, or any combination thereof). In some implementations, the processor 1502 may be configured to operate the memory 1504. In some other implementations, the memory 1504 may be integrated into the processor 1502. The processor 1502 may be configured to execute computer-readable instructions stored in the memory 1504 to cause the UE 1500 to perform various functions of the present disclosure.

The memory 1504 may include volatile or non-volatile memory. The memory 1504 may store computer-readable, computer-executable code including instructions when executed by the processor 1502 cause the UE 1500 to perform various functions described herein. The code may be stored in a non-transitory computer-readable medium such as the memory 1504 or another type of memory. Computer-readable media includes both non-transitory computer storage media and communication media including any medium that facilitates transfer of a computer program from one place to another. A non-transitory storage medium may be any available medium that may be accessed by a general-purpose or special-purpose computer.

In some implementations, the processor 1502 and the memory 1504 coupled with the processor 1502 may be configured to cause the UE 1500 to perform one or more of the functions described herein (e.g., executing, by the processor 1502, instructions stored in the memory 1504). For example, the processor 1502 may support wireless communication at the UE 1500 in accordance with examples as disclosed herein. The UE 1500 may be configured to or operable to support a means for receiving, from a second device, a sensing signal; determine a differential measurement quantity based on the sensing signal, where the differential measurement quantity indicates a difference between a first measurement of a first channel segment associated with the first device at a first RP and a second measurement of a second channel segment associated with the first device at a second RP, and where the first RP and the second RP are associated with one or more antenna arrays of the first device; and transmit, to the second device, a report including the differential measurement quantity.

Additionally, the UE 1500 may be configured to support any one or combination of the differential measurement quantity including one of more dependencies in accordance with a difference between a first differential measurement quantity type and a second differential measurement quantity type based on one or more of: a first sensing transmitter node and a second sensing transmitter node that transmit the sensing signal for which the first differential measurement quantity type and the second differential measurement quantity type are determined; a first sensing receiver node and a second sensing receiver node that receive the sensing signal for which the first differential measurement quantity type and the second differential measurement quantity type are determined; a first transmission RP corresponding to the first sensing transmitter node and a second transmission RP corresponding to the second sensing transmitter node for which the first differential measurement quantity type and the second differential measurement quantity type are determined; a first reception RP corresponding to the first sensing receiver node and a second reception RP corresponding to the second sensing receiver node for which the first differential measurement quantity type and the second differential measurement quantity type are determined; the first channel segment and the second channel segment for which the first differential measurement quantity type and the second differential measurement quantity type are determined; a first signal transmitted by the first sensing transmitter node and received by the first sensing receiver node and a second signal transmitted by the second sensing transmitter node and received by the second sensing receiver node for which the first differential measurement quantity type and the second differential measurement quantity type are determined; a first time period and a second time period based on which the first differential measurement quantity type and the second differential measurement quantity type are determined; or a third time period and a fourth time people for which the first differential measurement quantity type and the second differential measurement quantity type are valid.

Additionally, or alternatively, the UE 1500 may be configured to support the differential measurement quantity including one or more of a time difference of arrival, an angle difference of arrival, or a doppler shift difference of arrival between the first channel segment received via the first RP and the second channel segment received via the second RP. Additionally, or alternatively, the UE 1500 may be configured to support the differential measurement quantity including one or more of a time difference or a frequency difference between reception of the first channel segment via the first RP and transmission of the second channel segment via the second RP. Additionally, or alternatively, the UE 1500 may be configured to support determining a second differential measurement quantity over one or more RPs of at least one of the one or more antenna arrays, a full antenna array, or a segment of an antenna array and a variation measurement of the second differential measurement quantity; and transmit a second report indicating the second differential measurement quantity and the variation measurement.

Additionally, or alternatively, the UE 1500 may be configured to support determining a quantity of differential measurements, a quantity of RPs for which the differential measurements are to be reported, and a quantity of RP pairs for which the differential measurements are to be reported over a channel segment. Additionally, or alternatively, the UE 1500 may be configured to support a differential measurement quantity type including one or more of time-based measurements, doppler-based measurements, phase-based measurements, angle-based measurements, energy-based measurements, power-based measurements, micro-doppler measurements, vibration-rate measurements, or information associated with sensing results of a sensing target. Additionally, or alternatively, the UE 1500 may be configured to support a channel segment including one or more of: a direct propagation path or a direct ray between the first device and the second device; an indirect propagation path or an indirect ray between the first device and the second device that is associated with a scattering point of a scattering object; or multiple propagation paths or multiple rays between the first device and the second device that are associated with at least one of the scattering object or a property of a propagation path or a ray.

Additionally, or alternatively, the UE 1500 may be configured to support receiving signaling including configuration information, and where reception of the sensing signal and determination of the differential measurement quantity are based on the configuration information. Additionally, or alternatively, the UE 1500 may be configured to support the configuration information including one or more of: a set of parameters associated the sensing signal to be used for determining the differential measurement quantity; a type of differential measurement quantity to be reported; information associated with a channel segment for which the differential measurement quantity is to be reported; RPs of the one or more antenna arrays for which the differential measurement quantity is to be determined; a configuration for transmission of the report; or a trigger for the transmission of the report. Additionally, or alternatively, the UE 1500 may be configured to support the configuration information indicating a boundary of an RP as a segment of the one or more antenna arrays. Additionally, or alternatively, the UE 1500 may be configured to support the sensing signal including one or more of a reference signal, a data channel, or a control channel associated with one or more of a downlink direction, an uplink direction, a sidelink direction, or a gNB-to-gNB transmission direction. Additionally, or alternatively, the UE 1500 may be configured to support the first RP being the same as the second RP or is different from the second RP.

Additionally, or alternatively, the UE 1500 may support at least one memory (e.g., the memory 1504) and at least one processor (e.g., the processor 1502) coupled with the at least one memory and configured to cause the UE 1500 to receive, from a second device, a sensing signal; determine a differential measurement quantity based on the sensing signal, where the differential measurement quantity indicates a difference between a first measurement of a first channel segment associated with the first device at a first RP and a second measurement of a second channel segment associated with the first device at a second RP, and where the first RP and the second RP are associated with one or more antenna arrays of the first device; and transmit, to the second device, a report including the differential measurement quantity.

Additionally, the UE 1500 may be configured to support any one or combination of the differential measurement quantity including one of more dependencies in accordance with a difference between a first differential measurement quantity type and a second differential measurement quantity type based on one or more of: a first sensing transmitter node and a second sensing transmitter node that transmit the sensing signal for which the first differential measurement quantity type and the second differential measurement quantity type are determined; a first sensing receiver node and a second sensing receiver node that receive the sensing signal for which the first differential measurement quantity type and the second differential measurement quantity type are determined; a first transmission RP corresponding to the first sensing transmitter node and a second transmission RP corresponding to the second sensing transmitter node for which the first differential measurement quantity type and the second differential measurement quantity type are determined; a first reception RP corresponding to the first sensing receiver node and a second reception RP corresponding to the second sensing receiver node for which the first differential measurement quantity type and the second differential measurement quantity type are determined; the first channel segment and the second channel segment for which the first differential measurement quantity type and the second differential measurement quantity type are determined; a first signal transmitted by the first sensing transmitter node and received by the first sensing receiver node and a second signal transmitted by the second sensing transmitter node and received by the second sensing receiver node for which the first differential measurement quantity type and the second differential measurement quantity type are determined; a first time period and a second time period based on which the first differential measurement quantity type and the second differential measurement quantity type are determined; or a third time period and a fourth time people for which the first differential measurement quantity type and the second differential measurement quantity type are valid.

Additionally, or alternatively, the UE 1500 may be configured to support the differential measurement quantity including one or more of a time difference of arrival, an angle difference of arrival, or a doppler shift difference of arrival between the first channel segment received via the first RP and the second channel segment received via the second RP. Additionally, or alternatively, the UE 1500 may be configured to support the differential measurement quantity including one or more of a time difference or a frequency difference between reception of the first channel segment via the first RP and transmission of the second channel segment via the second RP. Additionally, or alternatively, the UE 1500 may be configured to support determining a second differential measurement quantity over one or more RPs of at least one of the one or more antenna arrays, a full antenna array, or a segment of an antenna array and a variation measurement of the second differential measurement quantity; and transmit a second report indicating the second differential measurement quantity and the variation measurement.

Additionally, or alternatively, the UE 1500 may be configured to support determining a quantity of differential measurements, a quantity of RPs for which the differential measurements are to be reported, and a quantity of RP pairs for which the differential measurements are to be reported over a channel segment. Additionally, or alternatively, the UE 1500 may be configured to support a differential measurement quantity type including one or more of time-based measurements, doppler-based measurements, phase-based measurements, angle-based measurements, energy-based measurements, power-based measurements, micro-doppler measurements, vibration-rate measurements, or information associated with sensing results of a sensing target. Additionally, or alternatively, the UE 1500 may be configured to support a channel segment including one or more of: a direct propagation path or a direct ray between the first device and the second device; an indirect propagation path or an indirect ray between the first device and the second device that is associated with a scattering point of a scattering object; or multiple propagation paths or multiple rays between the first device and the second device that are associated with at least one of the scattering object or a property of a propagation path or a ray.

Additionally, or alternatively, the UE 1500 may be configured to support receiving signaling including configuration information, and where reception of the sensing signal and determination of the differential measurement quantity are based on the configuration information. Additionally, or alternatively, the UE 1500 may be configured to support the configuration information including one or more of: a set of parameters associated the sensing signal to be used for determining the differential measurement quantity; a type of differential measurement quantity to be reported; information associated with a channel segment for which the differential measurement quantity is to be reported; RPs of the one or more antenna arrays for which the differential measurement quantity is to be determined; a configuration for transmission of the report; or a trigger for the transmission of the report. Additionally, or alternatively, the UE 1500 may be configured to support the configuration information indicating a boundary of an RP as a segment of the one or more antenna arrays. Additionally, or alternatively, the UE 1500 may be configured to support the sensing signal including one or more of a reference signal, a data channel, or a control channel associated with one or more of a downlink direction, an uplink direction, a sidelink direction, or a gNB-to-gNB transmission direction. Additionally, or alternatively, the UE 1500 may be configured to support the first RP being the same as the second RP or is different from the second RP.

The controller 1506 may manage input and output signals for the UE 1500. The controller 1506 may also manage peripherals not integrated into the UE 1500. In some implementations, the controller 1506 may utilize an operating system such as iOS®, ANDROID®, WINDOWS®, or other operating systems. In some implementations, the controller 1506 may be implemented as part of the processor 1502.

In some implementations, the UE 1500 may include at least one transceiver 1508. In some other implementations, the UE 1500 may have more than one transceiver 1508. The transceiver 1508 may represent a wireless transceiver. The transceiver 1508 may include one or more receiver chains 1510, one or more transmitter chains 1512, or a combination thereof.

A receiver chain 1510 may be configured to receive signals (e.g., control information, data, packets) over a wireless medium. For example, the receiver chain 1510 may include one or more antennas to receive a signal over the air or wireless medium. The receiver chain 1510 may include at least one amplifier (e.g., a low-noise amplifier (LNA)) configured to amplify the received signal. The receiver chain 1510 may include at least one demodulator configured to demodulate the receive signal and obtain the transmitted data by reversing the modulation technique applied during transmission of the signal. The receiver chain 1510 may include at least one decoder for decoding the demodulated signal to receive the transmitted data.

A transmitter chain 1512 may be configured to generate and transmit signals (e.g., control information, data, packets). The transmitter chain 1512 may include at least one modulator for modulating data onto a carrier signal, preparing the signal for transmission over a wireless medium. The at least one modulator may be configured to support one or more techniques such as amplitude modulation (AM), frequency modulation (FM), or digital modulation schemes like phase-shift keying (PSK) or quadrature amplitude modulation (QAM). The transmitter chain 1512 may also include at least one power amplifier configured to amplify the modulated signal to an appropriate power level suitable for transmission over the wireless medium. The transmitter chain 1512 may also include one or more antennas for transmitting the amplified signal into the air or wireless medium.

Figure 16:
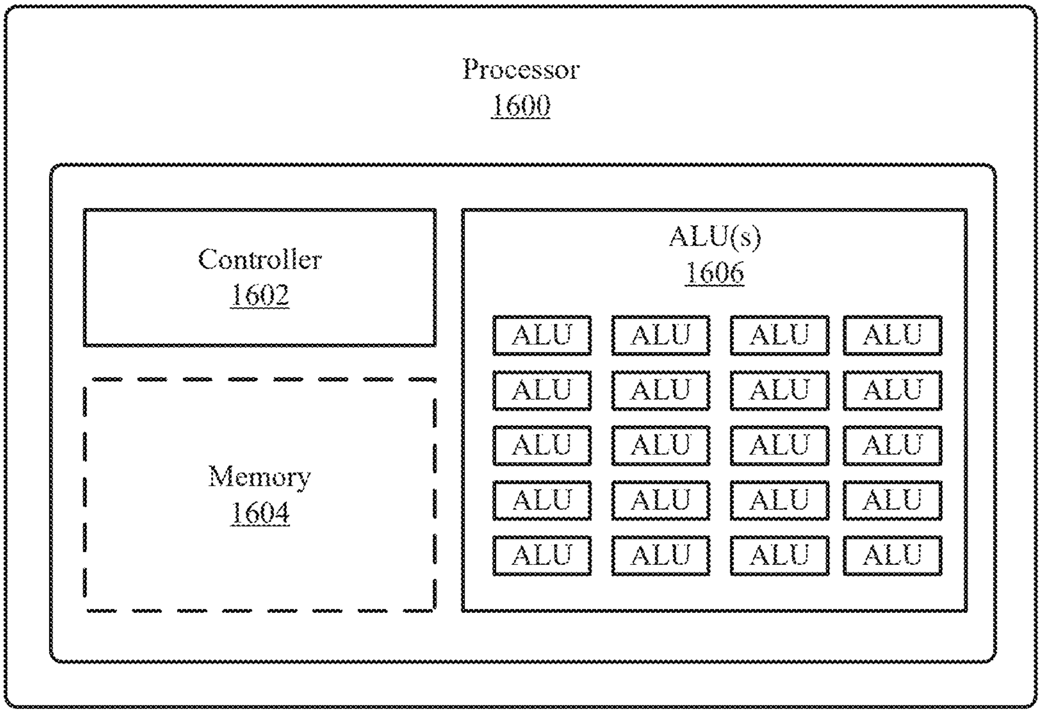
FIG. 16 illustrates an example of a processor in accordance with aspects of the present disclosure.

FIG. 16 illustrates an example of a processor 1600 in accordance with aspects of the present disclosure. The processor 1600 may be an example of a processor configured to perform various operations in accordance with examples as described herein. The processor 1600 may include a controller 1602 configured to perform various operations in accordance with examples as described herein. The processor 1600 may optionally include at least one memory 1604, which may be, for example, an L1/L2/L3 cache. Additionally, or alternatively, the processor 1600 may optionally include one or more arithmetic-logic units (ALUs) 1606. One or more of these components may be in electronic communication or otherwise coupled (e.g., operatively, communicatively, functionally, electronically, electrically) via one or more interfaces (e.g., buses).

The processor 1600 may be a processor chipset and include a protocol stack (e.g., a software stack) executed by the processor chipset to perform various operations (e.g., receiving, obtaining, retrieving, transmitting, outputting, forwarding, storing, determining, identifying, accessing, writing, reading) in accordance with examples as described herein. The processor chipset may include one or more cores, one or more caches (e.g., memory local to or included in the processor chipset (e.g., the processor 1600) or other memory (e.g., random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), and others).

The controller 1602 may be configured to manage and coordinate various operations (e.g., signaling, receiving, obtaining, retrieving, transmitting, outputting, forwarding, storing, determining, identifying, accessing, writing, reading) of the processor 1600 to cause the processor 1600 to support various operations in accordance with examples as described herein. For example, the controller 1602 may operate as a control unit of the processor 1600, generating control signals that manage the operation of various components of the processor 1600. These control signals include enabling or disabling functional units, selecting data paths, initiating memory access, and coordinating timing of operations.

The controller 1602 may be configured to fetch (e.g., obtain, retrieve, receive) instructions from the memory 1604 and determine subsequent instruction(s) to be executed to cause the processor 1600 to support various operations in accordance with examples as described herein. The controller 1602 may be configured to track memory addresses of instructions associated with the memory 1604. The controller 1602 may be configured to decode instructions to determine the operation to be performed and the operands involved. For example, the controller 1602 may be configured to interpret the instruction and determine control signals to be output to other components of the processor 1600 to cause the processor 1600 to support various operations in accordance with examples as described herein. Additionally, or alternatively, the controller 1602 may be configured to manage flow of data within the processor 1600. The controller 1602 may be configured to control transfer of data between registers, ALUs 1606, and other functional units of the processor 1600.

The memory 1604 may include one or more caches (e.g., memory local to or included in the processor 1600 or other memory, such as RAM, ROM, DRAM, SDRAM, SRAM, MRAM, flash memory, etc. In some implementations, the memory 1604 may reside within or on a processor chipset (e.g., local to the processor 1600). In some other implementations, the memory 1604 may reside external to the processor chipset (e.g., remote to the processor 1600).

The memory 1604 may store computer-readable, computer-executable code including instructions that, when executed by the processor 1600, cause the processor 1600 to perform various functions described herein. The code may be stored in a non-transitory computer-readable medium such as system memory or another type of memory. The controller 1602 and/or the processor 1600 may be configured to execute computer-readable instructions stored in the memory 1604 to cause the processor 1600 to perform various functions. For example, the processor 1600 and/or the controller 1602 may be coupled with or to the memory 1604, the processor 1600, and the controller 1602, and may be configured to perform various functions described herein. In some examples, the processor 1600 may include multiple processors and the memory 1604 may include multiple memories. One or more of the multiple processors may be coupled with one or more of the multiple memories, which may, individually or collectively, be configured to perform various functions herein.

The one or more ALUs 1606 may be configured to support various operations in accordance with examples as described herein. In some implementations, the one or more ALUs 1606 may reside within or on a processor chipset (e.g., the processor 1600). In some other implementations, the one or more ALUs 1606 may reside external to the processor chipset (e.g., the processor 1600). One or more ALUs 1606 may perform one or more computations such as addition, subtraction, multiplication, and division on data. For example, one or more ALUs 1606 may receive input operands and an operation code, which determines an operation to be executed. One or more ALUs 1606 may be configured with a variety of logical and arithmetic circuits, including adders, subtractors, shifters, and logic gates, to process and manipulate the data according to the operation. Additionally, or alternatively, the one or more ALUs 1606 may support logical operations such as AND, OR, exclusive-OR (XOR), not-OR (NOR), and not-AND (NAND), enabling the one or more ALUs 1606 to handle conditional operations, comparisons, and bitwise operations.

The processor 1600 may support wireless communication in accordance with examples as disclosed herein. The processor 1600 may be configured to or operable to support at least one controller (e.g., the controller 1602) coupled with at least one memory (e.g., the memory 1604) and configured to cause the processor to receive, from a second device, a sensing signal; determine a differential measurement quantity based on the sensing signal, where the differential measurement quantity indicates a difference between a first measurement of a first channel segment associated with the first device at a first RP and a second measurement of a second channel segment associated with the first device at a second RP, and where the first RP and the second RP are associated with one or more antenna arrays of the first device; and transmit, to the second device, a report including the differential measurement quantity.

Additionally, the processor 1600 may be configured to or operable to support any one or combination of the differential measurement quantity including one of more dependencies in accordance with a difference between a first differential measurement quantity type and a second differential measurement quantity type based on one or more of: a first sensing transmitter node and a second sensing transmitter node that transmit the sensing signal for which the first differential measurement quantity type and the second differential measurement quantity type are determined; a first sensing receiver node and a second sensing receiver node that receive the sensing signal for which the first differential measurement quantity type and the second differential measurement quantity type are determined; a first transmission RP corresponding to the first sensing transmitter node and a second transmission RP corresponding to the second sensing transmitter node for which the first differential measurement quantity type and the second differential measurement quantity type are determined; a first reception RP corresponding to the first sensing receiver node and a second reception RP corresponding to the second sensing receiver node for which the first differential measurement quantity type and the second differential measurement quantity type are determined; the first channel segment and the second channel segment for which the first differential measurement quantity type and the second differential measurement quantity type are determined; a first signal transmitted by the first sensing transmitter node and received by the first sensing receiver node and a second signal transmitted by the second sensing transmitter node and received by the second sensing receiver node for which the first differential measurement quantity type and the second differential measurement quantity type are determined; a first time period and a second time period based on which the first differential measurement quantity type and the second differential measurement quantity type are determined; or a third time period and a fourth time people for which the first differential measurement quantity type and the second differential measurement quantity type are valid.

Additionally, or alternatively, the processor 1600 may be configured to support the differential measurement quantity including one or more of a time difference of arrival, an angle difference of arrival, or a doppler shift difference of arrival between the first channel segment received via the first RP and the second channel segment received via the second RP. Additionally, or alternatively, the processor 1600 may be configured to support the differential measurement quantity including one or more of a time difference or a frequency difference between reception of the first channel segment via the first RP and transmission of the second channel segment via the second RP. Additionally, or alternatively, the processor 1600 may be configured to support determining a second differential measurement quantity over one or more RPs of at least one of the one or more antenna arrays, a full antenna array, or a segment of an antenna array and a variation measurement of the second differential measurement quantity; and transmit a second report indicating the second differential measurement quantity and the variation measurement.

Additionally, or alternatively, the processor 1600 may be configured to support determining a quantity of differential measurements, a quantity of RPs for which the differential measurements are to be reported, and a quantity of RP pairs for which the differential measurements are to be reported over a channel segment. Additionally, or alternatively, the processor 1600 may be configured to support a differential measurement quantity type including one or more of time-based measurements, doppler-based measurements, phase-based measurements, angle-based measurements, energy-based measurements, power-based measurements, micro-doppler measurements, vibration-rate measurements, or information associated with sensing results of a sensing target. Additionally, or alternatively, the processor 1600 may be configured to support a channel segment including one or more of: a direct propagation path or a direct ray between the first device and the second device; an indirect propagation path or an indirect ray between the first device and the second device that is associated with a scattering point of a scattering object; or multiple propagation paths or multiple rays between the first device and the second device that are associated with at least one of the scattering object or a property of a propagation path or a ray.

Additionally, or alternatively, the processor 1600 may be configured to support receiving signaling including configuration information, and where reception of the sensing signal and determination of the differential measurement quantity are based on the configuration information. Additionally, or alternatively, the processor 1600 may be configured to support the configuration information including one or more of: a set of parameters associated the sensing signal to be used for determining the differential measurement quantity; a type of differential measurement quantity to be reported; information associated with a channel segment for which the differential measurement quantity is to be reported; RPs of the one or more antenna arrays for which the differential measurement quantity is to be determined; a configuration for transmission of the report; or a trigger for the transmission of the report. Additionally, or alternatively, the processor 1600 may be configured to support the configuration information indicating a boundary of an RP as a segment of the one or more antenna arrays. Additionally, or alternatively, the processor 1600 may be configured to support the sensing signal including one or more of a reference signal, a data channel, or a control channel associated with one or more of a downlink direction, an uplink direction, a sidelink direction, or a gNB-to-gNB transmission direction. Additionally, or alternatively, the processor 1600 may be configured to support the first RP being the same as the second RP or is different from the second RP.

Figure 17:
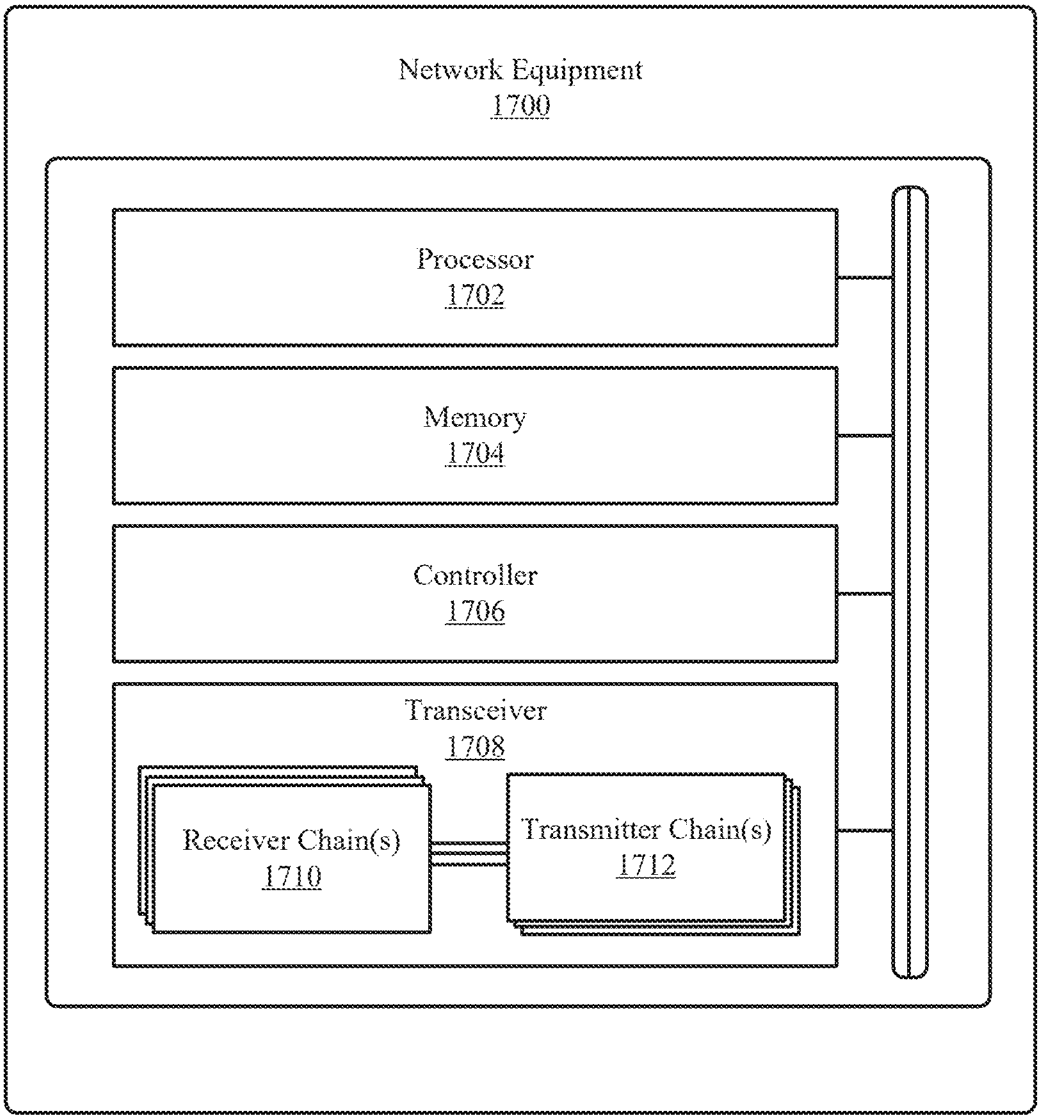
FIG. 17 illustrates an example of an NE in accordance with aspects of the present disclosure.

FIG. 17 illustrates an example of an NE 1700 in accordance with aspects of the present disclosure. The NE 1700 may include a processor 1702, a memory 1704, a controller 1706, and a transceiver 1708. The processor 1702, the memory 1704, the controller 1706, or the transceiver 1708, or various combinations thereof or various components thereof may be examples of means for performing various aspects of the present disclosure as described herein. These components may be coupled (e.g., operatively, communicatively, functionally, electronically, electrically) via one or more interfaces.

The processor 1702, the memory 1704, the controller 1706, or the transceiver 1708, or various combinations or components thereof may be implemented in hardware (e.g., circuitry). The hardware may include a processor, a digital signal processor (DSP), an application-specific integrated circuit (ASIC), or other programmable logic device, or any combination thereof configured as or otherwise supporting a means for performing the functions described in the present disclosure.

The processor 1702 may include an intelligent hardware device (e.g., a general-purpose processor, a DSP, a CPU, an ASIC, an FPGA, or any combination thereof). In some implementations, the processor 1702 may be configured to operate the memory 1704. In some other implementations, the memory 1704 may be integrated into the processor 1702. The processor 1702 may be configured to execute computer-readable instructions stored in the memory 1704 to cause the NE 1700 to perform various functions of the present disclosure.

The memory 1704 may include volatile or non-volatile memory. The memory 1704 may store computer-readable, computer-executable code including instructions when executed by the processor 1702 cause the NE 1700 to perform various functions described herein. The code may be stored in a non-transitory computer-readable medium such as the memory 1704 or another type of memory. Computer-readable media includes both non-transitory computer storage media and communication media including any medium that facilitates transfer of a computer program from one place to another. A non-transitory storage medium may be any available medium that may be accessed by a general-purpose or special-purpose computer.

In some implementations, the processor 1702 and the memory 1704 coupled with the processor 1702 may be configured to cause the NE 1700 to perform one or more of the functions described herein (e.g., executing, by the processor 1702, instructions stored in the memory 1704). For example, the processor 1702 may support wireless communication at the NE 1700 in accordance with examples as disclosed herein. The NE 1700 may be configured to or operable to support a means for receiving, from a second device, a sensing signal; determining a differential measurement quantity based on the sensing signal, where the differential measurement quantity indicates a difference between a first measurement of a first channel segment associated with the first device at a first RP and a second measurement of a second channel segment associated with the first device at a second RP, and where the first RP and the second RP are associated with one or more antenna arrays of the first device; and transmitting, to the second device, a report including the differential measurement quantity.

Additionally, the NE 1700 may be configured to support any one or combination of the differential measurement quantity including one of more dependencies in accordance with a difference between a first differential measurement quantity type and a second differential measurement quantity type based on one or more of: a first sensing transmitter node and a second sensing transmitter node that transmit the sensing signal for which the first differential measurement quantity type and the second differential measurement quantity type are determined; a first sensing receiver node and a second sensing receiver node that receive the sensing signal for which the first differential measurement quantity type and the second differential measurement quantity type are determined; a first transmission RP corresponding to the first sensing transmitter node and a second transmission RP corresponding to the second sensing transmitter node for which the first differential measurement quantity type and the second differential measurement quantity type are determined; a first reception RP corresponding to the first sensing receiver node and a second reception RP corresponding to the second sensing receiver node for which the first differential measurement quantity type and the second differential measurement quantity type are determined; the first channel segment and the second channel segment for which the first differential measurement quantity type and the second differential measurement quantity type are determined; a first signal transmitted by the first sensing transmitter node and received by the first sensing receiver node and a second signal transmitted by the second sensing transmitter node and received by the second sensing receiver node for which the first differential measurement quantity type and the second differential measurement quantity type are determined; a first time period and a second time period based on which the first differential measurement quantity type and the second differential measurement quantity type are determined; or a third time period and a fourth time people for which the first differential measurement quantity type and the second differential measurement quantity type are valid.

Additionally, or alternatively, the NE 1700 may be configured to support the differential measurement quantity including one or more of a time difference of arrival, an angle difference of arrival, or a doppler shift difference of arrival between the first channel segment received via the first RP and the second channel segment received via the second RP. Additionally, or alternatively, the NE 1700 may be configured to support the differential measurement quantity including one or more of a time difference or a frequency difference between reception of the first channel segment via the first RP and transmission of the second channel segment via the second RP. Additionally, or alternatively, the NE 1700 may be configured to support determining a second differential measurement quantity over one or more RPs of at least one of the one or more antenna arrays, a full antenna array, or a segment of an antenna array and a variation measurement of the second differential measurement quantity; and transmit a second report indicating the second differential measurement quantity and the variation measurement.

Additionally, or alternatively, the NE 1700 may be configured to support determining a quantity of differential measurements, a quantity of RPs for which the differential measurements are to be reported, and a quantity of RP pairs for which the differential measurements are to be reported over a channel segment. Additionally, or alternatively, the NE 1700 may be configured to support a differential measurement quantity type including one or more of time-based measurements, doppler-based measurements, phase-based measurements, angle-based measurements, energy-based measurements, power-based measurements, micro-doppler measurements, vibration-rate measurements, or information associated with sensing results of a sensing target. Additionally, or alternatively, the NE 1700 may be configured to support a channel segment including one or more of: a direct propagation path or a direct ray between the first device and the second device; an indirect propagation path or an indirect ray between the first device and the second device that is associated with a scattering point of a scattering object; or multiple propagation paths or multiple rays between the first device and the second device that are associated with at least one of the scattering object or a property of a propagation path or a ray.

Additionally, or alternatively, the NE 1700 may be configured to support receiving signaling including configuration information, and where reception of the sensing signal and determination of the differential measurement quantity are based on the configuration information. Additionally, or alternatively, the NE 1700 may be configured to support the configuration information including one or more of: a set of parameters associated the sensing signal to be used for determining the differential measurement quantity; a type of differential measurement quantity to be reported; information associated with a channel segment for which the differential measurement quantity is to be reported; RPs of the one or more antenna arrays for which the differential measurement quantity is to be determined; a configuration for transmission of the report; or a trigger for the transmission of the report. Additionally, or alternatively, the NE 1700 may be configured to support the configuration information indicating a boundary of an RP as a segment of the one or more antenna arrays. Additionally, or alternatively, the NE 1700 may be configured to support the sensing signal including one or more of a reference signal, a data channel, or a control channel associated with one or more of a downlink direction, an uplink direction, a sidelink direction, or a gNB-to-gNB transmission direction. Additionally, or alternatively, the NE 1700 may be configured to support the first RP being the same as the second RP or is different from the second RP.

Additionally, or alternatively, the NE 1700 may support at least one memory (e.g., the memory 1504) and at least one processor (e.g., the processor 1502) coupled with the at least one memory and configured to cause the NE 1700 to receive, from a second device, a sensing signal; determine a differential measurement quantity based on the sensing signal, where the differential measurement quantity indicates a difference between a first measurement of a first channel segment associated with the first device at a first RP and a second measurement of a second channel segment associated with the first device at a second RP, and where the first RP and the second RP are associated with one or more antenna arrays of the first device; and transmit, to the second device, a report including the differential measurement quantity.

Additionally, the NE 1700 may be configured to support any one or combination of the differential measurement quantity including one of more dependencies in accordance with a difference between a first differential measurement quantity type and a second differential measurement quantity type based on one or more of: a first sensing transmitter node and a second sensing transmitter node that transmit the sensing signal for which the first differential measurement quantity type and the second differential measurement quantity type are determined; a first sensing receiver node and a second sensing receiver node that receive the sensing signal for which the first differential measurement quantity type and the second differential measurement quantity type are determined; a first transmission RP corresponding to the first sensing transmitter node and a second transmission RP corresponding to the second sensing transmitter node for which the first differential measurement quantity type and the second differential measurement quantity type are determined; a first reception RP corresponding to the first sensing receiver node and a second reception RP corresponding to the second sensing receiver node for which the first differential measurement quantity type and the second differential measurement quantity type are determined; the first channel segment and the second channel segment for which the first differential measurement quantity type and the second differential measurement quantity type are determined; a first signal transmitted by the first sensing transmitter node and received by the first sensing receiver node and a second signal transmitted by the second sensing transmitter node and received by the second sensing receiver node for which the first differential measurement quantity type and the second differential measurement quantity type are determined; a first time period and a second time period based on which the first differential measurement quantity type and the second differential measurement quantity type are determined; or a third time period and a fourth time people for which the first differential measurement quantity type and the second differential measurement quantity type are valid.

Additionally, or alternatively, the NE 1700 may be configured to support the differential measurement quantity including one or more of a time difference of arrival, an angle difference of arrival, or a doppler shift difference of arrival between the first channel segment received via the first RP and the second channel segment received via the second RP. Additionally, or alternatively, the NE 1700 may be configured to support the differential measurement quantity including one or more of a time difference or a frequency difference between reception of the first channel segment via the first RP and transmission of the second channel segment via the second RP. Additionally, or alternatively, the NE 1700 may be configured to support determining a second differential measurement quantity over one or more RPs of at least one of the one or more antenna arrays, a full antenna array, or a segment of an antenna array and a variation measurement of the second differential measurement quantity; and transmit a second report indicating the second differential measurement quantity and the variation measurement.

Additionally, or alternatively, the NE 1700 may be configured to support determining a quantity of differential measurements, a quantity of RPs for which the differential measurements are to be reported, and a quantity of RP pairs for which the differential measurements are to be reported over a channel segment. Additionally, or alternatively, the NE 1700 may be configured to support a differential measurement quantity type including one or more of time-based measurements, doppler-based measurements, phase-based measurements, angle-based measurements, energy-based measurements, power-based measurements, micro-doppler measurements, vibration-rate measurements, or information associated with sensing results of a sensing target. Additionally, or alternatively, the NE 1700 may be configured to support a channel segment including one or more of: a direct propagation path or a direct ray between the first device and the second device; an indirect propagation path or an indirect ray between the first device and the second device that is associated with a scattering point of a scattering object; or multiple propagation paths or multiple rays between the first device and the second device that are associated with at least one of the scattering object or a property of a propagation path or a ray.

Additionally, or alternatively, the NE 1700 may be configured to support receiving signaling including configuration information, and where reception of the sensing signal and determination of the differential measurement quantity are based on the configuration information. Additionally, or alternatively, the NE 1700 may be configured to support the configuration information including one or more of: a set of parameters associated the sensing signal to be used for determining the differential measurement quantity; a type of differential measurement quantity to be reported; information associated with a channel segment for which the differential measurement quantity is to be reported; RPs of the one or more antenna arrays for which the differential measurement quantity is to be determined; a configuration for transmission of the report; or a trigger for the transmission of the report. Additionally, or alternatively, the NE 1700 may be configured to support the configuration information indicating a boundary of an RP as a segment of the one or more antenna arrays. Additionally, or alternatively, the NE 1700 may be configured to support the sensing signal including one or more of a reference signal, a data channel, or a control channel associated with one or more of a downlink direction, an uplink direction, a sidelink direction, or a gNB-to-gNB transmission direction. Additionally, or alternatively, the NE 1700 may be configured to support the first RP being the same as the second RP or is different from the second RP.

The controller 1706 may manage input and output signals for the NE 1700. The controller 1706 may also manage peripherals not integrated into the NE 1700. In some implementations, the controller 1706 may utilize an operating system such as iOS®, ANDROID®, WINDOWS®, or other operating systems. In some implementations, the controller 1706 may be implemented as part of the processor 1702.

In some implementations, the NE 1700 may include at least one transceiver 1708. In some other implementations, the NE 1700 may have more than one transceiver 1708. The transceiver 1708 may represent a wireless transceiver. The transceiver 1708 may include one or more receiver chains 1710, one or more transmitter chains 1712, or a combination thereof.

A receiver chain 1710 may be configured to receive signals (e.g., control information, data, packets) over a wireless medium. For example, the receiver chain 1710 may include one or more antennas to receive a signal over the air or wireless medium. The receiver chain 1710 may include at least one amplifier (e.g., a low-noise amplifier (LNA)) configured to amplify the received signal. The receiver chain 1710 may include at least one demodulator configured to demodulate the receive signal and obtain the transmitted data by reversing the modulation technique applied during transmission of the signal. The receiver chain 1710 may include at least one decoder for decoding the demodulated signal to receive the transmitted data.

A transmitter chain 1712 may be configured to generate and transmit signals (e.g., control information, data, packets). The transmitter chain 1712 may include at least one modulator for modulating data onto a carrier signal, preparing the signal for transmission over a wireless medium. The at least one modulator may be configured to support one or more techniques such as amplitude modulation (AM), frequency modulation (FM), or digital modulation schemes like phase-shift keying (PSK) or quadrature amplitude modulation (QAM). The transmitter chain 1712 may also include at least one power amplifier configured to amplify the modulated signal to an appropriate power level suitable for transmission over the wireless medium. The transmitter chain 1712 may also include one or more antennas for transmitting the amplified signal into the air or wireless medium.

Figure 18:
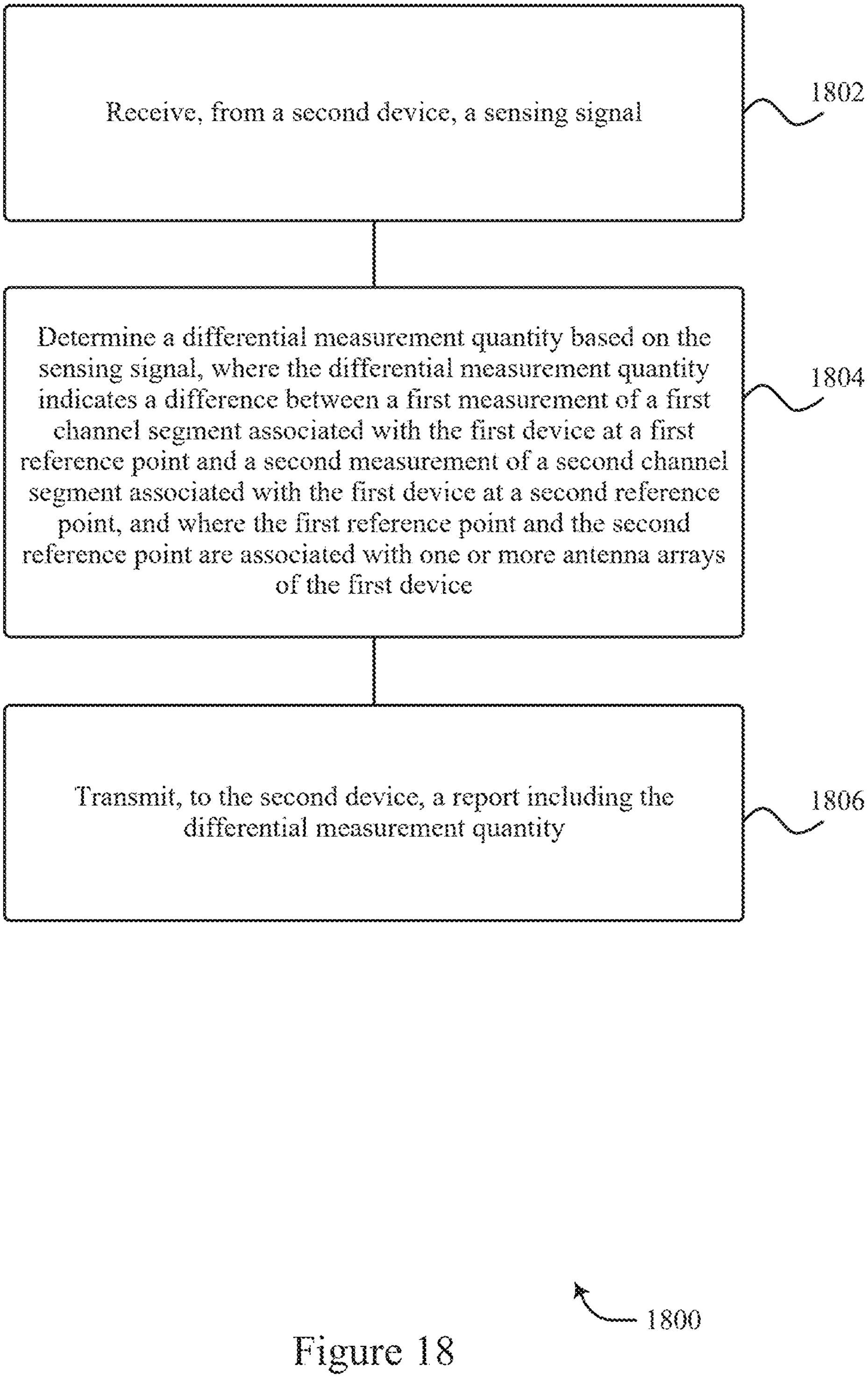
FIG. 18 illustrates a flowchart of a method performed by a device in accordance with aspects of the present disclosure.

FIG. 18 illustrates a flowchart of a method 1800 in accordance with aspects of the present disclosure. The operations of the method may be implemented by a device (e.g., a UE, an NE) as described herein. In some implementations, the device may execute a set of instructions to control the function elements of the device to perform the described functions. It should be noted that the method described herein describes a possible implementation, and that the operations and the steps may be rearranged or otherwise modified and that other implementations are possible.

At 1802, the method may include receiving, from a second device, a sensing signal. The operations of 1802 may be performed in accordance with examples as described herein. In some implementations, aspects of the operations of 1802 may be performed by a device such as a UE or an NE as described with reference to FIGS. 15 and 17.

At 1804, the method may include determining a differential measurement quantity based on the sensing signal, where the differential measurement quantity indicates a difference between a first measurement of a first channel segment associated with the first device at a first RP and a second measurement of a second channel segment associated with the first device at a second RP, and where the first RP and the second RP are associated with one or more antenna arrays of the first device. The operations of 1804 may be performed in accordance with examples as described herein. In some implementations, aspects of the operations of 1804 may be performed by a device such as a UE or an NE as described with reference to FIGS. 15 and 17.

At 1806, the method may include transmitting, to the second device, a report including the differential measurement quantity. The operations of 1806 may be performed in accordance with examples as described herein. In some implementations, aspects of the operations of 1806 may be performed a device such as a UE or an NE as described with reference to FIGS. 15 and 17.

The description herein is provided to enable a person having ordinary skill in the art to make or use the disclosure. Various modifications to the disclosure will be apparent to a person having ordinary skill in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A first device for wireless communication, comprising:
at least one memory; and
at least one processor coupled with the at least one memory and operable to cause the first device to:
receive, from a second device, a sensing signal;
determine a differential measurement quantity based on the sensing signal, wherein the differential measurement quantity indicates a difference between a first measurement of a first channel segment associated with the first device at a first reference point and a second measurement of a second channel segment associated with the first device at a second reference point, and wherein the first reference point and the second reference point are associated with one or more antenna arrays of the first device; and
transmit, to the second device, a report including the differential measurement quantity.

2. The first device of claim 1, wherein the differential measurement quantity comprises one of more dependencies in accordance with a difference between a first differential measurement quantity type and a second differential measurement quantity type based on one or more of:
a first sensing transmitter node and a second sensing transmitter node that transmit the sensing signal for which the first differential measurement quantity type and the second differential measurement quantity type are determined;
a first sensing receiver node and a second sensing receiver node that receive the sensing signal for which the first differential measurement quantity type and the second differential measurement quantity type are determined;
a first transmission reference point corresponding to the first sensing transmitter node and a second transmission reference point corresponding to the second sensing transmitter node for which the first differential measurement quantity type and the second differential measurement quantity type are determined;
a first reception reference point corresponding to the first sensing receiver node and a second reception reference point corresponding to the second sensing receiver node for which the first differential measurement quantity type and the second differential measurement quantity type are determined;

the first channel segment and the second channel segment for which the first differential measurement quantity type and the second differential measurement quantity type are determined;

a first signal transmitted by the first sensing transmitter node and received by the first sensing receiver node and a second signal transmitted by the second sensing transmitter node and received by the second sensing receiver node for which the first differential measurement quantity type and the second differential measurement quantity type are determined;

a first time period and a second time period based on which the first differential measurement quantity type and the second differential measurement quantity type are determined; or a third time period and a fourth time people for which the first differential measurement quantity type and the second differential measurement quantity type are valid.

3. The first device of claim 1, wherein the differential measurement quantity comprises one or more of a time difference of arrival, an angle difference of arrival, or a doppler shift difference of arrival between the first channel segment received via the first reference point and the second channel segment received via the second reference point.

4. The first device of claim 1, wherein the differential measurement quantity comprises one or more of a time difference or a frequency difference between reception of the first channel segment via the first reference point and transmission of the second channel segment via the second reference point.

5. The first device of claim 1, wherein the at least one processor is further operable to cause the first device to:

determine a second differential measurement quantity over one or more reference points of at least one of the one or more antenna arrays, a full antenna array, or a segment of an antenna array and a variation measurement of the second differential measurement quantity; and transmit a second report indicating the second differential measurement quantity and the variation measurement.

6. The first device of claim 1, wherein the at least one processor is further operable to cause the first device to determine a quantity of differential measurements, a quantity of reference points for which the differential measurements are to be reported, and a quantity of reference point pairs for which the differential measurements are to be reported over a channel segment.

7. The first device of claim 1, wherein a differential measurement quantity type comprises one or more of time-based measurements, doppler-based measurements, phase-based measurements, angle-based measurements, energy-based measurements, power-based measurements, micro-doppler measurements, vibration-rate measurements, or information associated with sensing results of a sensing target.

8. The first device of claim 1, wherein a channel segment comprises one or more of:

a direct propagation path or a direct ray between the first device and the second device;

an indirect propagation path or an indirect ray between the first device and the second device that is associated with a scattering point of a scattering object; or multiple propagation paths or multiple rays between the first device and the second device that are associated with at least one of the scattering object or a property of a propagation path or a ray.

9. The first device of claim 8, wherein the property comprises one or more of a delay, an angle, or a doppler value within a numerical range.

10. The first device of claim 1, wherein the at least one processor is further operable to cause the first device to receive signaling comprising configuration information, and wherein reception of the sensing signal and determination of the differential measurement quantity are based on the configuration information.

11. The first device of claim 10, wherein the configuration information comprises one or more of:

a set of parameters associated the sensing signal to be used for determining the differential measurement quantity;

a type of differential measurement quantity to be reported;

information associated with a channel segment for which the differential measurement quantity is to be reported;

reference points of the one or more antenna arrays for which the differential measurement quantity is to be determined;

a configuration for transmission of the report; or a trigger for the transmission of the report.

12. The first device of claim 10, wherein the configuration information indicates a boundary of a reference point as a segment of the one or more antenna arrays.

13. The first device of claim 1, wherein the sensing signal comprises one or more of a reference signal, a data channel, or a control channel associated with one or more of a downlink direction, an uplink direction, a sidelink direction, or a gNodeB (gNB)-to-gNB transmission direction.

14. The first device of claim 1, wherein the first reference point is the same as the second reference point or is different from the second reference point.

15. A processor for wireless communication, comprising:

at least one controller coupled with at least one memory and operable to cause the processor to:

receive, from a second device, a sensing signal;

determine a differential measurement quantity based on the sensing signal, wherein the differential measurement quantity indicates a difference between a first measurement of a first channel segment associated with the first device at a first reference point and a second measurement of a second channel segment associated with the first device at a second reference point, and wherein the first reference point and the second reference point are associated with one or more antenna arrays of the first device; and transmit, to the second device, a report including the differential measurement quantity.

16. The processor of claim 15, wherein the differential measurement quantity comprises one of more dependencies in accordance with a difference between a first differential measurement quantity type and a second differential measurement quantity type based on one or more of:

a first sensing transmitter node and a second sensing transmitter node that transmit the sensing signal for which the first differential measurement quantity type and the second differential measurement quantity type are determined;

a first sensing receiver node and a second sensing receiver node that receive the sensing signal for which the first differential measurement quantity type and the second differential measurement quantity type are determined;

a first transmission reference point corresponding to the first sensing transmitter node and a second transmission reference point corresponding to the second sensing transmitter node for which the first differential measurement quantity type and the second differential measurement quantity type are determined;

a first reception reference point corresponding to the first sensing receiver node and a second reception reference point corresponding to the second sensing receiver node for which the first differential measurement quantity type and the second differential measurement quantity type are determined;

the first channel segment and the second channel segment for which the first differential measurement quantity type and the second differential measurement quantity type are determined;

a first signal transmitted by the first sensing transmitter node and received by the first sensing receiver node and a second signal transmitted by the second sensing transmitter node and received by the second sensing receiver node for which the first differential measurement quantity type and the second differential measurement quantity type are determined;

a first time period and a second time period based on which the first differential measurement quantity type and the second differential measurement quantity type are determined; or a third time period and a fourth time people for which the first differential measurement quantity type and the second differential measurement quantity type are valid.

17. The processor of claim 15, wherein the differential measurement quantity comprises one or more of a time difference of arrival, an angle difference of arrival, or a doppler shift difference of arrival between the first channel segment received via the first reference point and the second channel segment received via the second reference point.

18. The processor of claim 15, wherein the differential measurement quantity comprises one or more of a time difference or a frequency difference between reception of the first channel segment via the first reference point and transmission of the second channel segment via the second reference point.

19. The processor of claim 15, wherein the at least one controller is further operable to cause the processor to:

determine a second differential measurement quantity over one or more reference points of at least one of the one or more antenna arrays, a full antenna array, or a segment of an antenna array and a variation measurement of the second differential measurement quantity; and transmit a second report indicating the second differential measurement quantity and the variation measurement.

20. A method performed by a first device, the method comprising:

receiving, from a second device, a sensing signal;

determining a differential measurement quantity based on the sensing signal, wherein the differential measurement quantity indicates a difference between a first measurement of a first channel segment associated with the first device at a first reference point and a second measurement of a second channel segment associated with the first device at a second reference point, and wherein the first reference point and the second reference point are associated with one or more antenna arrays of the first device; and transmitting, to the second device, a report including the differential measurement quantity.

* * * * *